US008533518B2

(12) United States Patent
Webb, III et al.

(10) Patent No.: US 8,533,518 B2
(45) Date of Patent: Sep. 10, 2013

(54) SYSTEMS AND METHODS FOR PRECISE TIMING MEASUREMENTS USING HIGH-SPEED DESERIALIZERS

(75) Inventors: Charles A. Webb, III, Austin, TX (US); Christopher C. Ott, Austin, TX (US)

(73) Assignee: Anue Systems, Inc., Austin, TX (US)

( * ) Notice: Subject to any disclaimer, the term of this patent is extended or adjusted under 35 U.S.C. 154(b) by 490 days.

(21) Appl. No.: 12/930,495

(22) Filed: Jan. 7, 2011

(65) Prior Publication Data
US 2012/0179422 A1    Jul. 12, 2012

(51) Int. Cl.
*G06F 1/00*    (2006.01)
(52) U.S. Cl.
USPC ........................................ 713/500
(58) Field of Classification Search
USPC ........................................ 713/500
See application file for complete search history.

(56) References Cited

U.S. PATENT DOCUMENTS

| | | | | |
|---|---|---|---|---|
| 4,777,616 | A | 10/1988 | Moore et al. | 364/900 |
| 4,912,734 | A | 3/1990 | Frauenglass | 377/20 |
| 4,979,177 | A | 12/1990 | Jackson | 377/20 |
| 5,031,128 | A | 7/1991 | Boutigny et al. | 364/715.11 |
| 5,123,034 | A | 6/1992 | Grujon | 377/19 |
| 5,526,286 | A | 6/1996 | Sauerwein et al. | 364/550 |
| 5,948,115 | A | 9/1999 | Dinteman | 714/738 |
| 6,285,197 | B2 | 9/2001 | Walker | 324/603 |
| 6,357,007 | B1 * | 3/2002 | Cromer et al. | 713/194 |
| 6,456,959 | B1 | 9/2002 | Kattan | 702/176 |
| 6,647,210 | B1 | 11/2003 | Toyoda et al. | 398/102 |
| 6,998,893 | B2 | 2/2006 | Takahashi et al. | 327/170 |
| 6,999,382 | B2 | 2/2006 | Horne | 368/113 |
| 7,026,842 | B1 | 4/2006 | Lou | 327/20 |
| 7,095,264 | B2 | 8/2006 | Jenkins et al. | 327/276 |
| 7,171,601 | B2 | 1/2007 | Frisch | 714/738 |
| 7,230,981 | B2 | 6/2007 | Hill | 375/226 |
| 7,287,200 | B2 | 10/2007 | Miyaji | 714/700 |

(Continued)

FOREIGN PATENT DOCUMENTS

WO    WO98/10535  A1    3/1998

OTHER PUBLICATIONS

J. Kalisz, "*Review of Methods for Time Interval Measurements with Picosecond Resolution,*" PII:S0026-1394(04)70012-2, Institute of Physics Publishing, Metrologia 41 (2004) pp. 17-32.
S. Tabatabaei, "*Jitter Generation and Measurement for Test of Multi-GBPS Serial IO,*" Guide Technology, pp. 1-9 (2004).
A. Rosti, "*1-Bit A/D and D/A Converters,*" http://cs.tut.fi/sgn/arg/rosti, Jun. 22, 2004.
U.S. Appl. No. 12/930,491 entitled, "*Systems and Methods for Precise Event Timing Measurements,*" filed Jan. 7, 2011.
U.S. Appl. No. 12/930,490 entitled, "*Systems and Methods for Precise Generation of Phase Vibration in Digital Signals,*" filed Jan. 7, 2011.

(Continued)

*Primary Examiner* — Paul Yanchus, III
*Assistant Examiner* — Alyaa T Mazyad
(74) *Attorney, Agent, or Firm* — Egan, Peterman & Enders LLP.

(57) ABSTRACT

Systems and methods are disclosed for precise event time measurement using high-speed deserializer circuitry. The described embodiments utilize high speed deserializer circuitry to achieve a precision based upon a bit period associated with the operation of the high speed operation of the deserializer circuitry rather than upon slower speed clock periods associated with reference clock signals. In certain embodiments, the disclosed systems and methods receive an event occurrence signal and use deserializer circuitry to sample the event occurrence signal and to produce multi-bit parallel data representing the event occurrence signal. Precise timestamps can then be generated based upon the multi-bit parallel data. Advantageously, the precision of these time measurements is associated with the bit period of the high speed operation of the deserializer circuitry and are not limited to lower speeds at which other circuitry within the system may be operating, for example, based upon a slower reference clock signal.

31 Claims, 19 Drawing Sheets

(56) References Cited

U.S. PATENT DOCUMENTS

| | | | |
|---|---|---|---|
| 7,315,593 B2 | 1/2008 | Hagen et al. | 375/355 |
| 7,339,853 B2 | 3/2008 | Srikantam | 368/113 |
| 7,352,167 B2 | 4/2008 | Sullivan et al. | 324/121 |
| 7,439,785 B2 | 10/2008 | Moshe et al. | 327/164 |
| 7,492,849 B2 | 2/2009 | On et al. | 375/376 |
| 7,574,632 B2 | 8/2009 | Sartschev et al. | 714/700 |
| 7,583,460 B2 | 9/2009 | Takahashi | 360/51 |
| 7,624,293 B2 | 11/2009 | Osorio et al. | 713/400 |
| 7,627,790 B2 | 12/2009 | Frisch et al. | 714/700 |
| 2007/0121711 A1 | 5/2007 | Offord et al. | 375/219 |
| 2007/0130246 A1 | 6/2007 | Lau et al. | 709/200 |
| 2008/0037594 A1 | 2/2008 | Hornbuckle et al. | 370/537 |
| 2009/0086801 A1 | 4/2009 | Liu et al. | 375/225 |
| 2009/0290624 A1 | 11/2009 | Thurston et al. | 375/221 |
| 2010/0169699 A1 | 7/2010 | Fujimoto | 713/503 |
| 2011/0001116 A1 | 1/2011 | Greene et al. | 257/4 |
| 2012/0166138 A1* | 6/2012 | Shirotori et al. | 702/178 |

OTHER PUBLICATIONS

U.S. Appl. No. 12/930,461 entitled, "*Systems and Methods for Playback of Detected Timing Events*," filed Jan. 7, 2011.

International Patent Application No. PCT/US2011/065203, "*International Search Report and Written Opinion*," International Filing Date Dec. 15, 2011, 13 pgs.

International Patent Application No. PCT/US2011/065214, "*International Search Report and Written Opinion*," International Filing Date Dec. 15, 2011, 8 pgs.

Bienfang et al., "*Quantum Key Distribution with 1.25 Gbps Clock Synchronization*," Quantum Electronics Conference, May 21, 2004, (IQEC), 6 pgs.

* cited by examiner

| TIME COUNTER 302 | RX DATA 304 | PRED DATA 306 | XOR DATA 308 | EVENT PULSE 310 | PRECISE TIMESTAMP 312 | IDEAL TIMESTAMP 314 | TIME ERROR 316 |
|---|---|---|---|---|---|---|---|
| 0x0 | 0x0123 | 0x0123 | 0x0000 | 0 | – | – | – |
| 0x1 | 0x4567 | 0x4567 | 0x0000 | 0 | – | – | – |
| 0x2 | 0x89AB | 0x89AB | 0x0000 | 0 | – | – | – |
| 0x3 | 0xCE10 | 0xCDEF | 0x03FF | 1 | 0x36 | 0x36 | 0 |
| 0x4 | 0xFEDC | 0x0123 | 0xFFFF | 0 | – | – | – |
| 0x5 | 0xBA98 | 0x4567 | 0xFFFF | 0 | – | – | – |
| 0x6 | 0x7654 | 0x89AB | 0xFFFF | 0 | – | – | – |
| 0x7 | 0x3210 | 0xCDEF | 0xFFFF | 0 | – | – | – |
| 0x8 | 0xFEC3 | 0x0123 | 0xFFE0 | 1 | 0x8B | 0x86 | -5 |
| 0x9 | 0x4567 | 0x4567 | 0x0000 | 0 | – | – | – |
| 0xA | 0x89AB | 0x89AB | 0x0000 | 0 | – | – | – |

FIG. 3

SYSTEMS AND METHODS FOR PRECISE TIMING MEASUREMENTS USING HIGH-SPEED DESERIALIZERS

RELATED APPLICATIONS

This application is related in subject matter to the following concurrently filed applications: U.S. patent application Ser. No. 12/930,491, entitled "SYSTEMS AND METHODS FOR PRECISE EVENT TIMING MEASUREMENTS;" U.S. patent application Ser. No. 12/930,490, entitled "SYSTEMS AND METHODS FOR PRECISE GENERATION OF PHASE VARIATION IN DIGITAL SIGNALS;" and U.S. patent application Ser. No. 12/930,461, entitled "SYSTEMS AND METHODS FOR PLAYBACK OF DETECTED TIMING EVENTS;" each of which is hereby incorporated by reference in its entirety.

TECHNICAL FIELD OF THE INVENTION

This invention relates to detection of events and, more particularly, to systems and methods for precise time measurements associated with detected events.

BACKGROUND

There is often a need with electronic systems to determine the occurrence of events associated with the operation of those electronic systems. Further, electronic systems are also used to monitor and detect events that are occurring on other equipment or within the environment within which the electronic system is placed. As such, there is often a need to determine timing information associated with the occurrence of these monitored and detected events. The resolution or precision with which this timing information can be provided depends upon the timing detection and measurement systems utilized to determine when the event has occurred.

Current techniques for detecting the occurrence of an event and timing associated with the occurrence of an event typically fall into one of three different categories. The first category uses timestamps based on conventional counters, which are limited by the frequency at which the counter can operate, typically on the order of several nanoseconds. The second category, used in time interval counters, utilizes circuits that rely upon analog techniques to determine time intervals, such as charging a capacitor with a constant current source and measuring the resulting voltage. These analog techniques, however, can only measure relatively short time intervals (microseconds) and require calibration to remain accurate (e.g., annual calibration traceable to an official timing source such as from the National Institute of Standards and Technology (NIST)). The third category uses the propagation delay of circuit elements, such as gates or wires, to subdivide a measurement interval in to sub-intervals. These propagation delay techniques also require calibration because the switching speed of the circuitry changes as a function of process, temperature and voltage. These propagation delay techniques also become cumbersome as the number of sub-intervals grow.

While these prior systems and techniques provide the ability to detect and determine time information associated with the occurrence of events, it is desirable to be able to achieve greater resolution in determining timing information associated with detected events.

SUMMARY OF THE INVENTION

Systems and methods are disclosed for precise event time measurement using high-speed deserializer circuitry. The described embodiments utilize high speed deserializer circuitry to achieve a precision based upon a bit period associated with the operation of the high speed operation of the deserializer circuitry rather than upon slower speed clock periods associated with reference clock signals. In certain embodiments, the disclosed systems and methods receive an event occurrence signal and use deserializer circuitry to sample the event occurrence signal and to produce multi-bit parallel data representing the event occurrence signal. Precise timestamps can then be generated based upon the multi-bit parallel data. Advantageously, the precision of these time measurements is associated with the bit period of the high speed operation of the deserializer circuitry and are not limited to lower speeds at which other circuitry within the system may be operating, for example, based upon a slower reference clock signal. Other features and variations can be implemented, if desired, and related systems and methods can be utilized, as well.

In one embodiment, a system for event timing measurement is provide that includes an event occurrence input signal, reference clock generator circuitry having a reference clock signal as an output, deserializer circuitry coupled to the reference clock signal and having the event occurrence signal as an input, the deserializer circuitry being configured to output multi-bit parallel data representative of the event occurrence signal at an output rate based upon a rate of the reference clock signal, the deserializer circuitry being further configured to sample the event occurrence signal at a rate faster than the output rate of the multi-bit parallel data, and event timing detector circuitry coupled to receive the multi-bit parallel data and configured to determine when an event occurred within the multi-bit parallel data and to output event timing data representative of when the event occurred within the multi-bit parallel data. In a further embodiment, the deserializer circuitry is configured to sample the event occurrence signal at a rate equal to the rate of the reference clock signal times a number of bits used for the multi-bit parallel data. Still further, the event timing data can include one or more timestamps. The event timing data can also include one or more time error values. In addition, the event occurrence signal can be a digital clock signal. The event occurrence signal can also be an analog signal. The event occurrence signal can also be associated with at least one of an arrival of network packets and a departure of network packets.

In a further embodiment, the deserializer circuitry and the event detector circuitry provide a first measurement path, and the system further includes one or more additional measurement paths coupled to receive the event occurrence signal where each additional measurement path also includes deserializer circuitry and event timing detector circuitry. In another embodiment, the one or more additional measurement paths are configured to provide one or more time measurements that are offset in time from the a time measurement provided by the first measurement path, and the time measurement and the one or more offset time measurements are utilized to provide event timing data having a finer resolution than the sample rate of the deserializer circuitry. In a further embodiment, the deserializer circuitry and the event detector circuitry provide a first measurement path, and the system further includes one or more additional measurement paths where each additional measurement path also includes deserializer circuitry and event timing detector circuitry and where each additional measurement path is configured to receive a different event occurrence signal.

In still a further embodiment, the event timing detector circuitry can include timestamp circuitry configured to provide an event timestamp. Still further, the event timestamp can include a counter portion and a bit period portion where the counter portion is based upon a time counter and the bit period portion is based upon the multi-bit parallel data. In another embodiment, the time error circuitry is configured to output time error data representing a difference between an event timestamp and an expected event timestamp.

In one other embodiment, a method for event timing measurement is provided that includes receiving an event occurrence input signal, generating a reference clock signal, using deserializer circuitry coupled to the reference clock signal to output multi-bit parallel data representative of the event occurrence signal at an output rate based upon a rate of the reference clock signal where the deserializer circuitry samples the event occurrence signal at a rate faster than the output rate of the multi-bit parallel data, determining when an event occurred within the multi-bit parallel data, and generating event timing data representative of when the event occurred within the multi-bit parallel data. In a further embodiment, the method includes detecting one or more events and generating the event occurrence signal to represent the detected events. In another embodiment, the using step includes using the deserializer circuitry to sample the event occurrence signal at a rate equal to the rate of the reference clock signal times a number of bits used for the multi-bit parallel data.

In another embodiment, the method includes duplicating the using and generating steps to provide one or more additional time measurements associated with the event occurrence signal. Still further, the method can also include using the one or more additional time measurements to provide two or more offset time measurements that are offset in time from each other. In addition, the method can include using the offset time measurements to generate event timing data having a finer resolution than a resolution from a single time measurement. In a further embodiment, the method can include duplicating the using and generating steps to provide one or more additional time measurements associated with one or more different event occurrence signals.

In a further embodiment, the generating step includes generating an event timestamp. Still further, the event timestamp can include a counter portion and a bit period portion where the counter portion is based upon a time counter and where the bit period portion is based upon the multi-bit parallel data. In a further embodiment, the generating step can include generating time error data representing a difference between an event timestamp and an expected event timestamp.

Other features and variations can be implemented, if desired, and related systems and methods can be utilized, as well.

DESCRIPTION OF THE DRAWINGS

It is noted that the appended drawings illustrate only exemplary embodiments of the invention and are, therefore, not to be considered limiting of its scope, for the invention may admit to other equally effective embodiments.

FIG. 3 is a diagram of an embodiment for generation of timestamps and error values associated with events.

DETAILED DESCRIPTION OF THE INVENTION

Figure 1A:
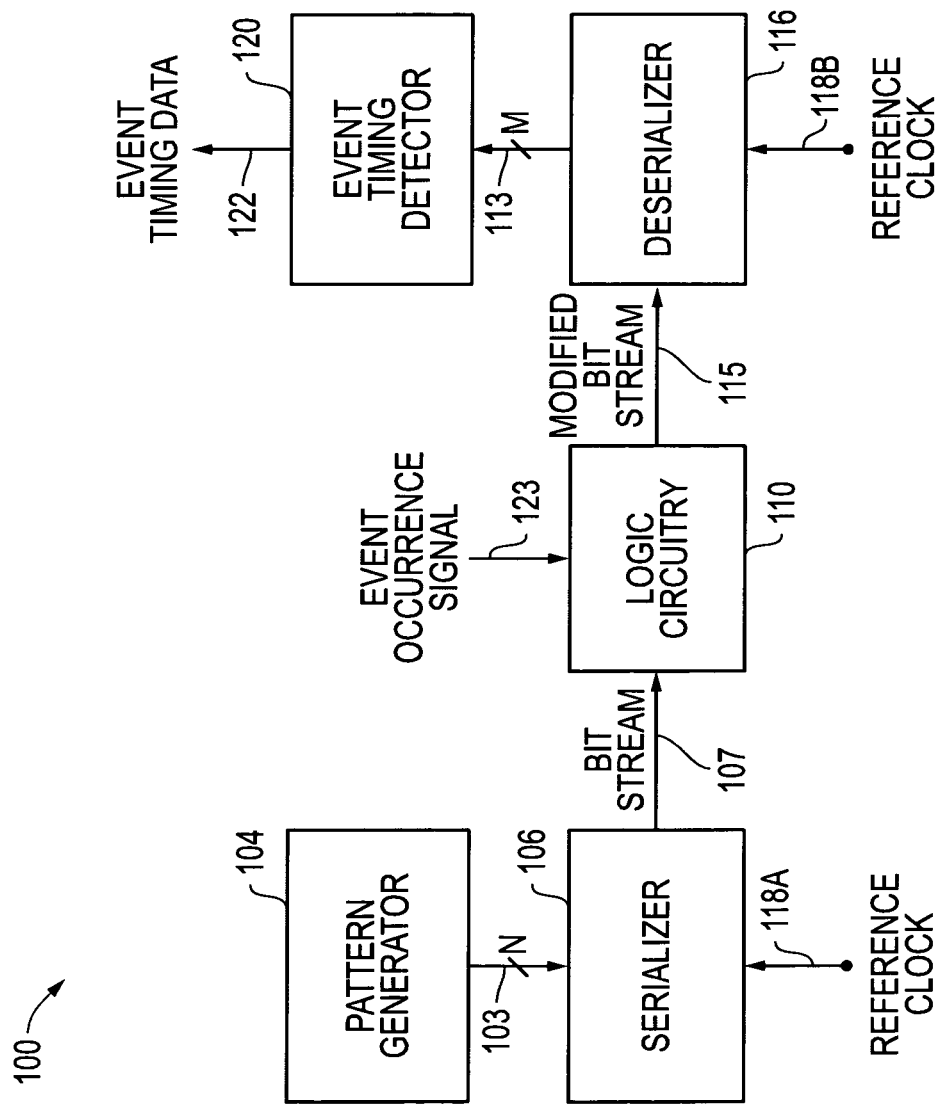
FIG. 1A is a block diagram of an embodiment for a precise event detection system.

Systems and methods are disclosed for precisely and accurately measuring time information associated with occurrence of detected events. The described embodiments combine high speed serializer and deserializer circuitry with high speed logic elements, such as exclusive-OR (XOR) or exclusive-not-OR (XNOR) logic circuitry, to achieve precision based upon the bit period of the high speed digital signals processed by these circuit devices and elements. Further embodiments utilize high speed deserializers to receive event occurrence signals and to provide a precision based upon the input bit periods of the deserializer circuitry. Other features and variations can be implemented, if desired, and related systems and methods can be utilized, as well.

Systems and methods are also disclosed for precise generation of phase variation in digital signals. The disclosed signal generation embodiments generate a pattern of information bits that represents a digital signal with desired phase variations and transmit this digital pattern at high speed utilizing a serializer to generate a high speed bit stream. The high speed bit stream can be used to generate one or more digital signals, such as clock signals, having desired rates and desired phase variations. In certain embodiments, the desired phase variation can be introduced into the resulting digital signal by removing and/or inserting bits in a digital pattern thereby moving logic transitions (e.g., rising edge transitions, falling edge transitions) as desired within the resulting digital signal. In addition to clock signals, the resulting digital signals generated can be control signals, data signals and/or any other desired digital signal. Further embodiments provide for playback of detected events including phase variations associated with those detected events. Other features and variations can be implemented, if desired, and related systems and methods can be utilized, as well.

Precise timing measurement techniques for detecting event timing data associated with detect events are described below in more detail with respect to FIGS. 1A-C, 2A-B, 3-4, 5A-C and 6A-C. Precise signal generation techniques for generating signals with desired phase variations are described in more detail below with respect to FIGS. 7A-B and 8-15.

It is noted that the operational blocks depicted herein can be implemented using hardware, software or a combination of hardware and software, as desired. In addition, integrated circuits, discrete circuits or a combination of discrete and integrated circuits can be used, as desired, that are configured to perform the functionality described. Further, programmable integrated circuitry can also be used, such as FPGAs (field programmable gate arrays), ASICs (application specific integrated circuits) and/or other programmable integrated circuitry. In addition, one or more processors running software or firmware could also be used, if desired. For example, computer readable instructions embodied in a tangible medium (e.g., memory storage devices, FLASH memory, random access memory, read only memory, programmable memory devices, reprogrammable storage devices, hard drives, floppy disks, DVDs, CD-ROMs, and/or any other tangible storage medium) could be utilized including instructions that cause computer systems, programmable circuitry (e.g., FPGAs) and/or processors to perform the processes, functions and capabilities described herein. It is further understood, therefore, that one or more of the tasks, functions, or methodologies described herein may be implemented, for example, as software or firmware and/or other instructions embodied in one or more non-transitory tangible computer readable mediums that are executed by a CPU, controller, microcontroller, processor, microprocessor, or other suitable processing circuitry.

The precise timing measurement embodiments are now described with respect to FIGS. 1A-C, 2A-B, 3-4, 5A-C and 6A-C.

Figure 1B:
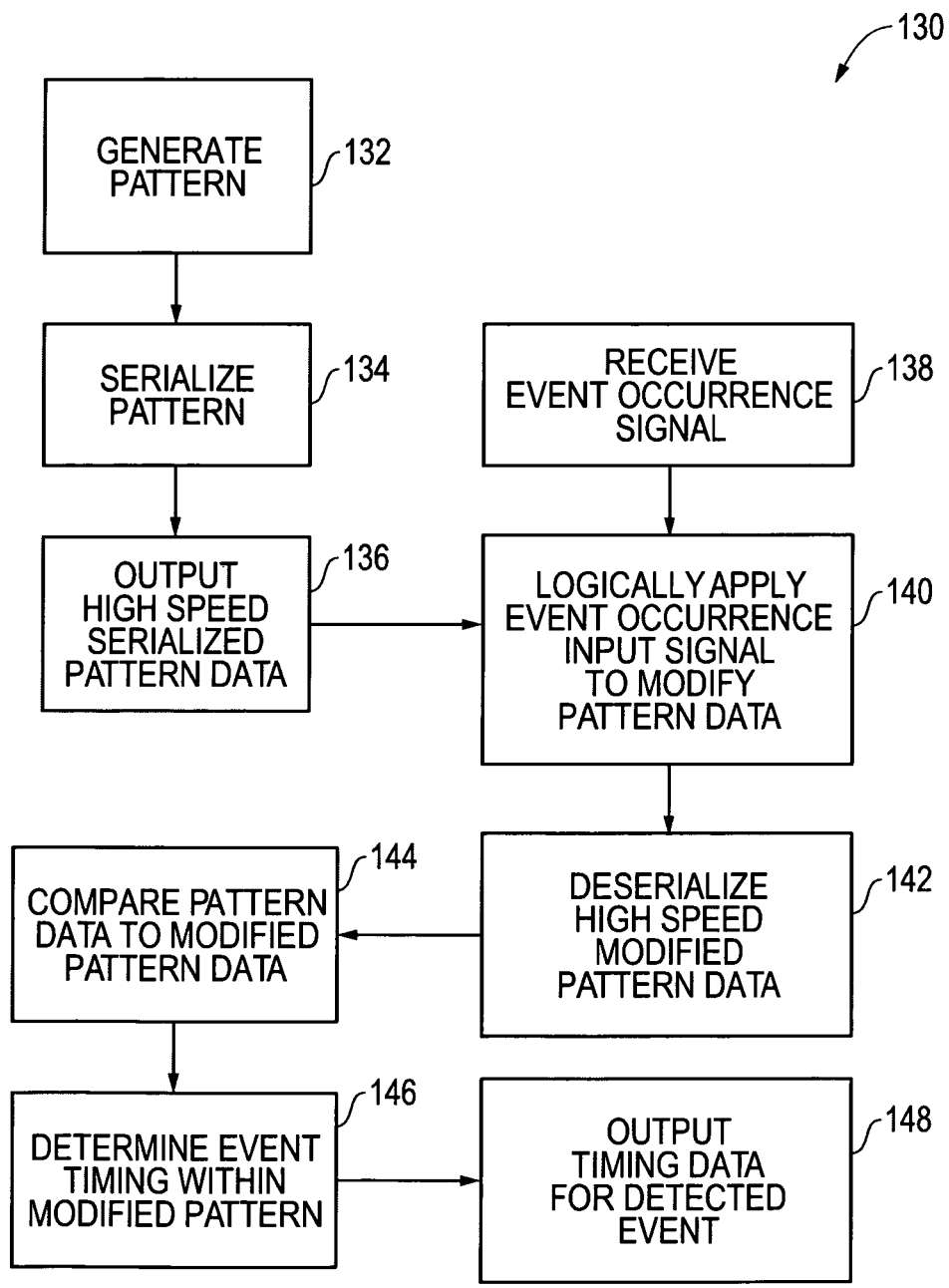
FIG. 1B is a process flow diagram of an embodiment for precise event detection.
Figure 1C:
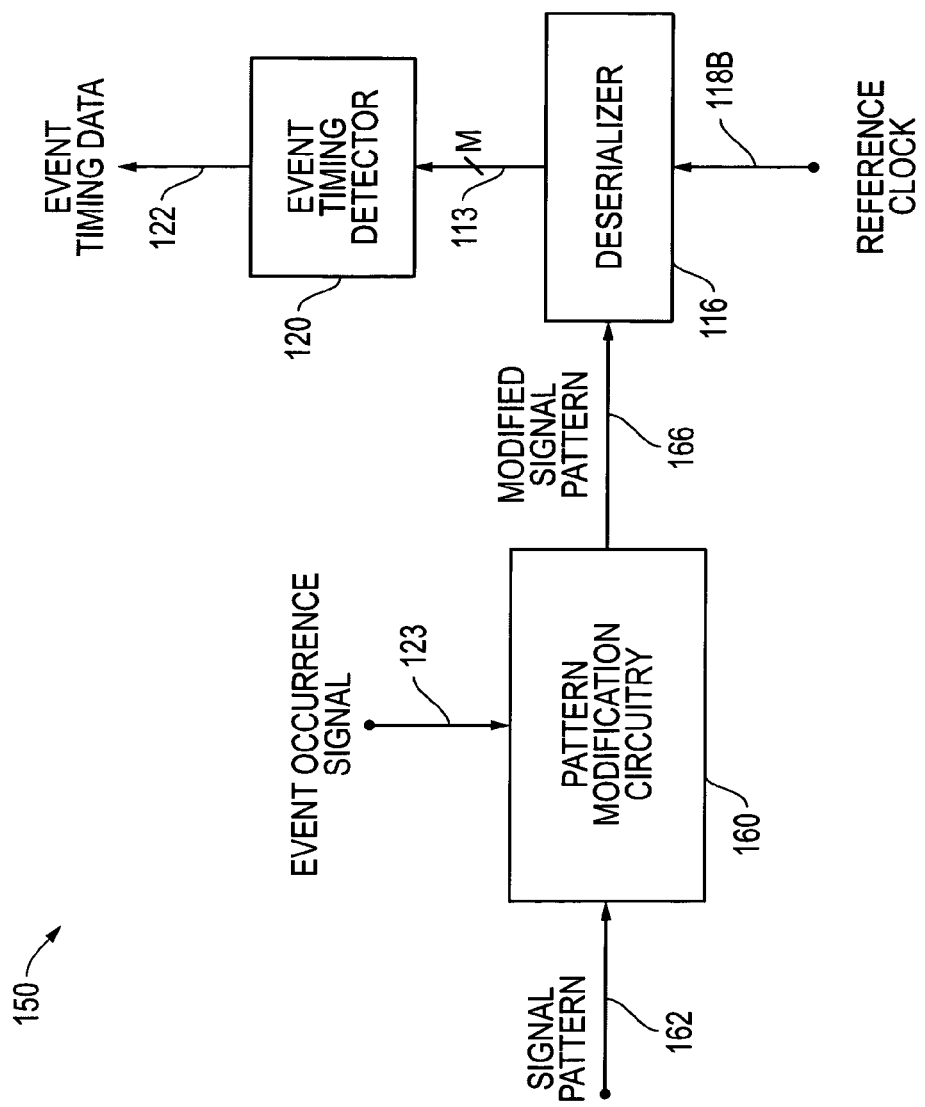
FIG. 1C is a block diagram for a further embodiment for a precise event detection system.
Figure 2A:
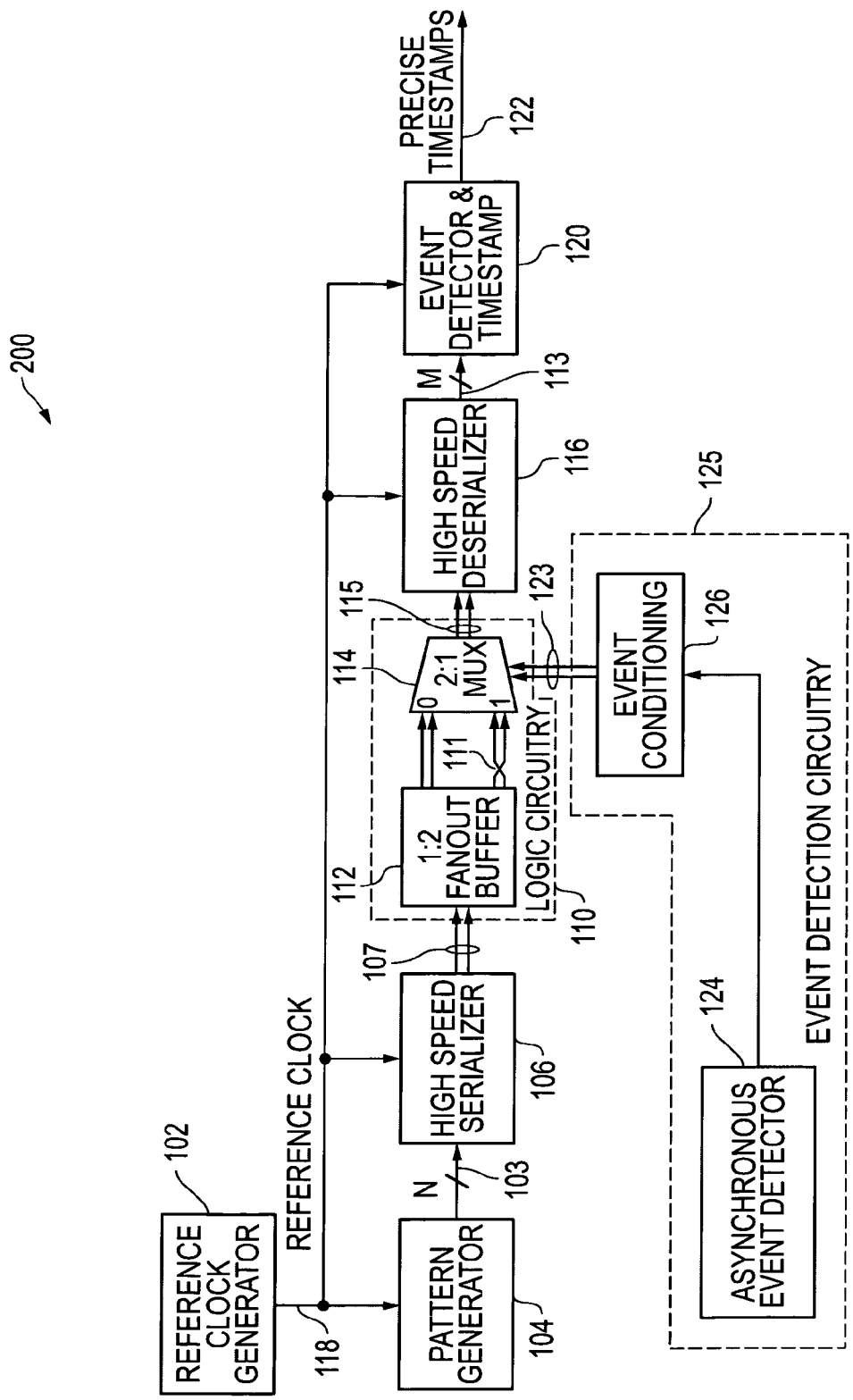
FIG. 2A is a more detailed block diagram of an embodiment for a system that provides precise detection of events utilizing high speed serializer, logic and deserializer circuitry.
Figure 2B:
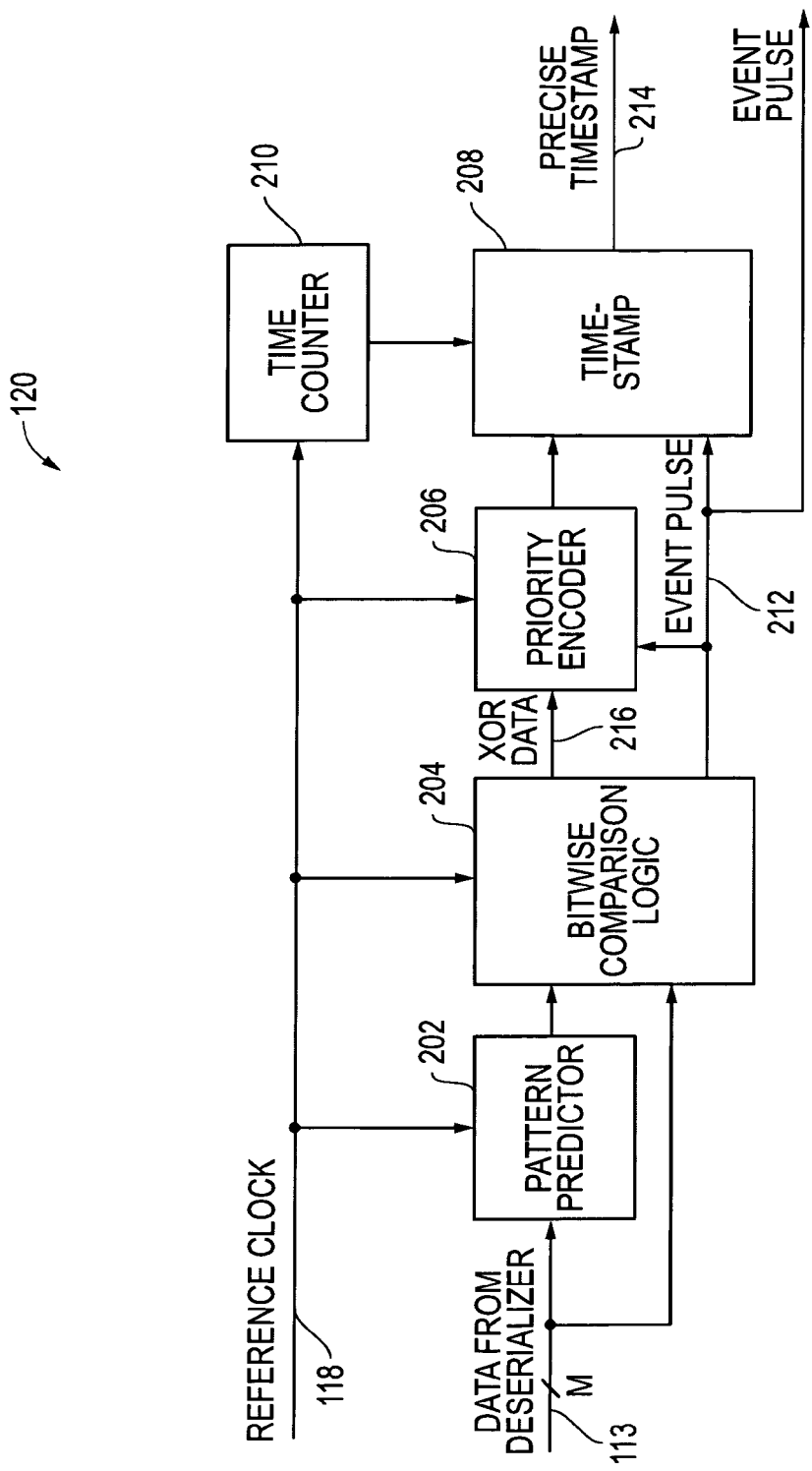
FIG. 2B is a block diagram of an embodiment for event detector and timestamp circuitry that can be utilized to provide precise timestamps associated with detected events.
Figure 4:
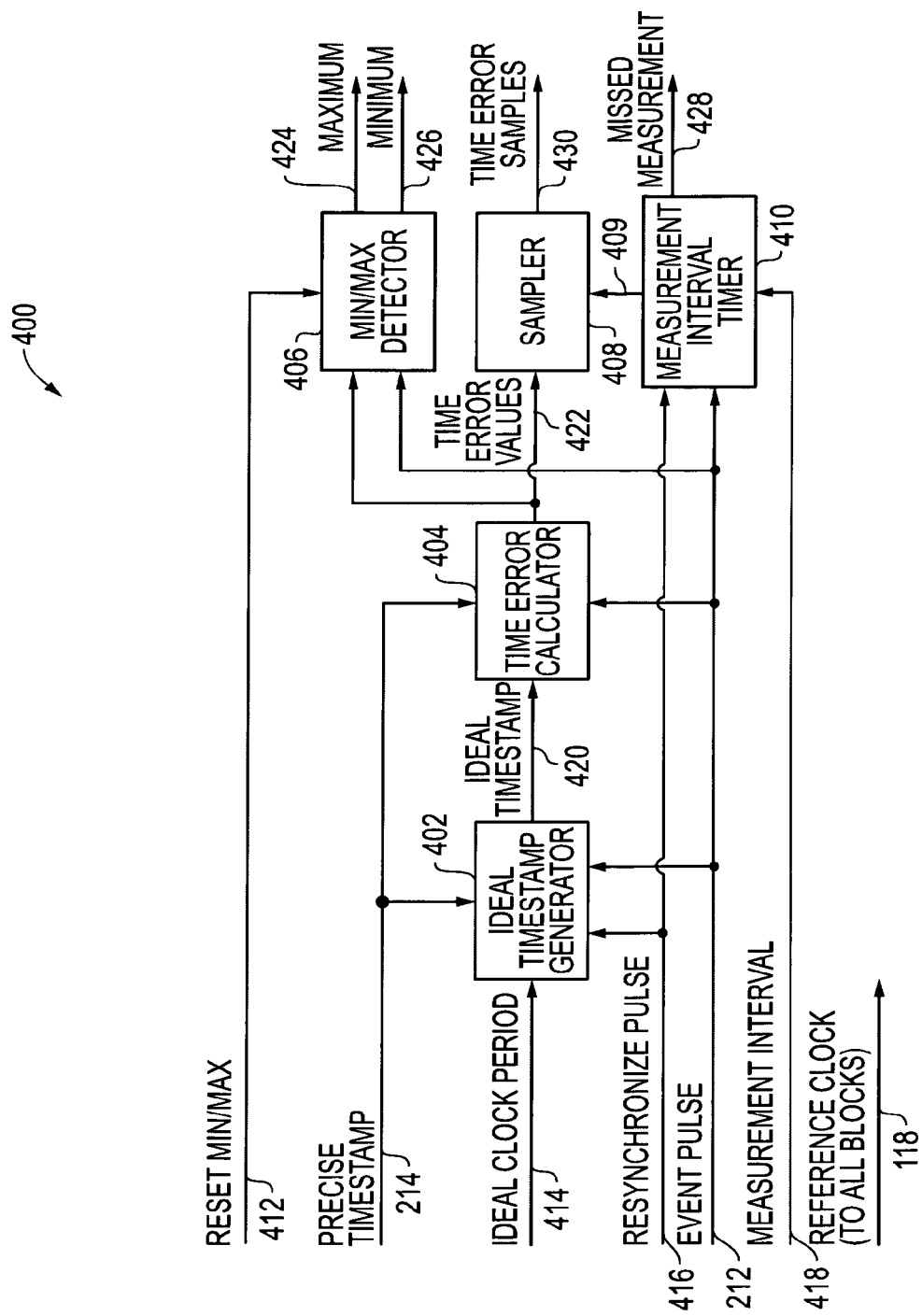
FIG. 4 is a block diagram of an embodiment for additional timestamp processing circuitry that can be utilized to provide additional information associated with the detection of events.
Figure 5A:
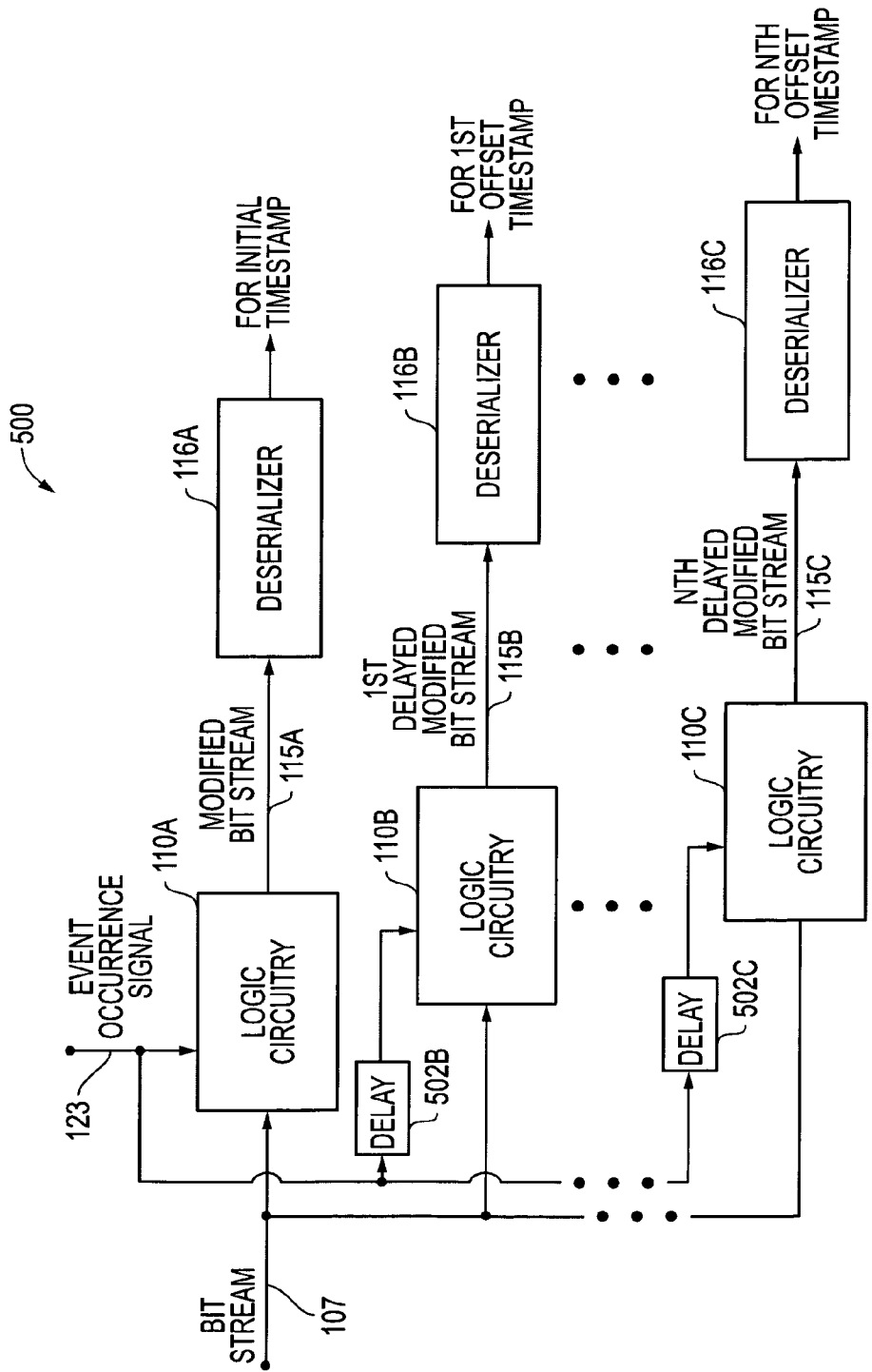
FIG. 5A is a block diagram of an embodiment using multiple offset timestamps to provide increased resolution.
Figure 5B:
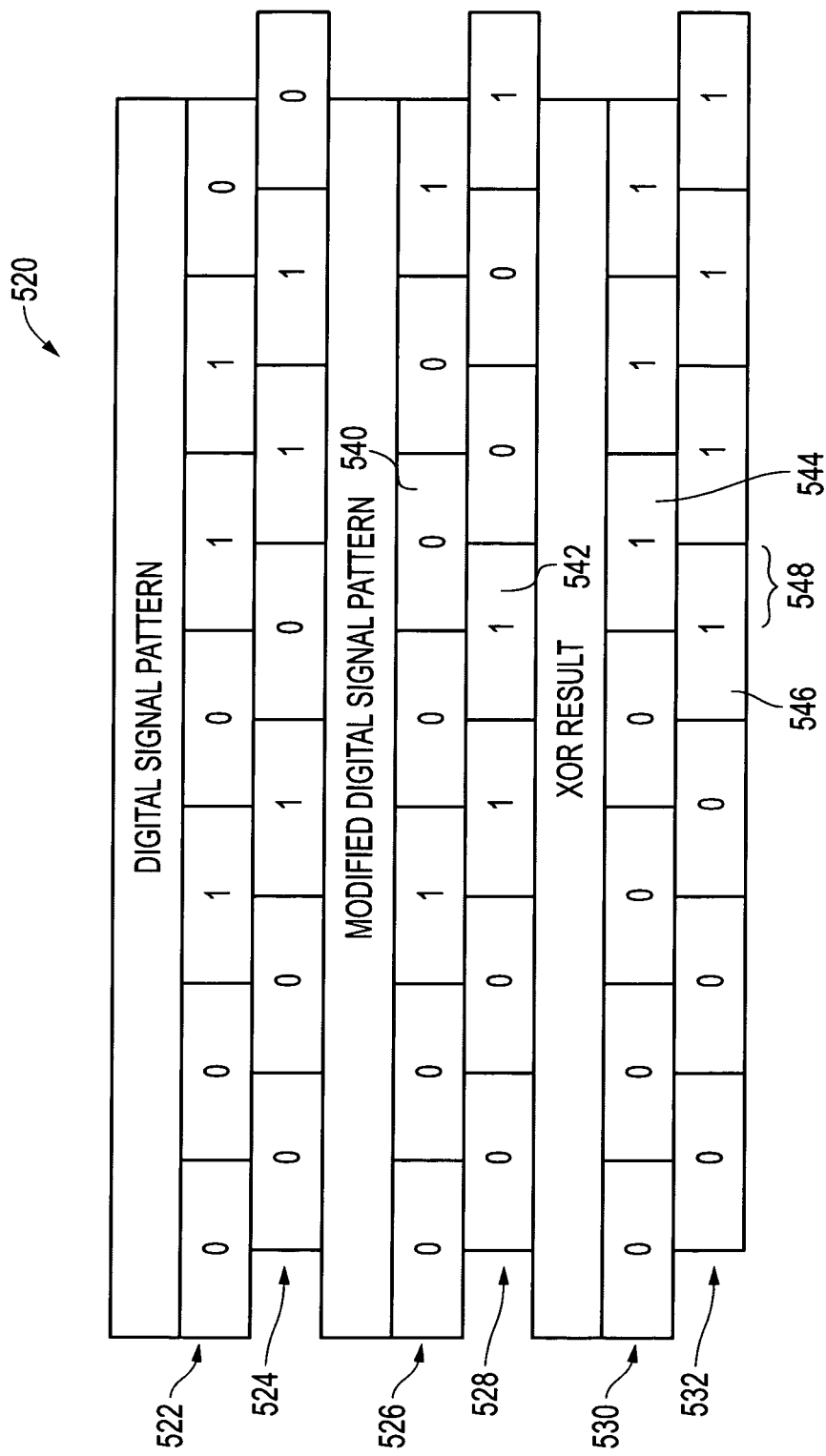
FIG. 5B is a signal diagram for offset detection of events using an embodiment according to FIG. 5A.
Figure 5C:
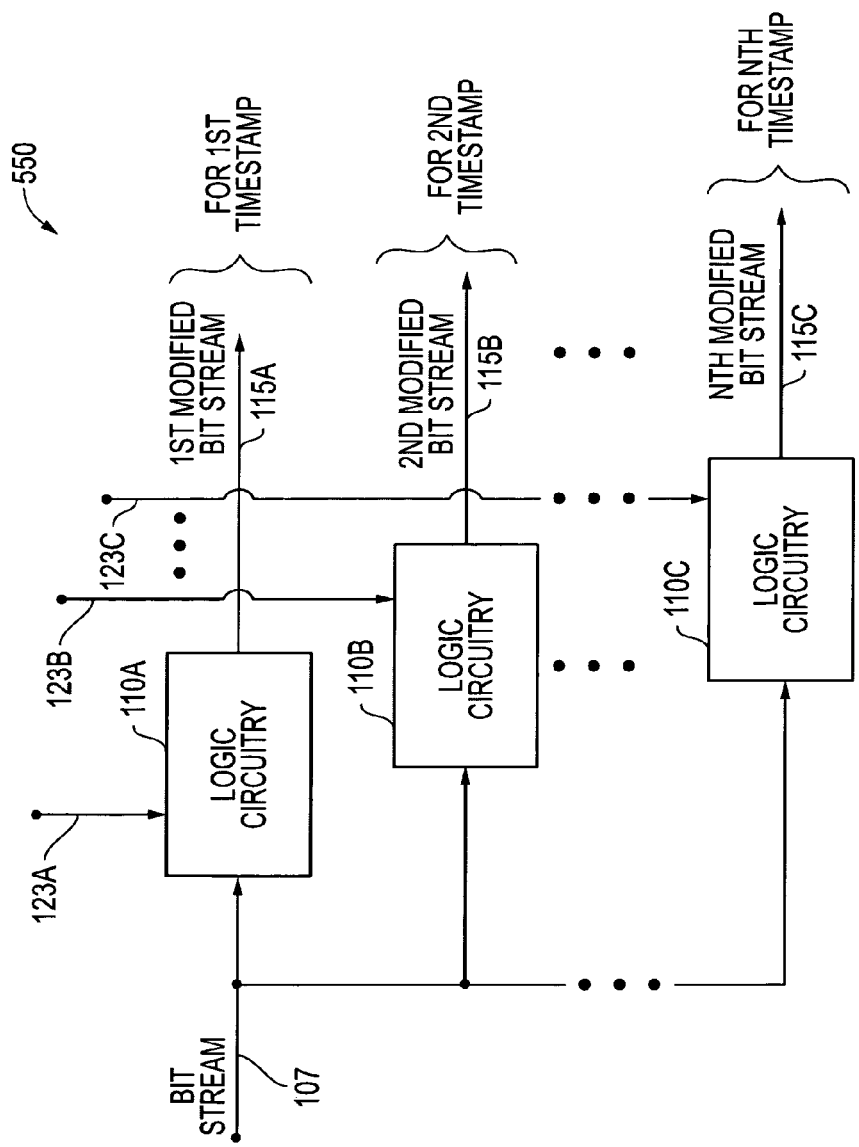
FIG. 5C is a block diagram of an embodiment for detecting events from multiple event occurrence input signals.
Figure 6A:
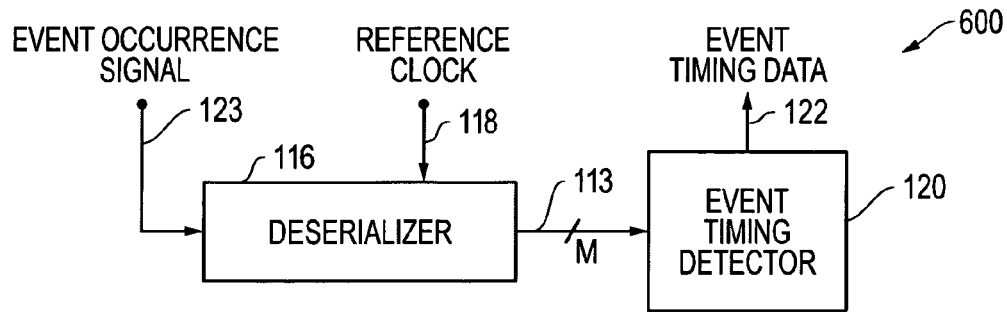
FIG. 6A is a block diagram of an embodiment for providing an event occurrence signal directly to a deserializer for sampling and conversion to multi-bit parallel data words.
Figure 6B:
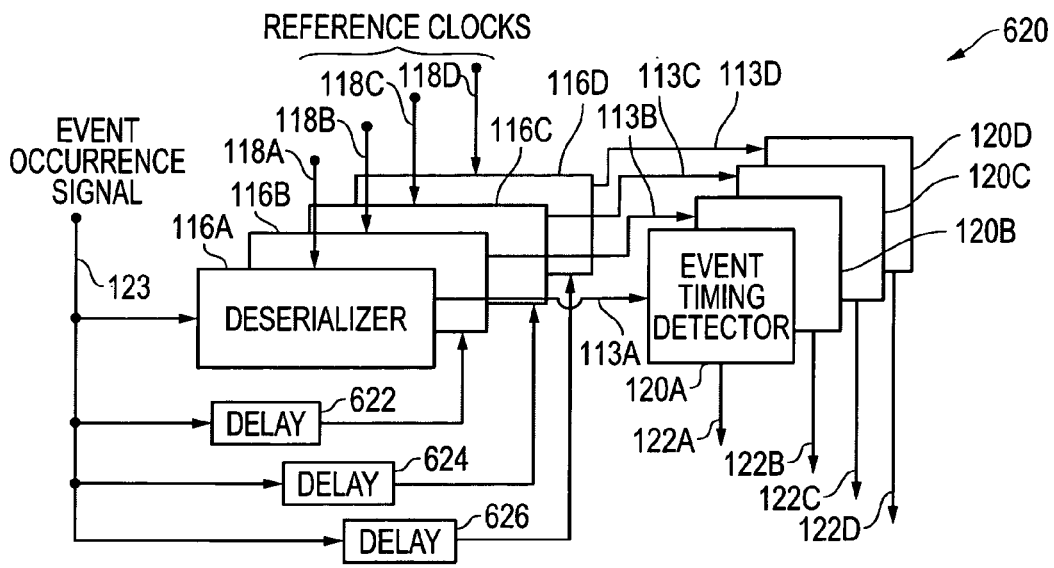
FIG. 6B is a block diagram of an embodiment for using multiple deserializers to provide offset times stamps for an event occurrence signal provided directly to the deserializers.
Figure 6C:
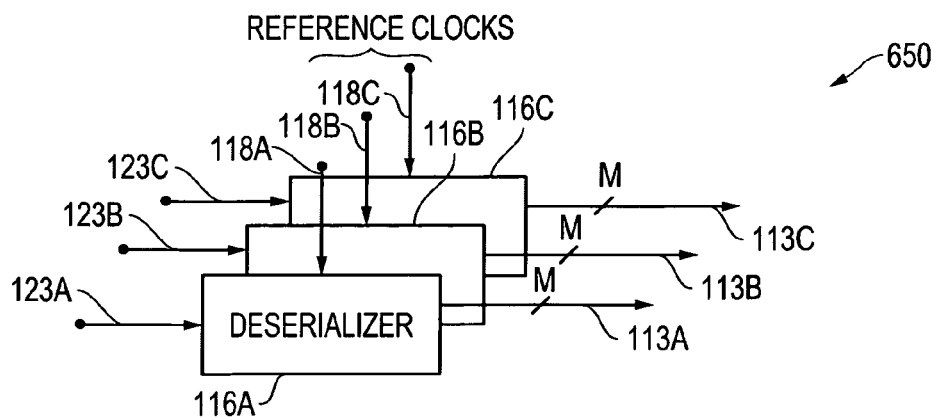
FIG. 6C is a block diagram of an embodiment for using multiple deserializers to detect events from multiple event occurrence input signals provided directly to the deserializers.

FIG. 1A is a block diagram of an embodiment for a precise event detection system. FIG. 1B is a process flow diagram of an embodiment for precise event detection. FIG. 1C is a block diagram of a further embodiment for a precise event detection system. FIG. 2A is a more detailed block diagram of an embodiment for a system that provides precise detection of events utilizing high speed serializer, logic and deserializer circuitry. FIG. 2B is a block diagram of an embodiment for event detector and timestamp circuitry that can be utilized to provide precise timestamps associated with detected events. FIG. 3 is a diagram of an embodiment for timestamps and error values associated with detected events. FIG. 4 is a block diagram of an embodiment for additional timestamp processing circuitry that can be utilized to provide additional information associated with the detection of events. FIG. 5A is a block diagram for an embodiment that uses multiple offset timestamps to provide improved finer resolution. FIG. 5B is a signal diagram for offset detection of events using an embodiment according to FIG. 5A. FIG. 5C is a block diagram of an embodiment for detecting events from multiple event occurrence input signals. FIGS. 6A-6C are block diagrams of embodiments for providing event occurrence signals directly to deserializers and then generating event timing data.

The disclosed systems and methods provide improved performance as compared to prior techniques. For example, improved precision is provided as compared to typical counter based techniques, which are limited by the speed at which the counter can be operated. The disclosed techniques can also be implemented as fully digital solutions so that the accuracy of timestamp data is improved. Furthermore, the disclosed embodiments can be implemented without requiring complicated calibration schemes or other requirements often seen in analog solutions (e.g., such as detailed control of the duty cycle of a reference clock).

In some embodiments as described below, the signal event measurement techniques disclosed herein generate a known digital signal pattern of information bits, transmit them at high speed with a serializer, modify (e.g., pass or invert) the high speed bit stream according to an event occurrence signal, receive and deserialize the modified high speed bit stream with a deserializer, compare the deserialized modified bit stream with a prediction of the information bits for the original signal pattern, and determine the bit positions or bit periods at which the modifications (e.g., inversions) occur from the comparison of the results. These bit positions can then be used to represent the relative time at which the detected signal event occurred. Advantageously, the precision of these time measurements is associated with the bit period of the high speed signals processed by the serializer, deserializer and logic circuitry rather than slower clock rates that may be associated with other circuit operation within the system.

FIG. 1A is block diagram of an embodiment 100 for a precise event detection system. The pattern generator circuitry 104 provides an output 103 to the serializer circuitry 106. The output 103 is the digital signal pattern output by the pattern generator circuitry 104 as multi-bit parallel data (e.g., N-bit data words), and these multi-bit parallel data words are then received and serialized by the serializer circuitry 106. The serializer circuitry 106 then provides output 107 to logic circuitry 110. The output 107 is a bit stream representing the digital signal pattern and is output by the serializer circuitry 106 as single-bit serial data. This bit stream 107 is then received and processed by logic circuitry 110. The logic circuitry 110 also receives an event occurrence signal 123 as an input. As described in more detail below, the event occurrence signal 123 can be any of a variety of signals that indicate the occurrence of events. And the event occurrence signal 123 can be provided directly from a signal event source for which events are being detected to being used, or the event occurrence signal 123 can be processed or conditioned prior to being used, as desired, depending upon the logic or other circuitry being used.

The logic circuitry 110 logically processes the bit stream 107 and event occurrence signal 123 to produce a modified bit stream as its output 115. As described in more detail below, this logical operation can be an exclusive-OR (XOR) logic operation, if desired. This modified bit stream 115 represents the bit stream 107 as modified through logic circuitry 110 based upon events represented by changes in the event occurrence signal 123. The modified bit stream is output by logic circuitry 110 as single-bit serial data to the deserializer circuitry 116. The deserializer circuitry 116 deserializes this modified bit stream 115 and produces an output 113 to the event timing detector circuitry 120. The output 113 is multi-bit parallel data words (e.g., M-bit data words) that represents a modified digital signal pattern based upon the modified bit stream 115. These multi-bit parallel data words 113 are then received and processed by event timing detector circuitry 120. The event timing detector circuitry 120 compares the modified digital signal pattern with a predicted digital signal pattern based upon the original digital signal pattern and determines if an event has been detected and produces event timing data 122 associated with the occurrence of events. This event timing data 122 can then be used by other circuitry or systems, as desired, such as to generate precise timestamps and/or time errors as described in more detail below.

Advantageously, the signal lines 103 and 113 having multi-bit parallel data can be operated at rates that are slower than the bit stream operational rates of the serializer circuitry 106, the logic circuitry 110 and the deserializer circuitry 116. For example, signal lines 103 and 113 can be operated at rates based upon reference clock signals 118A and 118B, which can have the same or different rates, and the reference clock rates can be slower than the serial bit stream rates on signal lines 107 and 115. As described in more detail below, because the serializer circuitry 106, the logic circuitry 110, and the deserializer circuitry 116 are operating at faster rates than the signal lines 103 and 113, they can be used to provide timing measurements that exceed the resolution that would be possible using clock rates associated with the signal lines 103 and 113 alone.

It is further noted that the reference clock signals utilized and described herein, such as reference clocks signals 118 and 118A/B, can be the same rate, if desired, or can be different rates. Further, a plurality of reference clock signals can be generated and used by applying dividers, multipliers and/or other circuitry to a base reference clock signal. As such, a wide variety of reference clock signals at one or more rates can be based upon one or more reference clock signals. For example, a reference clock generator may generate a reference clock signal and one or more reference clock signals that are all based on the same reference clock signal (e.g., 10 MHz, 20 MHz and 40 MHz, or 25 MHz, 125 MHz and 156.25 MHz) because the different rates can be converted from one to another through clock divider and/or multiplier circuitry, PLL (phase locked loop) circuitry and/or other desired circuitry. In short, the reference clock signals used herein can be the same rate but can also be different rates, if desired, and can further be one or more reference clock signals based upon one or more base reference clock signals. As such, the different circuit blocks described herein that receive reference clock signals can be coupled to a generated reference clock signal through one or more divider circuitry, multiplier circuitry and/or other circuitry while still receiving a reference clock signal based upon a generated reference clock signal.

With respect to the actual data rates being used, signal line 103 can operate at a first rate; signal line 107 can operate at a second rate; signal line 115 can operate at a third rate; and signal line 113 can operate at a fourth rate. In some embodiments, the first and fourth rates could be the same, and the second and third rates could be the same. Further, the N-bit data and the M-bit data could be the same data width so that N and M are the same. However, more generally, the second rate and the third rate could be different but both be faster than the first rate. Further, if desired, the third rate could be higher than the second rate. Still further, the fourth rate could be different from the first rate but could be slower than the third rate. As such, different combinations of rates could be used for the first, second, third and fourth rates, as desired, while still taking advantage of the techniques described here for achieving greater timing resolution than would be available by simply relying upon a reference clock signal. In one embodiment described below, the serializer 106 and the deserializer 116 can operate at 5 GHz or 10 GHz, and the signal lines 103 and 113 can operate at a much lower rate, such as 156.25 MHz. Other rates could also be used, as desired.

It is noted that the serializer 106 and deserializer 116 can be implemented using one or more FPGA (field programmable gate arrays) integrated circuits, such as those available from Altera Corporation. For example, Stratix IV GX transceivers available from Altera can be used to implement the serializer 106 and deserializer 116, if desired.

FIG. 1B is a process flow diagram of an embodiment 130 for precise event detection. In block 132, a digital signal pattern is generated. The digital signal pattern data is then serialized in block 134. The serialized digital signal pattern data is then output at high speed in block 136, where the output rate is higher than the rate at which the pattern data was originally generated. An event occurrence signal is received in block 138. In block 140, the event occurrence input signal is logically applied to the serialized pattern data to produce modified pattern data that is still serialized and at high speed. As described above, an XOR logic operation is one logic operation that can be applied to the serialized pattern data using the event occurrence signal to produce modified serialized pattern data. Other logic operations and/or other bit stream modification circuitry could also be used, if desired. In block 142, the modified signal pattern data is then deserialized to produce modified digital signal pattern data that is no longer serialized. In block 144, the original or predicted pattern data is compared to the modified pattern data. In block 146, this comparison is used to determine event timing within the modified digital signal pattern. Finally, in block 148, timing data associated with the detected event can be output.

Thus, as described herein, by applying a logic operation to serialized digital signal pattern data using an event occurrence signal, modified digital signal pattern data can be generated. Once this modified digital signal pattern data is compared to the original pattern data or a predicted pattern data based upon the original pattern data, differences can be determined between the two and used to identify when a signal event occurred within the modified digital signal pattern data. This event occurrence within the modified digital signal pattern data provides a greater resolution for the timing data than would be available at reference clock rates used for the parallel data words because the logic operation is performed at a higher speed on serialized pattern data. Thus, one or more orders of magnitude greater resolution is possible as compared to using a reference clock signal alone to provide event detection and timing measurements.

FIG. 1C is a block diagram for a further embodiment 150 for a precise event detection system. For this embodiment 150, an input signal pattern 162 is provided to pattern modification circuitry 160. The pattern modification circuitry 160 modifies the pattern signal 162 to produce a modified signal pattern 166 based upon the event occurrence signal 123. The modified signal pattern 166 includes one or more modifications to the pattern signal 162 to represent one or more events within the event occurrence signal 123. The deserializer 116 operates to sample logic levels represented by the modified signal pattern 166 at a rate that is faster than the reference clock signal 118B. The deserializer 116 then outputs M-bit parallel digital data 113 that is based upon the logic values sampled from the modified signal pattern 166. The modified signal pattern 166 can be a digital signal or an analog signal, as desired, where a digital signal is one that is configured to move between two logic levels (e.g., high logic level and low logic level) and where an analog signal is one that is configured to move between three or more voltage levels. The deserializer 116 can be configured to determine whether a high logic level or a low logic level is present whether the modified signal pattern 166 is a digital signal or an analog signal. For example, if analog signal, then analog values above a certain level can be detected as a high logic level, and analog values below this certain level can be detected as a low logic level. The detected logic levels are then converted by the deserializer 116 to the M-bit digital parallel data 113. The event timing detector circuitry 120 receives this M-bit parallel data, compares it to a predicted signal pattern based upon the signal pattern 162, and produces event timing data 122 based upon this comparison. As described herein the event timing data 122 can be a wide variety of timing information including timestamps and/or error values. Further, it is noted that the event occurrence signal 123 and the signal pattern can also be digital signals or analog signals, as desired. And as described herein, the event occurrence signal 123 can be provided directly from a signal source for which events are being measured, or the event occurrence signal can be processed or conditioned prior to being used by the pattern modification circuitry 160.

FIG. 2A is a more detailed block diagram for an embodiment 200 of a system for precise detection of events. As with embodiment 100 of FIG. 1A, embodiment 200 utilizes serializer circuitry 106, logic circuitry 110 and deserializer circuitry 116 operating at a high speed to modify a bit stream based upon a digital signal pattern so that timing associated with the event occurrence can be determined at a level of precision greater than what would be provided using a reference clock signal alone.

In the embodiment 200 depicted, pattern generation circuitry 104 is coupled to high speed serializer circuitry 106. The pattern generation circuitry 104 produces a digital signal pattern of information bits, and this digital signal pattern is output as N-bit parallel data 103 to the high speed serializer 106. The high speed serializer 106 serializes this N-bit parallel data 103 to produce a bit stream of single-bit serial data that is provided to the logic circuitry 110. In addition to this bit stream, the logic circuitry 110 also receives an event occurrence signal 123 as an input from event detection circuitry 125. The event detection circuitry 125 can include, for example, event conditioning circuitry 126 and asynchronous event detector circuitry 124. The logic circuitry 110 processes these inputs and generates a modified bit stream 115 that is provided to the deserializer circuitry 116 as single-bit serial data. The high speed deserializer circuitry 116 processes this high speed modified bit stream and outputs M-bit parallel data 113 to event detector and timestamp circuitry 120. The event detector and timestamp circuitry 120, as described further below, can process the M-bit parallel data 113 and determine when the signal event occurred within the modified bit stream and generate event timing data 122, such as precise timestamps, associated with detected events, if desired.

As also shown in the embodiment 200 depicted, the logic circuitry 110 is implemented as exclusive-OR (XOR) logic circuitry, as described in more detail below, and uses differential input and output signals. As such, the high speed serializer 106 provides the high speed bit stream to the logic circuitry 110 as a differential input signal 107. Similarly, the event detection circuitry 125 provides the event occurrence signal to the logic circuitry 110 as a differential input signal 123. It is noted that differential signals are used in differential signaling where information is transmitted electrically by means of two complementary signals, for example, two complementary signals sent using two separate wires or signal paths. The information being transmitted (e.g., logic one or logic zero) is represented in the difference between the two complementary signals. As such, for differential signaling, the receiving device or circuitry uses the voltage difference between the two signals to determine the transmitted information. Differential signaling can be used in high speed applications to improve performance.

As depicted, the XOR logic circuitry includes a 1-to-2 (1:2) fan-out buffer 112 and a 2-to-1 (2:1) multiplexer (MUX) 114. The fan-out buffer 112 receives the differential bit stream 107 from the high speed serializer 106 and produces two differential signals as outputs. One of the differential output signals is provided to the zero (0) input of the multiplexer 114 as a non-inverted bit stream differential input. The other differential output signal is provided to the one (1) input of the multiplexer 114 as an inverted bit stream differential input. This inverted bit stream input can be obtained, for example, by swapping the differential signals as represented by crossover 111 in FIG. 2A (e.g., by swapping the signal lines on a circuit board). In addition to the inverted bit stream and non-inverted bit stream inputs, the multiplexer 114 also receives the differential event occurrence signal 123 from the event detection circuitry 125 as its control input. This control input operates to select as the differential output 115 of multiplexer 114 either the non-inverted bit stream or the inverted bit stream based upon the state of the differential event occurrence signal 123. In the embodiment depicted, if the event occurrence signal 123 is a high logic level, then the one (1) input of the multiplexer 114 is selected and the inverted bit stream is output by multiplexer 114 to the high speed deserializer 116. And if the event occurrence signal 123 is a low logic level, then the zero (0) input of the multiplexer 114 is selected and the non-inverted bit stream is output by multiplexer 114 to the high speed deserializer 116. In so doing, the logic circuitry 110 implements an exclusive-OR (XOR) logic function with the bit stream input signal 107 and the event occurrence signal input 123 as the inputs to the XOR logic operation.

The operation of the XOR logic circuitry 110 in the embodiment depicted can be summarized with the following logic set forth in TABLE 1 below.

TABLE 1

| XOR Logic Circuitry | | |
| --- | --- | --- |
| Bit Stream Signal Input 107 | Event Occurrence Signal Input 123 | Output 115 From MUX 114 |
| Low | Low | Low (non-inverted input selected) |
| Low | High | High (inverted input selected) |
| High | Low | High (non-inverted input selected) |
| High | High | Low (inverted input selected) |

It is noted that other logic functions could also be used for logic circuitry 110 rather than the XOR operation depicted. For example, an exclusive-not-OR (XNOR) logic operation could be used by simply inverting the output of the logic outputs provided in TABLE 1 above. Further, OR, AND, NOR, NAND and/or other logic operations could also be used, if desired. For example, with an OR logic operation implemented in logic circuitry 110, when the event occurrence signal 123 is a logic 1, the output of the MUX 114 is also a logic 1. However, the deserializer and downstream processing will lose additional signal edges because the output will stay a logic 1 so long as the event occurrence signal is a logic 1. Similarly, with an AND logic operation implemented by logic circuitry 110, when the event occurrence signal 123 is a logic 0, the output of the MUX 114 is also a logic 0, and the deserializer and downstream processing will similarly lose all edges as long as the event occurrence signal 123 remains a logic 0. Similar operation would also occur if NOR or NAND logic operations were implemented in logic circuitry 110. Further, it is noted that the event conditioning circuitry 126 could also be modified in addition to the logic circuitry 110. For example, if OR/AND/NOR/NAND logic operations were used, similar results to those described herein for the XOR logic operation could be achieved by having the event conditioning circuitry 126 generate a pulse with a controlled width as the event occurrence signal 123 in response to a detected event. This would allow for the output 115 of MUX 114 to continue toggling based upon the bit stream 107 after a signal event had been detected. Other variations could also be implemented as desired while still taking advantage of the high speed serializer/deserializer circuitry along with a logic operation to modify the high speed bit stream based upon an event occurrence signal so that a comparison can be made with the original or predicted bit stream to determine event timing information associated with an event occurrence.

Looking back to FIG. 2A, it is noted that the reference clock signal 118 produced by the reference clock generator circuitry 102 is provided to pattern generator circuitry 104, high speed serializer circuitry 106, high speed deserializer circuitry 116 and event detector and timestamp circuitry 120. As described herein, each of these circuit blocks can be configured, if desired, to utilize this reference clock signal 118 or a clock signal based upon this reference clock signal 118 for timing of its operations. For example, one or more reference clock signals can be generated from one or more initial reference clock signals using divider circuitry, multiplier circuitry and/or other desired circuitry. It is further noted, as also described below, that a reference clock signal could also be recovered by the deserializer circuitry, for example, from the modified bit stream 115, if desired. This recovered clock, for example, could be used by the deserializer 116 and/or the event detector and timestamp circuitry 120, if desired.

In operation, the serializer circuitry 106, logic circuitry 110 and deserializer circuitry 116 preferably operate at higher speeds as compared to the pattern generator circuitry 104 and the event detector and timestamp circuitry 120. For example, the pattern generation circuitry 104 could be operating at about 156.25 MHz so as to output N-bit parallel data words representing a digital signal pattern at a rate of 156.25 million words per second. As stated above, this rate of operation can be based upon the reference clock signal 118, if desired. The high speed serializer 106 can receive this N-bit data input and can output single-bit serial data as a bit stream at a higher rate. For example, the output of high speed serializer 106 could be capable of operating at rates of 1 GHz or more (e.g., 1 gigabits per second or more). This high speed bit stream is then modified by logic circuitry 110 based upon the receipt of the event occurrence signal from event detection circuitry 125. The logic circuitry 110 can also be configured to operate at high speed and output a high speed modified bit stream. For example, this high speed modified bit stream could also be single-bit serial data output at rates of 1 GHz or more (e.g., 1 gigabits per second or more). This high speed modified bit stream is then converted to a modified digital signal pattern by deserializer circuitry 116, which operates to receive the high speed modified bit stream and output at a lower rate M-bit parallel data words representing the modified digital signal pattern data. For example, the deserializer circuitry can be capable of operating to receive the modified bit stream input at rates of 1 GHz or more (e.g., 1 gigabits per second or more) and to output M-bit parallel data words representing a modified digital signal pattern at a lower rate, such as 156.25 MHz or 156.25 million words per second. As stated above, this output rate of M-bit data can be based upon the reference clock signal 118, if desired.

The modification to the bit stream made by the logic circuitry can then be detected in the event detector and timestamp circuitry 120 by comparing the modified digital signal pattern to a predicted digital signal pattern based upon the digital signal pattern originally generated by the pattern generation circuitry 104. This comparison can be used to determine the bit position or bit period at which the event occurred within the modified digital signal pattern. As such, event timing indication data is generated that represents a relative time within the modified digital signal pattern at which the detected signal event occurred. This event timing indication data can then be used to generate a timestamp for the event occurrence, and this timestamp can provide more precision than simply using a clock signal alone, as described in more detail below.

Advantageously, by using the high speed serializer 106, logic circuitry 110 and deserializer 116, the embodiments disclosed herein can determine an event occurrence at one or more orders of magnitude better resolution than would have been achieved using the reference clock signal 118 alone. In short, the bit rate or bit period of the high speed circuitry is used to determine the resolution of the timestamps as opposed to the rate of a reference clock alone. Further, as described below, additional techniques, such as offset time measurements, can be used to provide even finer resolution. As such, the resolution provided by the timestamps are related to the bit period of the incoming modified bit stream, thereby providing improved resolution as compared to prior solutions.

It is again noted that the reference clock generator circuitry 102 can be utilized to generate a reference clock signal 118 at a controlled frequency. That clock signal 118 can then be connected to and used directly or indirectly to, time the operation of other circuitry within embodiment 200.

The pattern generator circuitry 104 can be configured to generate digital signal patterns, and these digital signal patterns can be output as parallel information words containing a known pattern of information bits. Examples of digital signal patterns of information bits that could be used include a pseudorandom bit sequence, a counting pattern, an alternating pattern of ones and zeroes or some other desired digital signal pattern. The specific pattern is not significant as long as it can be transmitted, predicted or repeated for comparison purposes within the event detector and timestamp circuitry 120, and as long as it can be received by the deserializer 116. For example, some deserializer implementations may require that a received bit stream have sufficient transitions between the logic 0 and 1 levels to enable clock recovery, and some deserializer implementations may require that the signal have an equal number of logic 0 and logic 1 values to ensure DC balance with respect to the incoming signals. As such, the digital signal pattern utilized can be selected with consideration given to the serializer/deserializer circuitry being used.

It is further noted that the pattern generator 104 and the serializer 106 could also be implemented more simply, if desired, as a high speed clock generator configured to generate a fixed pattern at a high speed clock rate. For example, a clock generator operating at 5 GHz could be configured to output a fixed pattern, such as 10101010101010 . . . , and this fixed pattern could be used as the digital signal pattern provided to the logic circuitry 110. It is further noted that the deserializer 116 could be implemented using memory circuitry configured to store the modified bit stream from the logic circuitry 110, and this modified bit stream, once stored, could be later analyzed by any of a wide variety of processing systems to determine the location of events within the modified bit stream. The deserializer 116 and event detector and timestamp circuitry 120 are simply one implementation that could be used to detect the event occurrence within the modified bit stream.

As described above, the high speed serializer 106 in embodiment 200 takes the parallel information words provided by the pattern generator 104 and transmits them serially at high speed as a differential signal to logic gates within logic circuitry 110 that can be configured to perform an XOR logic function. The fan-out buffer 112 and the multiplexer (MUX) 114 are connected together to perform the XOR logic function by taking advantage of the fact that swapping the positive and negative signals that form a differential pair, as represented the cross-over 111, causes the logic values to be inverted. Thus, the multiplexer 114 selects either the original signal or its logical inverse based upon the event occurrence signal 123 input as a control signal to the multiplexer 114. It is noted that for performance purposes, it is desirable for the length of the physical connections between the fan-out buffer 112 and the multiplexer 114 to be configured to be relatively short and matched as closely as is practically possible, so that the position of the edges of the output signals from the multiplexer 114 do not depend on which input the multiplexer selects. In other words, it is desirable that the delay through the fan-out/multiplexer circuitry be ideally the same regardless of whether the multiplexer selects the true or inverted version of the bit stream signal lines from the fan-out buffer 112.

It is also noted that fan-out buffer 112 and multiplexer 114 provide one implementation for logic circuitry that implements an XOR function. The logic circuitry 110 could also be implemented using a high speed XOR gate device or other logic circuitry, if desired. However, it is noted that at very high speeds, such as speeds at or over 1 Gbps, fan-out buffers and multiplexers are more commonly available than logic gates. Further, very high speed electrical signals are often implemented using differential signals, which makes it possible to implement an XOR gate with a fan-out buffer and a multiplexer as depicted in FIG. 2A. However, it is again noted that other implementations and circuitry could be used, as desired, to implement the logic circuitry 110. For example, instead of a fan-out buffer a passive signal splitter could also be used that is configured to provide signals to both inputs of the multiplexer without excessively degrading the signal. A passive signal splitter can be used to split an input signal into a plurality of output copies, where each of the output copies has less power than the input signal, but the sum of the power levels of the output signals is approximately the same as the input signal power level. Other circuit variations could also be used, if desired.

The asynchronous event detector 124 within the event detection circuitry 125 detects a signal event of interest for which it is desired to measure timing associated with the occurrence of the signal event. As one example, the event detector 124 may be circuitry that detects rising or falling edges of a clock signal or that detects significant events of interest in any desired information signal. As another example, the asynchronous event detector 124 may detect the precise instant of transmission or reception of a network packet at a particular network interface. As such, the events being measured can be associated with network packet arrival events or network packet departure events or both. Typically, a rising edge and/or a falling edge on a signal from an event source can be used to convey the occurrence of the event, but this occurrence could also be conveyed by the leading edge of a pulse, for example. It is further noted that the asynchronous event detector 124 can be any desired circuitry used to detect a desired signal event. And the signal event can be any desired electronic signal event. Thus, a wide range of electronic systems can be the source of the signal event, and the event detector circuitry 124 detects that the event being monitored or tested has occurred. The event detector circuitry 124 can then output a signal indicating that the event has occurred to the event conditioning circuitry 126, if desired, or could output the event occurrence signal 123 directly to the logic circuitry 110, if desired.

It is further noted that the events being detected and measured are sometimes referred to herein as asynchronous events in that the exact time of the signal event occurrence and/or the exact time period between successive event occurrences is not pre-determined, although there could be predicted or desired times or time periods. For example, even if an output signal is being clocked using a synchronous clock signal, the actual occurrence of each output may not exactly align with the desired output clock period. Thus, there would be a desired or predicted time period, but the actual timing could vary for any given clock cycle or from clock cycle to clock cycle. For example, operational variations in the synchronous clock signal and/or operational variations in the output circuitry could lead to variations in the actual timing associated with the signal being monitored or detected. As such, while the output is desired to be synchronous in an ideal sense, the actual output may be non-ideal and have variations. For example, if outputs from phase locked loop (PLL) circuitry were being detected, the inherent phase noise in the PLL would lead to unavoidable non-ideal behavior, and this jitter and wander can be measured through the detection of signal events associated with the PLL output signals. As such, the non-ideal event being detected is considered to be an asynchronous signal event as used herein even though it may be associated with a synchronous clock or signal. The embodiments described herein allow for precise measurement of the actual event occurrence so that timing information associated with the variations in the actual events can be determined and analyzed, as desired. This ability to provide precise timing information for events is advantageous. For example, this precise timing information is advantageous for use with test and measurement, monitoring and/or emulation systems. Network emulation systems that are used to emulate and test network systems and environments are one example of systems that can take advantage of the embodiments described herein.

The event conditioning circuitry 126, if needed, converts the event indication signals from the event detector circuitry 124 into a format suitable for use with the logic circuitry 110. For example, for the embodiment depicted, the event conditioning circuitry 126 can convert the event signal from the event detector 123 to a differential input signal 123 for use as the control signal to the multiplexer 114. This conditioning may include, for example, one or more of the following operations: converting the signal from single-ended logic levels to differential logic levels, increasing or decreasing the slew rate of the edges of the signal, converting pulses into single edges, adjusting the rate at which detected events are provided to the logic circuitry 110 (e.g., prescale the event signals) and/or any other desired conversion of the event signal from one format to another so that it is suitable for the logic circuitry 110 being utilized. Further, the event conditioning circuitry 126 may not be needed in certain circumstances and the event detector circuitry 124 can directly provide the event occurrence signal 123 to the logic circuitry 110. Further, in some circumstances, the signal to be monitored or measured can be directly applied to the logic circuitry 110 as the event occurrence signal 123, if desired, without using event detection circuitry 125. Still further, as described with respect to FIGS. 6A-6C below, the event occurrence signal 123 can also be provided directly to the deserializer circuitry 116, if desired. Further, it is noted that the event occurrence signal 123 can be a digital signal or analog signal, as desired, where a digital signal is one that is configured to move between two logic levels (e.g., high logic level and low logic level) and where an analog signal is one that is configured to move between three or more voltage levels.

The high speed deserializer 116 takes the differential high speed serial signal from the multiplexer 114 and converts it to a lower speed parallel signal. Further, if desired, the high speed deserializer 116 can also operate to recover a clock signal from the bit stream signal. For example, a clock signal can be recovered by observing the edges in the high speed signal and then clocking the received signal into flip-flops. This operation of a deserializer to obtain clock signals from received bit streams is one traditional technique for utilizing a deserializer to receive high speed bit streams from a serializer. The event detector and timestamp circuitry 120 can then take the received parallel signal and produce precise timestamps, as described in more detail below.

With respect to the data input and output rates being used, it is noted that it is generally desirable for the output rate of the single-bit serial data from the serializer circuitry 106 and the output rate of the single-bit serial data from the logic circuitry 110 be faster than the output rate of multi-bit parallel data from the pattern generator circuitry 104 and the multi-bit parallel data from the deserializer 116. For example, these single-bit serial data rates can each be two times or more faster than the multi-bit parallel data rates, if desired, and preferably at least four times or more faster than the multi-bit date rates. Further, if desired, the output rate of multi-bit parallel data from the pattern generator circuitry 104 and the output rate of the multi-bit parallel data from the deserializer circuitry 116 can be based upon the reference clock signal 118. Still further, these multi-bit rates can be the same. It is also noted that the N-bit data and the M-bit data could be the same data width so that N and M are the same, if desired, although different data widths could also be used.

It is noted that the bit period associated with the high speed operation of the serializer circuitry 106, the logic circuitry 110 and the deserializer circuitry 116 depends upon the circuitry used. In some implementations, the controlling factor for the bit period resolution is the speed at which the serializer and deserializer are configured to operate. For example, if serializer and deserializer circuitry designed for 10 G Ethernet communications are utilized, then the bit period for the high speed bit stream for such an implementation would be about 100 picoseconds (i.e., 1/10 GHz). The reference clock 118 and the width (N) of the output of the pattern generator 104 can then be selected based upon the speed of the serializer/deserializer such that the rate of the reference clock times the width (N) of the output of the pattern generator 104 is equal to the speed ($CLK_{HIGH\_SPEED}$) of the serializer/deserializer (i.e., $CLK_{REF} \times N = CLK_{HIGH\_SPEED}$). Similarly, the reference clock used by the high speed deserializer 116 times the width (M) of the output of the deserializer 116 can be selected to be equal to the speed of the serializer/deserializer ($CLK_{REF} \times M = CLK_{HIGH\_SPEED}$). If the same reference clock 118 is used, or recovered and used, for the high speed deserializer 116, the width (M) of the output of the high speed deserializer 104 can be set equal to the width (N) of the output of the pattern generator 104. It is noted that the serializer and deserializer are often internally configured to multiply a reference clock by the parallel word width (e.g., N or M) to produce clock signals for the high speed serial bit stream. Thus, serializer circuitry operating at 5 GHz with a 32-bit parallel word input would use a reference clock of 156.25 MHz, and a deserializer operating at 5 GHz with a 32-bit parallel word output would also use a reference clock of 156.25 MHz.

As described herein, the serializer circuitry 106 converts each N-bit word of the digital signal pattern to single-bit serial data. Assuming that $CLK_{REF} \times N = CLK_{HIGH\_SPEED}$ as described above, there are N different high speed bit periods within each reference clock cycle. When the bit period associated with the occurrence of the event is determined, this bit period can be used to determine a timestamp for the occurrence of the event signal, as described in more detail below. Thus, rather than having a resolution dependent upon the reference clock rate 118, the system has a resolution that is based at least in part upon the bit period for the operation of the high speed serializer circuitry 106, logic circuitry 110 and deserializer circuitry 116. For example, assuming the high speed bit rate is about 5 GHz, then the timing resolution would be on the order of about 200 picoseconds (i.e., 1/5 GHz or about 200 ps). Assuming the high speed bit rate is about 10 GHz, then the timing resolution would be improved to the order of about 100 picoseconds (i.e., 1/10 GHz or about 100 ps). As such, using the embodiments described herein, timing resolutions of 100-200 picoseconds or better can be achieved, depending upon the implementations utilized for the circuitry described herein. Further, as described below, additional techniques, such as offset time measurements, can be used to further improve the resolution and to provide even finer resolution for the timestamps associated with detected events.

FIG. 2B is a block diagram of an embodiment for event detector and timestamp circuitry 120 that can be utilized to provide precise timestamps associated with detected events. As depicted, the event detector and timestamp circuitry 120 includes pattern predictor circuitry 202, bitwise comparison logic circuitry 204, priority encoder 206, timestamp circuitry 208 and time counter 210. Modified digital signal pattern data 113 from the deserializer 116 and the reference clock signal 118 are inputs to the event detector and timestamp circuitry 120, and an event pulse 212 and a precise timestamp 214 are outputs. As depicted, the reference clock signal 118 is connected to, and can be utilized by, the pattern predictor circuitry 202, the bitwise comparison logic circuitry 204, the priority encoder 206 and the time counter 210. It is noted that the reference clock 118 in FIG. 2B can be the same reference clock as used in FIG. 1 for the serializer circuitry 106, or the reference clock 118 used in FIG. 2B could be recovered from the bit stream received by the deserializer 116, if desired. It is again noted, as described herein, that each of these circuit blocks can be configured, if desired, to utilize this reference clock signal 118 or a clock signal based upon this reference clock signal 118 for timing of its operations. If a recovered clock 118 is used as the reference clock in FIG. 2B, the time counter 120 could still be configured to operate using the original reference clock 118 from the reference clock generator 102.

In operation, the modified digital signal pattern data 113 from the deserializer circuitry 116 is provided to the pattern predictor circuitry 202 and to the bitwise comparison logic circuitry 204. The pattern predictor 202 outputs a predicted digital signal pattern to the bitwise comparison logic circuitry 204, which then compares this predicted digital signal pattern to the modified digital signal pattern from the deserializer circuitry. When an event occurrence is detected from this comparison, an event pulse 212 is generated and output to the priority encoder 206, to the timestamp circuitry 208 and as an output to other circuitry. As described in more detail below, the priority encoder 206 receives XOR data 216 from the bitwise comparison logic, and the priority encoder 206 provides output signals to the timestamp circuitry 208. The timestamp circuitry 208 also receives data from the time counter 210 and generates a precise timestamp 214 associated with a detected event.

The pattern predictor circuitry 202 can be configured to process the received data from the deserializer and form a prediction of the original (non-inverted) bit sequence. A variety of techniques can be employed for the prediction, as desired. For example, if the information pattern is based on a simple counting scheme, then the predictor circuitry 202 can observe the data and produce a counting pattern synchronized to the received signal. If the information pattern is based on an alternating ones and zeroes pattern, then the predictor circuitry 202 may be as simple as selecting one of several fixed reference patterns. If the information pattern is based on a pseudo random bit sequence, the predictor circuitry 202 may be formed by Galois finite field arithmetic. Other prediction techniques can also be used, as desired, depending upon the nature of the digital signal pattern data generated by the pattern generator circuitry 104. In short, the pattern predictor circuitry 202 is configured to reliably predict what the original non-inverted signal pattern was for each reference clock cycle. It is noted that where the events being measured happen relatively infrequently with respect to the bits in the digital signal pattern, the pattern predictor circuitry 202 can take advantage of this time between events to synchronize and lock to the incoming signal. In addition, the measurement of events can be suppressed for an initial time period for the purpose of this synchronization and locking to the incoming signal, if desired.

It is further noted that the digital signal pattern can be directly provided to the measurement circuitry rather than having to be recovered or predicted so that the predicted or desired digital signal pattern is based on this directly received digital signal pattern. However, if this is done, then it is also desirable to determine the propagation delay associated with the modified bit stream being received and measured. For example, a known pattern with a sufficiently long period can be chosen such that the delay from the pattern generator to the time measurement circuitry can be determined. The propagation delay can then be determined, for example, by measuring an elapsed time between the generation of the start of the pattern and the reception of that pattern in the measurement circuitry. This propagation delay can then be used to align the digital signal pattern with the modified digital signal pattern.

The bitwise comparison logic 204 compares the predicted pattern and the data from the deserializer. The comparison in the embodiment depicted in FIG. 2B is performed by computing the exclusive-OR (XOR) of the predicted signal pattern data and the modified signal pattern data from the deserializer. If the result of the XOR operation is an all zeroes pattern, then the prediction matches the non-inverted pattern, and no event is determined to be present. If the result of the XOR operation is an all ones pattern, then the prediction matches the inverted pattern, and no event is determined to be present. If the result of the XOR operation is any other pattern, an event is detected, and an event pulse 212 is generated. Finally, if the result of the comparison changes from an all-zeroes pattern directly to an all-ones pattern (or vice versa), this also represents an event and causes an event pulse 212 to be generated. It is further noted that other comparison operations could also be performed by the comparison logic 204, if desired. For example, an XNOR logic operation could be utilized, if desired, or some other logic or bit comparison operation to identify changes between the predicted digital signal pattern data and the modified digital signal pattern data.

The result of the XOR operation is provided to the priority encoder 206. (It is noted that result of the XOR operation is sometimes referred to as a thermometer code.) The priority encoder 206 counts the number of consecutive one bits or zero bits in the XOR data word to determine the position of the event within the parallel data word. In the case where the XOR operation changes from an all zeroes pattern to zeroes followed by nonzero values, the priority encoder 206 counts the number of leading zeroes. In the case where the exclusive or operation changes from an all ones pattern to ones followed by zeroes (and possibly ones), the priority encoder 206 counts the number of leading ones. This indication of the number of consecutive zeroes or ones is then provided to the timestamp circuitry 208 as then used as an indication of the bit period where the event occurred.

The time counter circuitry 210 can be implemented as a conventional binary counter operated by the reference clock signal 118. For example, a binary counter that is 32-bits or 48-bits wide could be utilized depending on the desired range of time values for measurement. Other resolutions could also be utilized, as desired. The time counter circuitry 210 is utilized to keep a time count. For example, the time counter circuitry 210 can be configured to count up by one time unit at each rising edge of the reference clock signal 118. In one embodiment, the time counter 210 can be 48-bits wide and operate at about 156.25 MHz based upon a reference clock signal 118 operating at that rate. The value of the time counter 210 is then provided as an input to the timestamp circuitry 208.

The timestamp circuitry 208 receives the event pulse 212, an input from the priority encoder 206, and an input from the time counter circuitry 210. When the event pulse 212 indicates that an event has been detected, the timestamp circuitry 208 can be configured to take the output of the priority encoder 206 and the output of the time counter circuitry 210, perform bitwise concatenation, and then store the result in one or more registers as a precise timestamp 214 that can be output for use by other circuitry. This precise timestamp 214 represents the relative point within the modified signal pattern that the event was detected.

It is noted that the time counter circuitry 210 can be implemented as a free running counter that simply resets to zero when it gets to the end of its range. However, it is also possible to synchronize the time counter circuitry 210 to a time-of-day input signal, such as from a GPS (global positioning system) receiver or other time synchronization signal. Such an implementation allows precise timestamps from two or more locations to be meaningfully compared with each other because they would share a common time reference. Such an implementation also allows measurements to be made based on the difference between two precise timestamp values, such as one-way packet delay measurements. It is noted that for packet arrival or timestamp information, the ideal timestamp and error circuitry described with respect to FIG. 4 below may not be needed. With respect to some protocols, network packets will have explicit or implied time information within them relating to when they were sent. This packet time information can be used in combination with a timestamp generated from FIG. 2B to provide desired information relating to the transmission time of the packet or other desired timing related analysis.

FIG. 3 provides a diagram of an embodiment for example data associated with the detection and timestamping of events. As depicted, column 302 (Time Counter) represents an output of the time counter circuitry 210. Column 304 (Rx Data) represents modified digital signal pattern data output by the deserializer circuitry 116. Column 306 (Pred Data) represents the predicted digital signal pattern data produced by the pattern predictor circuitry 202. Column 308 (XOR data) represents the output signals 216 from the bitwise comparison logic circuitry 204 where an XOR operation is conducted on the Rx Data from column 304 and the Pred Data from column 306. Column 310 (Event Pulse) represents the event pulse output 212 from the bitwise comparison logic 216 that indicates that an event occurrence has been detected in the modified digital signal pattern based upon the comparison. Column 312 (Precise Timestamp) represents a timestamp output 214 that is generated and stored by the timestamp circuitry 208 upon receiving the event pulse signal 212 as indicating detection of an event within the modified signal pattern data. Column 314 (Ideal Timestamp) represents an ideal timestamp that would be expected if the events being detected were operating ideally. And column 316 (Time Error) represents a time error associated with a comparison of the precise timestamp information 214 with the ideal timestamp in column 314.

The data in the columns in FIG. 3 are now described in further detail with respect to the operation of the embodiments depicted herein. It is also noted that the embodiment of FIG. 3 provides one example of possible data patterns and different embodiments could be implemented as desired. For example, the time counter output in column 302 is depicted as producing a count that is one hexadecimal (or hex) digit wide (i.e., 4-bits per hex digit). A time counter could be utilized that has great or smaller resolution, as desired. For example, a 32-bit or 48-bit counter could be utilized, as indicated above. It is also noted that the RxData and PredData in columns 304 and 306, respectively, are only 4 hex digits wide (i.e., 16-bits or 4-bits per hex digit), and other data widths could be used, as desired, such as the 32-bit or 64-bit examples indicated above. It is further noted that that the "0x" designations used for values such as "0x3" are being used to represent that hexadecimal expressions are being used and not for another purpose. Other variations could also be implemented as desired. It is also noted that pipeline delays that would occur within the circuitry of FIG. 1A, 1C and FIG. 2B are not depicted in this example in order to more clearly illustrate the operation of the example embodiment.

In the embodiment depicted in FIG. 3, two events are shown to have been detected. One occurs in row 320 corresponding to time counter value 0x3 (i.e., binary value of 0011). The other occurs in the row 322 corresponding to time counter value 0x8 (i.e., binary value of 1000). It is noted that the binary values presented herein are separated into 4-bit groups so that their correspondence to the hex digits expressed in FIG. 3 can more easily be understood. As such, it is understood that the dash "-" that appears below between each 4 bits is being used to provide this separation and not for another purpose.

The data pattern shown in the RxData column 304 and the PredData column 306 corresponds to a type of counting pattern in which subsequent four-bit values count up (e.g., nibble counting). As depicted, four hex digits are being used to represent the values being generated and compared. For example, in row 324, the RxData is 0x0123 (i.e., binary value of 0000-0001-0010-0011), and the PredData is also 0x0123 (i.e., binary value of 0000-0001-0010-0011), where each digit represents a hex number. One advantage of this pattern is that it can be easily illustrated and implemented. However, other patterns could also be used, as indicated above. For example, an $X^{18}$ polynomial could be used to generate a pseudo-random bit sequence for the digital signal pattern output to the serializer circuitry 106 and predicted by the pattern predictor circuitry 202. As noted earlier, it is also possible to use fixed patterns as well. For example, a fixed pattern and a linear feedback shift register (LFSR) could be used to generate the digital signal pattern. Other patterns could also be implemented and utilized if desired.

The XOR-data column 308 and the EventPulse column 310 show the result of comparing the received data (RxData) and the predicted data (PredData) in columns 308 and 310, respectfully, using an XOR logic operation. As shown in the XOR-data column 308, the result of the XOR logic operation will be all zeroes (i.e., 0x0000 or binary value of 0000-0000-0000-0000) where the PredData in column 306 is the same as the RxData in column 304. Row 324 provides an example for this XOR-data result. The results of the XOR logic operation will be all ones except for the leading zeroes from the first hex digit comparison (i.e., 0xFFFF or binary value of 1111-1111-1111-1111) where the PredData in column 306 is the inverse of the RxData in column 304. Row 326 provides an example for this XOR-data results.

The EventPulse in column 310 will trigger or transition from zero to one (e.g., be a 1 in column 310) to show that an event has been detected in cases where the XOR-data in column 308 is neither 0x0000 nor 0xFFFF. In the example depicted, this occurs in row 320 and row 322.

For the first event in row 320, the XOR-data in column 308 is 0x03FF (i.e., binary value of 0000-0011-1111-1111). This XOR-data has resulted from an XOR logic operation using as inputs the RxData of 0xCE10 (i.e., binary value of 0000-1100-1110-0001-0000) in column 304 and the PredData of 0xCDEF (i.e., binary value of 0000-1100-1101-1110-1111) in column 306.

To generate the timestamp associated with the event in row 320, the time counter data in column 302 is concatenated with the location of the event with the XOR-data of column 308. As described above, the event occurrence location is indicated by the transition from zeroes to ones or from ones to zeroes in the XOR output data, which indicates the occurrence of the event within the modified digital signal pattern received in column 304 (RxData). Looking to row 320, the event occurrence is represented by the transition from zeroes to ones in the XOR-data. In particular, it is seen that the 03FF portion of the result of the XOR operation corresponds to six consecutive leading zeroes followed by ones (i.e., 0x03FF has binary value of 0000-0011-1111-1111). Because this event has occurred during the 0x3 clock cycle, the value 0x3 is concatenated with 0x6 to obtain a precise timestamp of 0x36.

For the second event in row 322, the XOR-data in column 308 is 0xFFE0 (i.e., binary value of 1111-1111-1110-0000).

This XOR-data has resulted from an XOR logic operation using as inputs the RxData of 0xFEC3 (i.e., binary value of 1111-1110-1100-0011) in column 304 and the PredData of 0x0123 (i.e., binary value of 0000-0001-0010-0011) in column 306.

To generate the timestamp associated with the event in row 322, the time counter data in column 302 is again concatenated with the location of the event with the XOR-data of column 308. Looking to row 322, the event occurrence is represented by the transition from ones to zeroes. In particular, it is seen that the FFE0 portion of the result of the XOR operation corresponds to eleven consecutive leading ones followed by zeroes (i.e., FFE0 has binary value of 1111-1111-1110-0000). Because this event has occurred during the 0x8 clock cycle, the value 0x8 is concatenated with 0xB (e.g., B is the hexadecimal equivalent of eleven) to obtain a precise timestamp of 0x8B.

Timestamps can also be used to determine time errors, if desired. An example of a time error determination is provided with respect to columns 314 and 316, and a further described with respect to FIG. 4 below. In the embodiment of FIG. 3, the timestamp 0x36 for the first event in row 320 is used as an initial value and as an ideal timestamp for the event that occurred in row 320. This is shown in Ideal Timestamp column 314 where 0x36 is included for row 320. Because this 0x36 value is being used as an initial condition, the value in the Time Error column 316 for row 320 is set at 0 or no time error. If the events being detected are assumed to ideally occur at equal intervals of the time counter 302, then the expected ideal timestamp for an event that would occur in row 322 would be 0x5 clock periods after the event in row 320. Because the precise timestamps have been concatenated with the event pulse timing, the ideal timestamp for an event in row 322 as compared to the initial event in row 320 is determined to be 0x86. This is because the previous ideal timestamp was 0x36, and the ideal clock period including the concatenation is 0x50 in hexadecimal (i.e., eighty bit periods in this example as there are assumed to be 16 high speed bit periods for each time counter clock period). As such, 0x86 is the ideal timestamp for the event occurring in row 322, as 0x36 plus 0x50 equals 0x86 in the representations being used in FIG. 3. For row 322, the time error value for the second event is calculated as the difference between the ideal timestamp in column 314 and the precise timestamp in column 312. Because the actual measured time from first event to second event is 0x8B-0x36=0x55 (i.e., 85 bit periods), and the ideal or expected time from first event to the second event is 0x50 (i.e., 80 bit periods), the time error is −5 bit periods (i.e., 0x86-0x8B=−0x05 in hex or −5 bit periods).

It is again noted that the timing resolution of the high speed bit period is typically determined by the rate at which the serializer circuitry 106 is transmitting the bit stream that represents the digital signal pattern and/or by the rate at which the deserializer circuitry 116 is receiving the bit stream. As described above, this bit stream can be based upon the data words output by the digital signal pattern generator 104. The serializer circuitry 106 and deserializer circuitry 116 then operate at a higher speed to serialize and deserialize these digital data words. The number of high speed bit periods between each event can then be determined and used to provide useful timing information relating to the events. As described herein, this timing information associated with detected events can be used in a wide variety of different ways, as desired, to provide time related information and analysis associated with the events.

FIG. 4 is a block diagram of an embodiment 400 for additional timestamp processing circuitry that can be utilized to provide additional information associated with the detection of events, such as time errors associated with events. The circuitry of embodiment 400, for example, could be used in producing the ideal timestamps and time errors discussed above with respect to FIG. 3.

In the embodiment 400 depicted, the timestamp processing circuitry embodiment 400 includes an ideal timestamp generator 402, a time error calculator 404, a minimum/maximum (min/max) value detector 406, a sampler 408 and a measurement interval timer 410. The embodiment 400, as an example, can provide as outputs a maximum error signal 424, a minimum error signal 426, time error samples 430, and missed measurement indications 428. The embodiment 400, as an example, can have as inputs the event pulse 212, the precise timestamp 214 and the reference clock signal 118. The reference clock signal 118 can be provided to all circuit blocks, if desired. It is again noted, as described herein, that each of these circuit blocks can be configured, if desired, to utilize this reference clock signal 118 or a clock signal based upon this reference clock signal 118 for timing of its operations. The embodiment 400 can also have as inputs a min/max reset signal 412, an ideal clock period 414, a resynchronization pulse signal 416 and a measurement time interval signal 418.

In the embodiment depicted, the ideal timestamp generator 402 receives the precise timestamp signal 214, the ideal clock period signal 414, the resynchronization pulse 416 and the event pulse 212, along with the reference clock signal 118, if desired. The ideal timestamp generator 402 processes these inputs and outputs an ideal timestamp 420 to the time error calculator 404. The time error calculator also receives the precise timestamp 214 and the event pulse 212, along with the reference clock signal 118, if desired. The time error calculator processes these inputs and outputs time error values 422 to the min/max detector 406 and the sampler 408.

The ideal timestamp generator 402 receives event pulses 212 and calculates ideal timestamp values 420 by adding the ideal clock period 414 to an accumulator within the ideal timestamp generator 402. The ideal clock period 414 represents the time expected between events. At each event pulse received, the accumulator is increased by the amount given by the ideal clock period 414. As such, the ideal timestamp 420 being provided to the time error calculator 404 will be increased by the ideal clock period 414 after each event pulse received on signal line 212. The time error calculator 404 then compares the ideal timestamp to the precise timestamp received on signal line 214 to generate the time error values 422. For example, at each event pulse, the time error calculator 404 can be configured to subtract the ideal timestamp from the precise timestamp to calculate a time error value. If it is desired to resynchronize the ideal timestamp generator 402 to measured values (such as at the beginning of a test interval), the ideal timestamp generator 402 loads the precise timestamp value 214 at the occurrence of the event pulse received on signal line 212 instead of performing the accumulation.

In addition to the time error values 422, the min/max detector 406 can also receive the event pulse signal 212, along with the reference clock signal 118, if desired. The min/max detector 406 is configured to store the maximum error value detected and the minimum error value detected. It is also noted that rather than storing both, the detector 406 could be configured to store only one of these parameters. Further, an average time error based upon the detected time error values could also be determined and stored, if desired. The min/max reset signal 412 is used to reset the min/max 406 so that it restarts its tracking of minimum and maximum error values.

Typically, this min/max reset signal 412 would be applied at the beginning of a measurement cycle, concurrent with the resetting of the ideal timestamp generator 402. The min/max detector 406 can then output a maximum error value 424 and/or a minimum error value 426 to other circuitry, as desired.

In operation, therefore, the min/max detector 406 compares the current time error value 422 from the time error calculator 404 with the largest and smallest time error values that have been observed. If the current time error value is greater than the maximum previously observed value, the current time error value is saved as the new maximum. Likewise, if the current time error value is less than the minimum previously observed value, the current time error value is saved as the new minimum. If it is desired to reset the minimum and maximum values, such as at the beginning of a test interval, the reset min/max signal 412 is asserted thereby causing the next time error value to be saved in both the minimum and maximum value registers. It is noted that determining the minimum and maximum time error values before or apart from the sampler 408 allows more accurate determination of the minimum and maximum time error values because the sampler 408 may be configured to discard a large proportion of the samples, as described further below. As such, the sampler 408 may not have sampled and stored the largest or smallest values. It is further noted that in certain circumstances, it may be desirable to also record the time at which the largest and smallest time error values occurred. If so, the event pulse 212 or other timestamp information can be used to provide this timing information.

Still further, it is noted that the min/max detector 406 could be reset during each measurement interval, so that for each measurement interval there would be a minimum and maximum value stored in addition to a sample of the time error value 422. As noted below, this measurement interval can be controlled using the control signal 409, and this control signal 409 can also be provided to the min/max detector 406, if desired, to facilitate the resetting of the min/max detector 406 for each measurement interval.

In addition to the time error values 422, the sampler 408 also receives the control signal 409 from the measurement interval timer 410, along with the reference clock signal 118, if desired. This control signal 409 can be used to determine when the sampler 408 samples or acquires time error values from the time error values 422. The sampler 408 can then output time error sample values 430 to other circuitry, as desired. As stated above, the control signal 409 can also be provided to the min/max detector 406, if desired. Further, all of the time error values 422 can be stored and output, if desired.

The measurement interval timer 410 receives the resynchronization pulse 416, the event pulse 212 and the measurement interval signal 418, along with the reference clock signal 118, if desired. The measurement interval timer 410 can be implemented as a counter that determines how often the calculated time error values 422 should be saved by the sampler 408, based on the given measurement interval value 418. The measurement interval timer 410 can generate the control signal 409 that is applied to sampler 408 and that is used by sampler 408 to determine when it samples or acquires the time error value 422. The sampler 408 can then store this sampled time error value. This use of control signal 409 allows measurements to be taken at regular intervals despite the fact that the signal being measured may not be regular. For example, it may be desired to sample the time error values 422 coming into sampler 408 at a rate of 100 times per second, in which case the measurement interval 418 could be set to 10 ms, and the measurement interval timer 410 would assert control signal 409 every 10 ms to cause the sampler circuitry to sample the time error value signal 422 every 10 ms. Because the time error calculator 404 may be producing time error values at a higher rate, the sampler 408 will only be sampling and storing certain time error values, and other non-sampled time error values will simply be ignored or discarded. Further, if desired, all of the time error values 422 can be sampled, stored and output.

The measurement interval timer 410 can also operate to detect a missed measurement by checking that at least one event pulse occurs during a measurement interval. In one embodiment, this determination can accomplished by setting a flag (e.g., one or more bits in a register) when the control signal 409 is asserted and then clearing this flag when an event pulse is observed on the event pulse signal 212. If the flag is still set when the control signal 409 is asserted the next time, this result indicates that an event pulse did not arrive during the measurement interval, and therefore a measurement was missed. One likely cause of this situation is where the signal being measured has been disconnected from the measurement apparatus. Missed measurements can also occur when the input signal being measured is lost, for example, when it is disconnected or the signal source is disabled. If the flag is no longer set when the control signal 409 is asserted the next time, a determination can be made that a measurement was not missed. The measurement interval timer 410 can output a missed measurement indication signal 428 to other circuitry, as desired.

It is noted that the embodiment 400 allows for the precise timestamps to be used to determine any of a wide variety of desired parameters. For example, with respect to periodic signals, various time errors can be determined, such as maximum time interval error (MTIE), time deviation (TDEV), and/or other desired time or error related parameters. MTIE is a parameter that typically represents the maximum time error that has occurred within a particular time interval. TDEV is a parameter that typically represents deviations in time associated with periodic events. As described above, time error can be considered to be the difference between the ideal time at which an event is expected to occur and the actual time at which it is measured to have occurred.

It is further noted that the ideal timestamp calculation can be configured to represent a greater precision than the actual measurement, if desired. For example, fractional clock periods can be used to represent the ideal clock period 414 in FIG. 4, and these fractional clock periods can be helpful in certain measurement circumstances. For example, fractional clock periods can simplify the event conditioning circuitry 126 for situations where a clock signal is being measured that does not have an integer relationship with respect to the high speed bit rate and where the event conditioning circuitry 126 is being used to prescale the clock signal so that an even number of high speed bit periods occur within each clock cycle for the clock being measured.

For example, consider a configuration to measure wander on a 2.048 MHz clock with a 5 GHz serial bit stream being used by the serializer circuitry. In this situation, the measured clock can be divided by 64 within the event conditioning circuit 126 to obtain a 32 kHz clock so that the ideal time between timestamps is exactly 156,250 high speed bits (i.e., 5 GHz divided by 32 kHz where 32 kHz is the largest common divisor of 2.048 MHz and 5 GHz). This is shown in TABLE 2 below for measurements associated with four different clock frequencies of interest that are commonly used by clock circuitry in various devices.

TABLE 2

Example Bit Periods

| Clk Freq to be Measured | Prescale Factor | Resulting Freq | Ideal clk period in 5 GHZ bit periods |
|---|---|---|---|
| 125 MHz | 1 | 125 MHz | 40 |
| 156.25 MHz | 1 | 156.25 MHz | 32 |
| 2.048 MHz | 64 | 32 kHz | 156,250 |
| 1.544 MHz | 193 | 8 kHz | 625,000 |

If instead, the ideal timestamp generator 402 is implemented with six "fractional" bits, so that time quantities of 3.125 picoseconds are representable (e.g., bit periods assumed to represent 1/(5 GHz*64) or 3.125 picoseconds), then the pre-division or prescaling of the 2.048 MHz clock by 64 would not be required. Instead, the calculation would be as follows: 5 GHz times 64 divided by 2.048 MHz. The result is still 156,250 bit periods, but now the ideal clock period 414 is measured in units of 3.125 ps. The calculation for the prescale factor to be applied in the event conditioning circuitry 126 then becomes determining the greatest common divisor of 320 GHz and the clock being measured, which in this case is 2.048 MHz, and the greatest common denominator is 2.048 MHz. This is shown in TABLE 3 below.

TABLE 3

Example Fractional Bit Clock Periods

| Clk Freq to be Measured | Prescale Factor | Resulting Freq | Ideal clk period in 320 GHZ bit periods |
|---|---|---|---|
| 125 MHz | 1 | 125 MHz | 2,560 |
| 156.25 MHz | 1 | 156.25 MHz | 2,048 |
| 2.048 MHz | 1 | 2.048 MHz | 156,250 |
| 1.544 MHz | 193 | 8 kHz | 40,00,000 |

The advantage of this fractional bit period enhancement is that time errors for fractionally related clock frequencies can be more easily calculated, and furthermore the time errors can be calculated more often. Advantageously, having more measurements gives more flexibility to perform statistical operations (such as average, min/max etc).

However, the above enhancement does not help in the case of 1.544 MHz because of the factor of 193, which is a relatively large prime number. In order to keep the prescale factor at 1 for the 1.544 MHz case, a further enhancement for the 1.544 MHz case above can be implemented. This enhancement uses two or more clock period values 414 in a predefined pattern within the ideal timestamp generator 402. A simple example of such a circuit is a dual modulus circuit which alternates between two different clock periods according to a relatively simple predefined sequence. A more complex example of such a circuit allows a predefined sequence of multiple values to be used. For example, the 1.544 MHz example could be accommodated for a prescale factor of 1 with two ideal clock bit period values: 207,254 and 207,253. Alternating between these two bit period values according to the following sequence as shown in TABLE 4 below will allow a measurement at every edge of a 1.544 MHz signal (read across first, then down).

TABLE 4

Example of Multiple Bit Clock Periods

| | | | | | | | |
|---|---|---|---|---|---|---|---|
| 207,254 (7x) | 207,253 | 207,254 (8x) | 207,253 | 207,254 (8x) | 207,253 | 207,254 (8x) | 207,253 |
| 207,254 (7x) | 207,253 | 207,254 (8x) | 207,253 | 207,254 (8x) | 207,253 | 207,254 (8x) | 207,253 |
| 207,254 (7x) | 207,253 | 207,254 (8x) | 207,253 | 207,254 (8x) | 207,253 | 207,254 (8x) | 207,253 |
| 207,254 (8x) | 207,253 | | | | | | |
| 207,254 (7x) | 207,253 | 207,254 (8x) | 207,253 | 207,254 (8x) | 207,253 | 207,254 (8x) | 207,253 |
| 207,254 (7x) | 207,253 | 207,254 (8x) | 207,253 | 207,254 (8x) | 207,253 | 207,254 (8x) | 207,253 |
| 207,254 (8x) | 207,253 | | | | | | |

The sequence above is a repeating pattern that keeps the predicted ideal position of the clock edge within +/−1.6 ps. It is also noted that the "7x" and "8x" indications in TABLE 4 above represent that these bit period values are repeated 7 times and 8 times, respectively, before moving on to the next bit period value in the table. This example illustrates that dual modulus techniques and/or other multiple ideal clock period techniques can be employed to further enhance the capability of the measurement circuitry.

FIG. 5A is a block diagram of an embodiment 500 using multiple offset timestamps to provide increased resolution. As depicted, the digital signal pattern bit stream 107 is provided to a plurality of different logic circuitry blocks 110A, 110B . . . 110C that each are used to provide a timestamp. For the initial timestamp, the bit stream 107 is provided to logic circuitry 110A that receives the event occurrence signal 123. As described above, the logic circuitry 110A operates to modify the bit stream and to produce the modified bit stream 115A upon receipt of a detected event as represented by the event occurrence signal 123. The modified bit stream 115A can then be passed through deserializer circuitry 116A and processed, as described above, to determine an initial timestamp having a resolution based upon the bit period of the bit stream 107.

To provide greater resolution than this bit period, the embodiment 500 utilizes one or more additional sets of logic circuitry 110B . . . 110C and related measurement paths to provide timestamps that are offset by fractions of the bit period from the initial timestamp generated by the first measurement path. The embodiment 500 achieves these offset timestamps by delaying the event occurrence signal 123 to the additional sets of logic circuitry 110B . . . 110C. These delays are represented by delay circuitry 502B . . . 502C. It is also noted that rather than introducing delays in the path of the event occurrence signal 123, delays could instead be introduced in the path of the digital signal pattern bit stream 107 so that each logic circuitry 110A, 110B . . . 110C will receive the bit stream at an offset time compared to each other. Further, delay could be introduced later in the different measurement paths before different deserializers and/or reference clock signals utilized by the deserializers could be offset from each other. In short, a variety of techniques could be utilized to provide timestamps that are offset in time as compared to each other as described herein.

Looking back to FIG. 5A, after receiving the event occurrence signal 123 through first delay circuitry 502B, the logic circuitry 110B can operate as described above to modify the bit stream and to produce a first (1st) delayed modified bit stream 115B upon receipt of a detected event as represented by the event occurrence signal 123. The first delayed modified bit stream 115B can then be passed through deserializer circuitry 116B and processed, as described above, to determine a first (1st) offset timestamp having a resolution based upon the bit period of the bit stream 107. Similarly, after receiving the event occurrence signal 123 through the Nth delay circuitry 502C, the logic circuitry 110C can operate as described above to modify the bit stream and to produce an Nth modified bit stream 115C upon receipt of a detected event as represented by the event occurrence signal 107. The Nth delayed modified bit stream 115C can then be passed through deserializer circuitry 116C and processed, as described above, to determine an Nth offset timestamp having a resolution based upon the bit period of the bit stream 107.

By selecting the number of desired additional logic circuits and the delays associated with those logic circuits and/or measurement paths, the resolution of the event measurement can be improved. For example, if two sets of logic circuitry are used, the first delay circuit 502B can be used to delay the event occurrence signal 107 to the logic circuitry 110B by half the bit period for the bit stream 107. In so doing, the resulting offset timestamps obtained from the first delayed modified bit stream 115B will be offset in time by half a bit period from the timestamps obtained from the modified bit stream 115A. Event detection processing circuitry can then be used to combine the timestamps and determine with greater precision the timing for the occurrence of the event. In particular, by offsetting the event occurrence signal 123 to the second set of logic circuitry 110B by half a bit period, the resolution of the resulting combined event measurements is doubled. This is so because the event timestamps from the first delayed modified bit stream 115B when combined with the timestamps from the modified bit stream 115A provide twice as many potential event timing locations that can be determined. Similarly, if more sets of logic circuitry and measurement paths are used, delays can be configured so as to evenly offset the bit periods by the number of measurement paths being used, thereby further improving the resolution and generating finer resolutions than would be available with a single measurement path.

As stated above, the delays 502B . . . 502C can be implemented using a variety of techniques. One technique that can be used is to increase the physical length of the wires or circuitry connecting the event occurrence signal 123 to the logic circuitry 110B . . . 110C as compared to logic circuitry 110A. For example, if connections on a printed circuit board are being used, signals often propagate on a printed circuit board at one inch in approximately 150 picoseconds. As such, the length of these PCB connections can be adjusted so as to delay the arrival of the event occurrence signal 123 to the logic circuitry 110B . . . 110C by the desired delayed amount as compared to the arrival time to the logic circuitry 110A.

It is also noted that embodiment 500 could also be configured so as to provide redundant event timing measurements. One or more of the additional sets of logic circuitry 110B . . . 110C could be implemented to match one or more other sets of logic circuitry so that the event occurrence signal 123 is configured to arrive at the same time to two or more sets of logic circuitry. For example, logic circuitry 110A and 110B could be configured so that they receive the event occurrence signal 123 at the same time. As such, redundant timestamps can be achieved. These redundant measurements can be compared to determine if accurate measurements are being received, or they could be combined and averaged to achieve an overall average timestamp based upon multiple redundant measurements. Further, other uses could be made of these redundant timestamp measurements, as desired.

It is further noted that the different time measurement branches can also be calibrated relative to each other, if desired. For example, a digital signal pattern can be transmitted that has a long enough length so that the time from one instance of the pattern to the next repetition of that pattern is longer than the round trip delay through the measurement circuitry. The event timing detection circuitry can determine the clock cycle and bit position of the start of the pattern for each of the time measurement paths, for example, by detecting the beginning of (or other event within) the pattern. Having made such a time measurement for each path, any fixed differences in phase between the measurement paths can be determined and subtracted from the measurements before combining or comparing. Further, a calibration can be done to measure the time difference between an event occurrence signal for which precise timing is already known and when it is measured by the system. This operation generates a static error that can be measured, and this static error can be subtracted from actual measurements to remove inherent delay associated with the deserializer and logic circuitry. This static error calibration can also be used with other embodiments described herein.

FIG. 5B is a signal diagram for offset detection of events using an embodiment according to FIG. 5A. As depicted, two measurement paths are being used. The first is represented by lines 522, 526 and 530. And the second is represented by lines 524, 528 and 532. In addition, lines 522 and 524 represent digital signal patterns and are the same in the embodiment of 520. Lines 526 and 528 represent modified digital signal patterns that have been modified based upon the occurrence of an event, as described above. Finally, lines 530 and 532 represent the result of a comparison of the digital signal pattern with the modified digital signal pattern using an XOR logic operation. The "0" and "1" indicators represent low and high logic levels, respectively, during a high speed bit period.

As depicted, the second measurement path signal lines 524, 528 and 532 are offset by half a bit period from the first measurement path signal lines 522, 526 and 530. As described with respect to FIG. 5A, this offset can be introduced by providing a delay in the receipt of the event occurrence signal by the second measurement path or by introducing a delay in the receipt of the bit stream by the second measurement path or by introducing some other comparable delay. This delay allows for the timestamps detected by the second measurement path to be offset by half a bit period from the timestamps detected by the first measurement path.

Detected events for embodiment 520 are assumed to cause a switch between inverted and non-inverted outputs, as described with respect to the embodiment of FIG. 2A above. With respect to the detection of an event, therefore, the modified digital signal pattern in line 526 switches from non-inverted to inverted at the bit period pointed to by element 540. As such, the XOR operation using line 522 and line 526 as inputs results in four 0s followed by three 1s. This indicates that the event occurred in the fifth bit period for the first measurement path as pointed to be element 544. Similarly, the modified digital signal pattern in line 528 switches form non-inverted to inverted at the bit period pointed to by element 542. As such, the XOR operation using line 522 and line 526 as inputs results in three 0s followed by four 1s. This indicates that the event occurred in the fourth bit period for the second measurement path as pointed to by element 546.

By comparing the bit periods 544 and 546 from the two measurement paths, it can be determined that the signal event occurred within the first half of the fifth bit period and the last half of fourth bit period. This is so because the signal event occurred within the fifth bit period for the first measurement path and the fourth bit period for the second measurement path. The overlap of the two bit periods, as shown by bracket 548, provides an indication of where the event occurred. And this indication is at twice the resolution due to the offset time measurements. It is also noted that it is expected that each measurement path would detect the same number of signal events and that the detection of these signal events could then be correlated to each other to determine the timing of the signal events with greater resolution. In the embodiment of FIG. 5B, a second signal event for each measurement path would be represented by a second inversion in the modified digital signal patterns 526 and 528 and a corresponding switch back to 0s in the XOR results 530 and 532.

It is also noted that calibration of the multiple measurement paths can be conducted, if desired, by generating a large number (e.g., many thousands) of statistically uncorrelated events and counting the proportion of time each event is measured in each fractional time bin. Ideally, the proportion of events in each bin will be equal. However, if they are unequal, the unequal proportion information can be used, if desired, to resolve slight differences in the delay or offset of each measurement path to compensate and remove bias that may be introduced by the circuitry involved.

FIG. 5C is a block diagram of an embodiment 550 for detecting events from multiple event occurrence input signals using multiple measurement paths. Embodiment 550 is similar to embodiment 500 of FIG. 5A except that different event occurrence signals 123A, 123B . . . 123C are being received by the different logic circuitry 110A, 110B . . . 110C and time measurement paths. In particular, logic circuitry 110A receives bit stream 107 and a first event occurrence signal 123A and outputs a first (1st) modified bit stream 115A that is used for a first (1st) timestamp. Logic circuitry 110B receives bit stream 107 and a second event occurrence signal 123B and outputs a second (2nd) modified bit stream 115B that can be used for a second (2nd) timestamp. Logic circuitry 110C receives bit stream 107 and an Nth event occurrence signal 123C and outputs an Nth modified bit stream 115C that can be used for an Nth timestamp. As such, embodiment 550 allows for detection and measurement of multiple signal events at the same time. It is also noted that the different event occurrence signals 123A, 123B . . . 123C can be provided from different event detection circuitry, if desired, and the number of event occurrence signals and measurement paths utilized can be adjusted, as desired.

FIG. 6A is a block diagram of an embodiment 600 for providing an event occurrence signal 123 directly to a deserializer 116 and then providing event timing data 122 from event timing detector circuitry 120. As depicted, in addition to receiving the event occurrence signal 123, the deserializer 116 also receives a reference clock signal 118. The deserializer 116 then outputs M-bit parallel data at the data rate of the reference clock 118. In operation, therefore, the deserializer 116 is essentially sampling the event occurrence signal 123 at a rate equal to M times the reference clock rate. Thus, if the reference clock 118 is 156.25 MHz and M is 32, then the sampling rate of the deserializer 116 would be at 5 GHz. If the reference clock 118 is 156.25 MHz and M is 64, then the sampling rate of the deserializer would be 10 GHz. Other selections can also be made for the reference clock rate and M, as desired. The M-bit parallel output 113 from the deserializer 118 is provided to event timing detector circuitry 120, which in turn provides event timing data 122 as an output. The event timing detector circuitry 120 can be configured to analyze the M-bit parallel output 113 from the deserializer 118 to determine when events occurred within the multi-bit parallel data output 113. For example, the event timing detector circuitry 120 can determine the location of logic level changes within the event occurrence signal 123 as an indication of the occurrence of events. In such an embodiment, these logic level changes can be used to the trigger event pulses 212 described above. These event pulses 212 can then be used to produce event timing data 122, such as timestamps and error values, as also described above.

It is noted that the deserializer 116 can be implemented using one or more FPGA (field programmable gate arrays) integrated circuits, such as those available from Altera Corporation. For example, Stratix IV GX transceivers available from Altera can be used to implement the deserializer 116, if desired, and can be placed in a lock-to-reference mode of operation to disable the CDR (clock/data recovery) circuitry within the transceiver. Further, deserializers that do not include CDRs can also be utilized with respect to FIG. 6A, if desired.

FIG. 6B is a block diagram of an embodiment 620 for using multiple deserializers 116A, 116B, 116B and 116D and related measurement paths to provide offset times stamps for an event occurrence signal 123. As described above with respect to FIGS. 5A and 5B, the use of multiple offset time measurements allows for greater resolution in determining the timing of a signal event. As depicted in FIG. 6B, delay circuitry 622, 624 and 626 are used to provide offset versions of the event occurrence signal to each deserializer. In particular, deserializer 116A receives the event occurrence signal 123. Deserializer 116B receives the event occurrence signal 123 through delay circuitry 622. Deserializer 116C receives the event occurrence signal 123 through delay circuitry 624. And deserializer 116D receives the event occurrence signal 123 through delay circuitry 626. The deserializers 116A, 116B, 116C and 116D also receive the reference clock signals 118A, 118B, 118C and 118D, which can be the same or different reference clock signals, as desired. The M-bit output 113A from deserializer 116A is provided to event timing detector circuitry 120A to produce first event timing data 122A. The M-bit output 113B from deserializer 116B is provided to event timing detector circuitry 120B to produce second event timing data 122B. The M-bit output 113C from deserializer 116C is provided to event timing detector circuitry 120C to produce third event timing data 122C. And the M-bit output 113D from deserializer 116D is provided to event timing detector circuitry 120D to produce fourth event timing data 122D. As described above with respect to FIGS. 5A and 5B, the use of offset timing measurements in FIG. 6B allows for greater resolution in determining the timing of a signal event.

It is noted that as depicted four deserializers 116A, 116B, 116C and 116D are used, but different numbers of deserializers and measurement paths could be used to provide a desired number of offset timestamps, as described above. As also described above, the delays provided by delay circuitry 622, 624 and 626 in FIG. 6B could be removed in order to provide duplicate simultaneous measurements associated with the event occurrence signal 123, if desired. It is further noted that the reference clock signals and the values for M used by each of the deserializers could also be different from each other. Further, if desired, the offset timing measurement could also be provided by introducing a delay in the path of the reference clock signal sent to each deserializer. As such, each deserializer would in effect sample the incoming event occurrence signal at an offset point in time. It is further noted that other delay mechanisms could also be utilized, if desired, to generate offset timestamps to enhance the resolution of the time measurements provided.

FIG. 6C is a block diagram of an embodiment 650 for using multiple deserializers 116A, 116B and 116C to detect events from multiple event occurrence input signals 123A, 123B and 123C. As described above with respect to FIG. 5C, multiple measurement paths can be used to provide timing data associated with multiple signal events at the same time. As depicted in FIG. 6C, deserializer 116A receives event occurrence signal 123A and reference clock signal 118A and outputs M-bit parallel data 113A that is used to produce first timing data associated with the first event occurrence signal 123A. Deserializer 116B receives event occurrence signal 123B and reference clock signal 118B and outputs M-bit parallel data 113B that is used to produce second timing data associated with the second event occurrence signal 123B. Deserializer 116C receives event occurrence signal 123C and reference clock signal 118C and outputs M-bit parallel data 113C that is used to produce third timing data associated with the third event occurrence signal 123C. The M-bit data 113A, 113B and 113C can be processed as described above, for example, to produce timestamps and error data, if desired. It is again noted that as depicted three deserializers 116A, 116B and 116C are used, but different numbers of deserializers and measurement paths could be used to provide a desired number of concurrent measurements, as described above. It is also noted that the reference clock signal 118A, 118B and 118C can be the same or different reference clock signals, as desired. It is further noted that the reference clock signals and the value for M used by each of the deserializers could be different from each other, if desired.

In addition to detecting precise timing associated with the occurrence of events using an event occurrence signal and the techniques described above, it is also desirable to generate digital signals having a desired amount of phase variation with respect to ideal or base timing associated with those digital signals. For example, it is often desirable to generate clock signals with desired amounts of phase variation in order to test the operation of systems that rely upon such clock signals to operate.

Systems and methods for generating desired phase variation, such as jitter and/or wander, in digital signals are described below with respect to FIGS. 7A-B and 8-12. In general, these systems and methods relate to techniques for generating digital signals, such as clock signals, with precisely and accurately controlled phase variations, while also allowing broad flexibility in the type of phase variations and digital signals that are generated.

With respect to the embodiments described here, techniques are disclosed that utilize high speed serializer circuitry to convert multi-bit digital signal patterns representing signals with desired phase variation to single-bit data streams representing a signal having the desired phase variation. The logic transitions from ones to zeroes and/or from zeroes to ones in the bit stream are controlled so as to generate a resulting signal with desired phase variations associated with those transitions. Advantageously, the techniques described herein can utilize, if desired, currently available serializer circuitry along with currently available digital logic circuitry and clock prescaler circuitry, to generate signals with a variety of types of phase changes (e.g., sinusoidal, arbitrary, fractional frequency offset and/or other desired phase changes). Advantageously, the generated signals have a precision based upon the bit period of the high speed bit stream signal rather than a slower rate of a reference clock signal. The generated signals can be used, for example, as clock signals for timing associated with products, systems and/or devices being tested, analyzed or measured.

Unlike many approaches to clock synthesis and generation that seek to reduce imperfections in the resulting signal, the systems and methods described herein provide techniques to precisely and accurately introduce desired phase impairments within a signal without requiring specialized mixed signals or analog circuits. Instead, the systems and methods described herein take advantage of serializer circuitry to generate a bit stream representing an output signal having desired phase variation that is based upon a multi-bit digital signal pattern.

One advantage of the techniques described herein is that they can utilize readily available digital logic components. Another advantage of these techniques is that they can be implemented as fully digital solutions, so that they do not depend upon analog techniques that require considerable calibration and recalibration efforts. A further advantage of these techniques are that they can utilize existing high performance serializer/deserializer components that have been designed to achieve high performance operation. An example of a serializer/deserializer component that can be used include FPGA-based transceivers, such as those available from Altera Corporation. For example, a Stratix IV GX transceiver available from Altera can be used to implement the serializer, if desired.

It is noted that phase variation in a digital signal is being used herein to represent the occurrence of a signal event that is offset in time from an ideal or base time of occurrence for that signal event. For example, with respect to a clock signal, the ideal signal event could be the rising and/or falling edges of the clock signal that ideally occur at precise time intervals with respect to each other. Phase variation in such a clock signal would represent signal events that occur at times different from the ideal precise intervals. For example, the rising edge of a clock signal could occur sooner or later than the ideal time of occurrence. As such, the clock signal includes phase variations as compared to the ideal or base clock signal. Further, phase variations can be intentionally introduced into digital signals to represent desired offsets from ideal or base signal occurrences. Intentionally generated phase variations in digital signals can be used for a variety of purposes including to test a system with a clock that has rising and/or falling edges that are offset from the ideal time by plus-or-minus a certain desired percent (e.g., plus-or-minus five percent). In this way, a system can be tested or operated with a clock signal having a desired amount of phase variation. And this phase variation can be adjusted to see how the system responds. A signal having desired phase variation can also be used for other purposes, as desired.

It is further again noted that phase variations are used herein to refer to different locations of signal events in time as compared to ideal or base signal event occurrences. For example, differences in edge transitions of a digital clock signal from ideal edge transitions that would occur with an ideal clock are referred to herein as phase variations. Jitter and wander are also terms that are used to represent phase variations in time of the significant instants of a digital signal as compared to an ideal signal. Variations having frequency content greater than 10 Hz are typically considered to be jitter, and variations having frequency less than 10 Hz are typically considered to be wander. Jitter is generally measured in unit intervals relative to an application specific bit rate, while wander is generally measured in units of time (e.g., microseconds). This use of the terms jitter and wander is consistent with the commonly accepted definition for these terms with respect to telecommunication networks. The term phase variation, as used herein, includes jitter and/or wander in digital signals as well as other phase variations that may be desired within a digital signal Precise signal generation techniques for generating signals with desired phase variations will now be described in further detail with respect to FIGS. 7A-B and 8-15.

While the embodiments described often assume that a clock signal is being generated, digital signals for other purposes can also be output by the systems and methods described herein. For example, in addition to a clock signal, the digital signal can be a control signal, a data signal and/or any other desired digital signal. Further, it is again noted that term phase variation is utilized herein to refer to and cover a wide variety of variations in the timing of signal events with respect to ideal signal events.

Figure 7A:
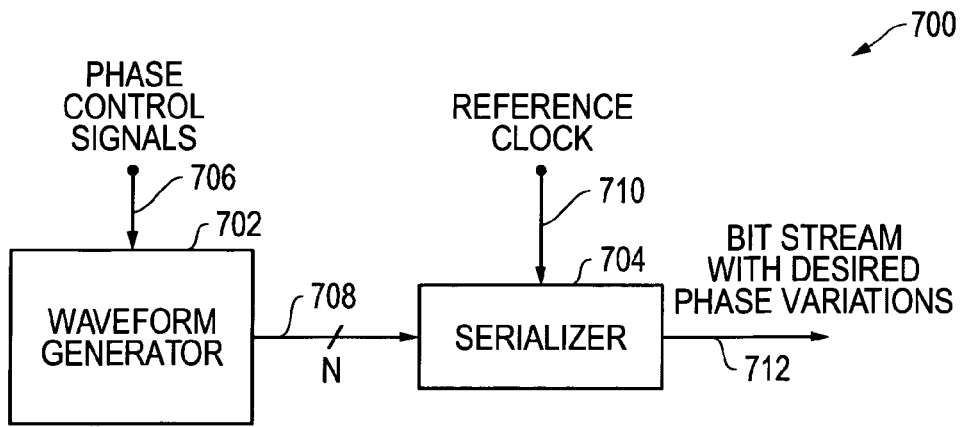
FIG. 7A is a block diagram of an embodiment for precise generation of phase variation in digital signals.

FIG. 7A is a block diagram of an embodiment 700 for precise generation of phase variations in digital signals. Waveform generator circuitry 702 receives phase control signals 706 and outputs a digital pattern as multi-bit parallel data 708, which is shown as N-bit parallel data words. This multi-bit parallel data represents a digital signal having a desired phase variation. The multi-bit parallel data 708 is then provided to serializer 704. Serializer 704 converts the multi-bit parallel data 708 to single-bit data that represents a desired bit stream 712. This bit stream 712 can then be used, as desired, to provide a digital signal having desired phase variation. The rate of the multi-bit parallel data 708 is slower than the rate of the single-bit data 712. As described above, the rate of the single-bit data 712 can be two times or more faster than the rate of the multi-bit parallel data 708, if desired, and preferably at least four times or more faster than the multi-bit date rates.

As depicted, the serializer 704 also receives a reference clock signal 710 which can be used by the serializer 704 to convert the N-bit parallel data words into single-bit data. Similar to the description above, the output rate ($CLK_{HIGH\_SPEED}$) of the single-bit data can be implemented such that it is equal to the width (N) of the parallel words times the rate ($CLK_{REF}$) of the reference clock signal 710, such that the following equation is satisfied: $CLK_{HIGH\_SPEED} = CLK_{REF} \times N$. As noted above, a reference clock signal ($CLK_{REF}$) can be generated in a variety of ways and can include a generated clock signal followed by dividers/multipliers that generate one or more reference clocks based upon the generated clock signal. Further, if desired, a plurality of reference clock signals can be generated and used with dividers/multipliers to provide reference clock signals. Further, it is noted that although not shown, the reference clock signals generated can be provided to other circuitry described in FIGS. 7A-B and 8-15 to facilitate its operation, as desired.

Figure 7B:
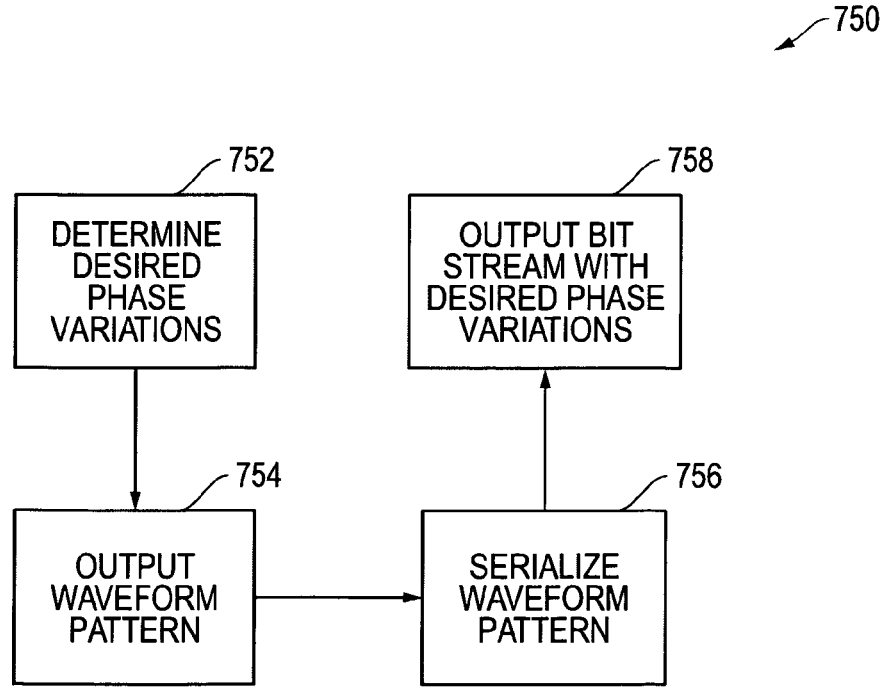
FIG. 7B is a process flow diagram of an embodiment for precise generation of phase variation in digital signals.

FIG. 7B is a process flow diagram of an embodiment 750 for precise generation of phase variation in digital signals. In block 752, desired phase variations are determined. The desired phase variations can be associated with actual data detected or collected by a system, as described below in more detail with respect to FIGS. 13-15, and/or can be associated with data simply generated for test or other purposes. In block 754, the digital signal with the desired phase variations is output as a digital waveform pattern in the form of multi-bit parallel data. In block 756, this waveform pattern is then serialized to form a single-bit data stream representing a digital signal having the desired phase variations. In block 758, the bit stream with the desired phase variations is output.

As stated above, this bit stream can then be used, as desired, to provide a digital signal having desired phase variations, such as desired jitter and/or wander. For example, the digital signal having desired phase variations can be used as a clock signal for testing or analyzing devices or systems.

In operation, the signal generation techniques depicted in FIG. 7A and FIG. 7B generate a pattern of information bits that mimics a digital signal and transmit this digital pattern at high speed utilizing a serializer to generate a high speed bit stream. As described further below, the high speed bit stream can be divided with a prescaler to create one or more digital signals, such as clock signals, having desired rates and desired phase variations. As also described in more detail below, the desired phase variation can be introduced into the resulting digital signal by deleting and/or inserting bits in a repeating pattern thereby moving logic transitions (e.g., rising edge transitions, falling edge transitions) as desired within the resulting digital signal.

One way to understand the technique described herein is to consider a simplified example. For example, consider an embodiment in which a high speed serializer 704 operating at 1 Gbps (1 billion bits per second) transmits the eight-bit pattern "00001111" in a repetitive manner. Because this sequence of bits repeats after every eight bits, the resulting digital signal is an ideal 50% duty cycle clock signal at 125 MHz, which is ⅛ of the serializer bit rate. If while repetitively transmitting this pattern, one instance of the pattern is modified by deleting one of the bits, the phase of the resulting clock is advanced by an amount of time equal to one bit from the serializer 704. For the 125 MHz clock signal example above, this one bit advance corresponds to one high speed bit period, which is about 1 nanosecond (i.e., 1/1 Gbps or about 1 ns) for this example. Conversely, if one instance of the pattern is modified by inserting one duplicate bit, the phase of the resulting clock signal is delayed (or retarded) by an amount of time equal to one bit from the serializer 704. Again, for the 125 MHz clock signal example above, this one bit delay corresponds to one high speed bit period, which is about 1 nanosecond (i.e., 1/1 Gbps or about 1 ns) for this example. Further, it is noted that multiple bits can be inserted or deleted at a time to delay or advance the transitions in the digital signal by larger amounts.

Consider, for example, a sequence of four such eight-bit cycles: "00001111-00001111-00001111-00001111." (It is noted that the "-" symbols are included to represent the separation between each 8-bit cycle.) If it were desired to advance a clock signal by one bit period in the third cycle, a "0" bit or a "1" bit could be deleted making the digital pattern the following: "00001111-00001111-00011110-00011110" or "00001111-00001111-00001110-00011110," where the remaining bits are shifted to the left to account for the deleted bit. And it is noted that the last "0" bit represents an additional bit that is shifted in to complete the 8-bit cycle. Similarly, if it were desired to delay a clock signal by one bit period in the third cycle, a "0" bit or a "1" bit could be added making the digital pattern the following: "00001111-00001111-00000111-10000111" or "00001111-00001111-10000111-10000111," where the remaining bits are shifted to the right to account for the added bit. And it is noted that the fourth "1" bit in the last 8-bit cycle has been shifted out.

It is noted that the techniques described herein can be used to generate any desired waveforms, such as clock signals (e.g., high speed clock signals), pulse signals (e.g., low speed pulses) and/or other desired signal types. As such, the waveform generated can be any desired sequence of zeroes and ones, and this sequence can be repeated periodically, if desired. Further, any desired phase variation can be included within these waveforms, as desired, by inserting and/or removing zeroes and ones within the generated waveform.

It is further noted that one example of a sequence having a relatively long period of time before being repeated is a sequence that represents a one-pulse-per-second signal (1PPS). A 1PPS signal has one precisely controlled rising edge every second. The duty cycle of a 1PPS signal (e.g., how long it remains, high) is not usually important and is often in the range of several hundred microseconds to several tens of milliseconds. If desired, therefore, the waveform pattern generated by waveform generator 708 can represent a 1PPS signal with desired phase variation, and the bit stream output by the serializer 704 can provide this 1PPS to other circuitry and/or devices.

It is also noted that higher speed serializers may also be used, such as a serializer 704 having a 10 Gbps or higher transmit speed. In addition, larger bit patterns can also be used, such as 16-bit and 32-bit patterns. For example, if a 16-bit pattern (e.g., 0000000011111111) were used and repeated along with a 10 Gbps serializer output, the resulting digital signal would be an ideal 50% duty cycle clock signal at 625 MHz, which is 1/16 of the serializer bit rate. And each bit inserted or removed from the generated waveform would correspond to a change of about 100 ps in phase variation (i.e., 1/10 Gbps or about 100 ps).

As described further below, if the resulting signal is desired to be at a lower frequency, a prescaler may be employed to divide the high speed bit stream output by the serializer 704 by an integer factor such as 2, 4, 8 or other value as is available and suitable to the desired application. Further, it may also be desirable to clean up the phase steps introduced by the techniques described herein. For example, a resulting clock signal can be post-processed through a cleanup PLL (phase locked loop) to provide a clean output clock signal. For example, if the bandwidth of the cleanup PLL is 1 MHz, then the phase steps can be spread out over approximately 1 us (depending on the PLL's loop dynamics).

Figure 8:
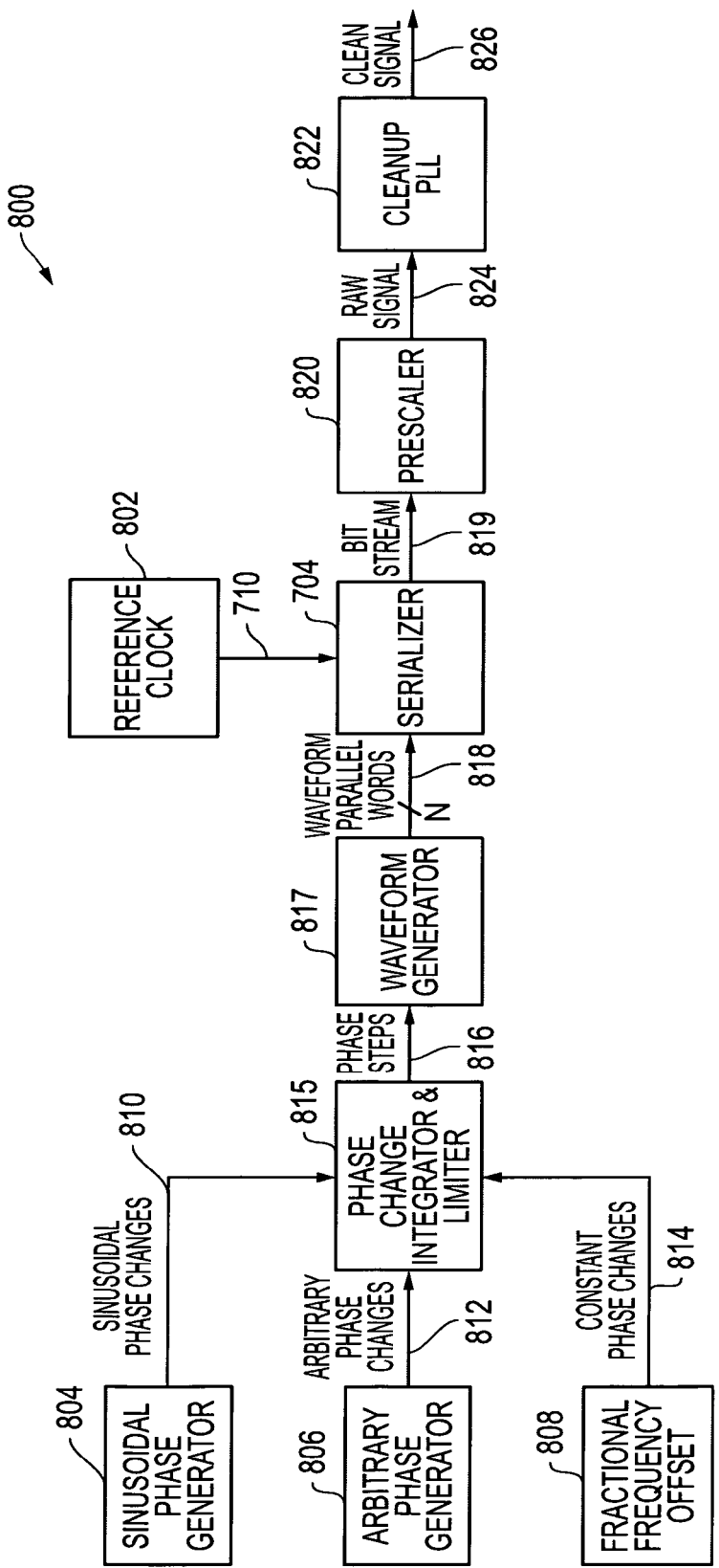
FIG. 8. is a more detailed block diagram of an embodiment for a system that provides precise generation of phase variation in digital signals.

FIG. 8. is a more detailed block diagram of an embodiment 800 for a system that provides precise generation of phase variation in digital signals. As with FIG. 7A, waveform generator circuitry 817 receives a phase control input, which can be phase steps 816, and outputs multi-bit (N-bit) waveform parallel data words 818. The serializer 704 receives the parallel data words 818 and outputs single-bit data in the form of the high speed bit stream 819. As described above, the serializer 704 can also receive a reference clock signal 710 from a reference clock generator 802 and can use this reference clock signal 710 to produce the high speed clock bit stream 819 from the input parallel data words 818 (e.g., $CLK_{HIGH\_SPEED}=CLK_{REF} \times N$). This high speed bit stream 819 represents a digital signal having a desired phase variation. This bit stream 819 can then be provided to a prescaler 820, if desired, that outputs a raw signal 824. This raw signal 824 can further be sent to a cleanup PLL (phase locked loop) 822, which in turn can output a clean signal 826. This clean signal 826 can then be used, as desired. It is again noted that a wide variety of digital signals can generated using the signal generation circuitry embodiment 800, including but not limited to digital clock signals having desired phase variations.

Also depicted in the embodiment 800 is circuitry that can be used to generate the desired waveform phase control signals, which can be in the form of phase steps 816. For the embodiment 800 depicted, phase change integrator and limiter circuitry 815 outputs the phase steps 816 to the high speed clock waveform generator 817. The phase change integrator and limiter circuitry 815 receives three change control inputs in the form of sinusoidal phase changes 810 from a sinusoidal phase generator 804, arbitrary phase changes 812 from an arbitrary phase generator 806 and constant phase change values 814 from a fractional frequency offset register 808. One or more of these control inputs can be used by the phase change integrator and limiter circuitry 815 to generate the phase control signals, and other control inputs could also be used and provided if desired.

In operation, the phase change integrator and limiter circuitry 815 adds together phase change requests from one or more sources. For the embodiment depicted, these sources include sinusoidal phase changes 810 from a configurable sinusoidal phase generator 804, arbitrary phase changes 812 from a configurable arbitrary phase generator 806 and constant phase change value 814 from a configurable fractional frequency offset register 808. The phase change integrator and limiter circuitry 815 then limits the maximum phase step allowed during a given time period, and can also introduce a configurable amount of phase dithering, if desired. The resulting phase steps 816 are provided to the high speed clock waveform generator 817 as phase control signals.

The high speed clock waveform generator 817 creates the patterns of ones and zeroes that mimics a clock signal or other desired digital signal. When phase step requests are provided on the phase steps signal 816, the phase of the clock waveform is advanced or delayed as described herein. When phase steps are not requested, the waveform generator 817 produces a pattern of ones and zeroes, which can be configured to represent a desired digital signal. The operation of the waveform generator 817 is further described in more detail with respect to FIG. 12 below.

The high speed clock waveform parallel words 818 are provided to the serializer 704. The serializer 704 receives the parallel words and converts them to a serial bit stream to form the high speed bit stream 819. The serializer 704 and other circuitry can be configured to operate under the control of a reference clock signal 710 generated by reference clock generator 802. In this way, the precise frequency of the resulting clock signal will be known relative to the reference clock signal 710. As also noted above, one or more reference clock signals can be generated and used by the system.

As described above, if desired, the high speed output bit stream 819 can be further processed with the prescaler 820 and the cleanup PLL 822. The prescaler 820 takes the high speed bit stream 819 and divides it to a lower frequency, as appropriate for the desired application. For example, if the high speed bit stream 819 represents a clock signal, the prescaler 820 can be used to generate lower speed clock signals to be output by the system. The output of the prescaler 820 is the raw signal 824. If desired, a cleanup PLL 822 can also be used. The cleanup PLL 822 receives the raw signal 824 and reduces the instantaneous phase steps by spreading them out across a longer time interval. For example, if the bandwidth of the cleanup PLL 822 is 1 MHz then the step response time will be approximately 1 microsecond, depending on the dynamics of the PLL's feedback loop (e.g., for a second order feedback loop this response time would be dependent upon the damping factor). It is further noted that the cleanup PLL 822 could be used without the prescaler 820, if desired, and the prescaler 820 could be used without the cleanup PLL 822, if desired.

As described further below, it is noted that dithering techniques can also be applied in producing phase control signals, such as phase steps 816. For example, as described in more detail below, sigma delta modulation dithering techniques can be applied by the phase change integrator and limiter circuitry 815 to the phase step control signals at a rate that is faster than the PLL 822 can track, thereby allowing a phase change resolution more precise than a single bit time or period from the serializer 704. The resulting dithered phase steps can then be provided to the waveform generator 817 as dithered phase steps 816.

Figure 9:
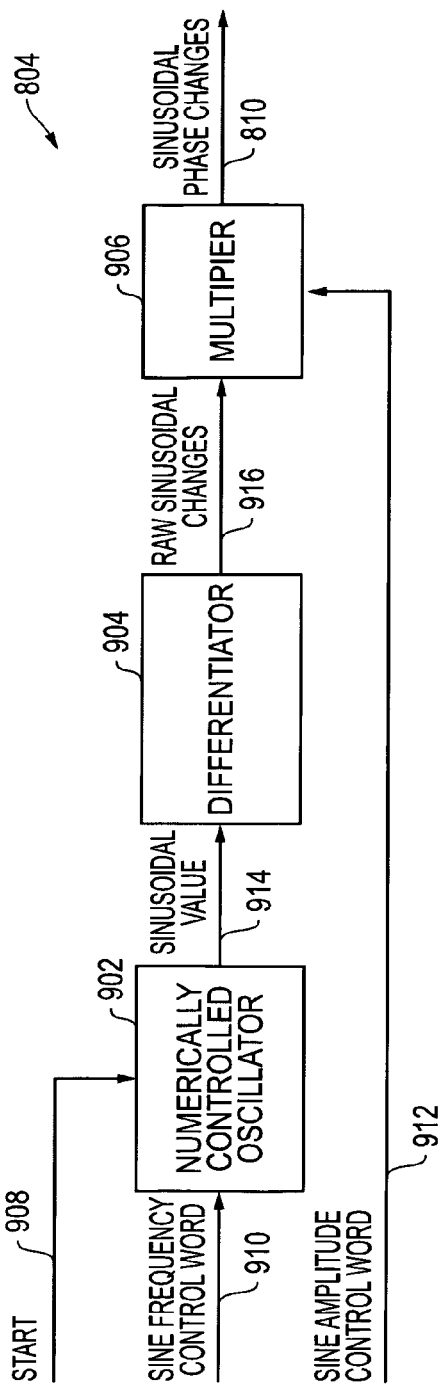
FIG. 9 is a block diagram of an embodiment for a sinusoidal phase generator.

FIG. 9 is a block diagram of an embodiment for the sinusoidal phase generator 804. For the embodiment depicted, a numerically controlled oscillator 902 receives a sine frequency control word 910 and a start signal 908 and outputs a sinusoidal value 914 to a differentiator 904. The differentiator 904 receives the sinusoidal value and outputs signals 916 representing raw sinusoidal changes. These raw sinusoidal changes 916 are then received by multiplier circuitry 906, which also receives a sine amplitude control word 912. The multiplier circuitry 906 then outputs the sinusoidal phase changes 810 as control input signals provided to the phase change integrator and limiter circuitry 815.]

In operation, a configured sine frequency control word 910 is input to the NCO 902. And the operation of the NCO 902 can be started or restarted by providing an appropriate indication on the start signal 908. It is further noted that a variety of known techniques can be used to implement the NCO 902, as desired. The output of the NCO 902 is a digital sinusoidal value 914. A sequence of sinusoidal values represents samples from a sine function. The frequency of the sine function is governed by the frequency control word 910. For the embodiment depicted, the magnitude of the sine function is fixed. The sinusoidal values 914 are provided to the differentiator 904, which calculates the difference between two consecutive samples from the NCO 902. These differences become the raw sinusoidal changes 916. Because the magnitude of the sine function is usually fixed, it is desired to have adjustable amplitude for the sinusoidal phase changes. The raw sinusoidal changes 916, if desired, can be multiplied with multiplier 906 by a configurable sine amplitude control word 912. The larger the value of the sine amplitude control word 912, the greater is the amplitude of the resulting sinusoidal signal. If the value of the sine amplitude control word 912 is zero, then sinusoidal phase changes are suppressed. The output of the multiplier 906 can provide the sinusoidal phase changes 810 that are used as control input signals provided to the phase change integrator and limiter circuitry 815.

It is noted that the use of the differentiator 904 provides the advantage that amplitude and phase can be independently adjusted. Because the sine function from the NCO 902 is a function of the product of both time and frequency (e.g., $f(x)=\sin(f*t)$), by the chain rule for differentiation, the derivative of the NCO 902 output with respect to time is $f'(t)=f*\cos(f*t)$. This output, therefore, is not the same as what the NCO 902 would produce if outputting a cosine function, namely $\cos(f*t)$. Thus, without the differentiator, changing the sine frequency control word 910 to produce a cosine function would require a corresponding multiplication in the sine amplitude control word 912 to maintain the same signal amplitude. By contrast, the implementation depicted in FIG. 9 that includes the differentiator 904 has the advantage that the amplitude and phase can be adjusted independently to achieve a desired level of phase changes. Furthermore, the differentiator 904 can be implemented using a subtractor and a word register, the size of which is relatively inconsequential compared to the rest of the circuitry. As such, the use of the differentiator 904 provides an advantageous and cost-effective technique.

Figure 10:
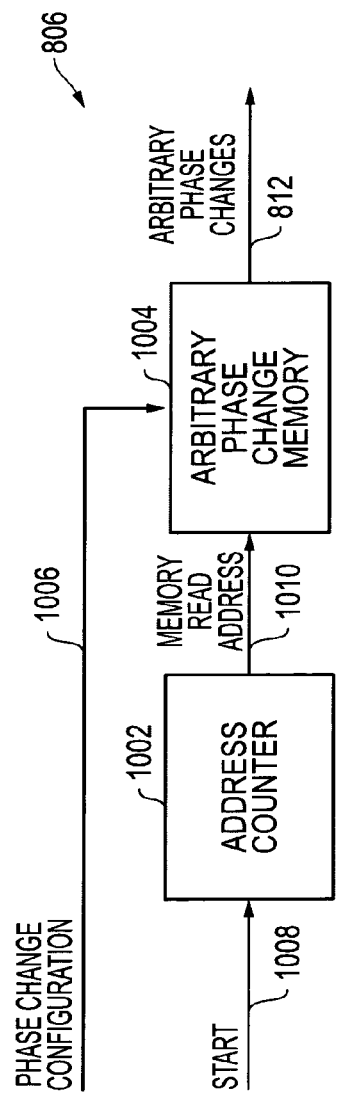
FIG. 10 is a block diagram of an embodiment for an arbitrary phase generator.

FIG. 10 is a block diagram of an embodiment for the arbitrary phase generator 806. For the embodiment depicted, an address counter 1002 receives a start signal 1008 and outputs a memory read address 1010 to arbitrary phase change memory circuitry 1004. The arbitrary phase change memory circuitry 1004 can receive and store phase change configuration information 1006 that represents arbitrary phase changes for the clock signal to be output. The memory read address 1010 from address counter 1002 operates to select a phase change configuration from the phase change configuration information stored within the arbitrary phase change memory circuitry 1004. The arbitrary phase change memory 1004 then outputs the selected information as arbitrary phase changes 812 that are used as control input signals provided to the phase change integrator and limiter circuitry 815.

In operation, the arbitrary phase generator 806 generates a sequence of arbitrary phase change configuration values 812 that represent a desired phase sequence. The values are configured into an arbitrary phase change memory 1004, for example, by transferring values from a pre-configured file and/or data stored on a computing system into the memory 1004. When it is desired to start creating the sequence of arbitrary phase changes, a start pulse 1008 can be provided to the address counter 1002. The address counter 1002 then generates address values 1010 to the arbitrary phase change memory 1004 so that the desired phase change sequence is read from the memory and provided as arbitrary phase change values 812 to the phase change integrator and limiter circuitry 815.

Figure 11:
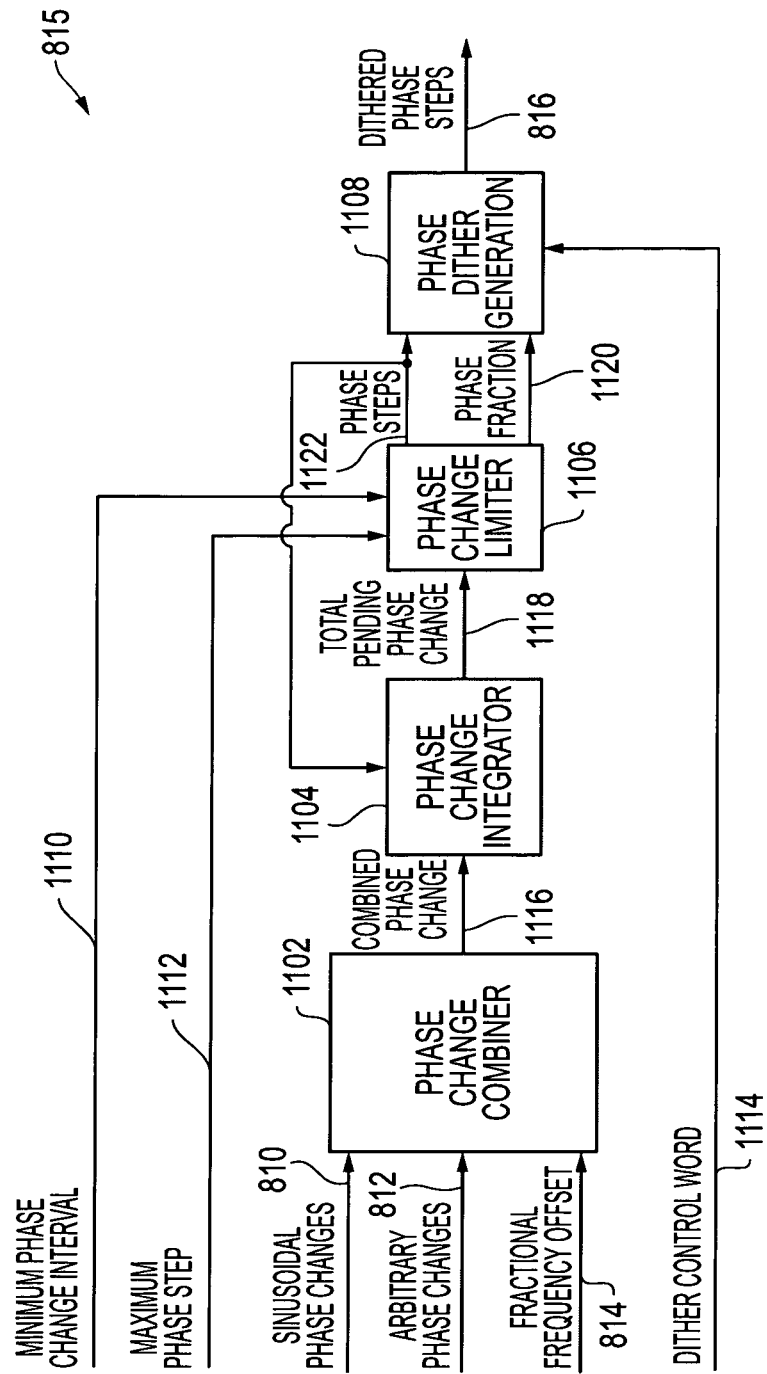
FIG. 11 is a block diagram of an embodiment for phase change integrator and limiter circuitry.

FIG. 11 is a block diagram of an embodiment for phase change integrator and limiter circuitry 815. Phase change combiner circuitry 1102 receives the sinusoidal phase changes 810, the arbitrary phase changes 812 and the fractional phase changes 814 and outputs a combined phase change signal 1116 to phase change integrator circuitry 1104. A signal 1118 representing a total pending phase change is then provided to phase change limiter circuitry 1106. The phase change limiter circuitry 1106 also receives a minimum phase change interval control signal 1110 and a maximum phase step control signal 1112. The phase change limiter circuitry 1106 then outputs a phase fraction signal 1120 and a phase steps signal 1122 to the phase dither generation circuitry 1108. The phase steps signal 1122 is also provided back to the phase change integrator 1104. The phase dither generation circuitry 1108 receives the phase steps signal 1122 and the phase fraction signal 1120, as well as a dither control word 1114, and outputs phase steps 816 that are used as phase control input signals to the high speed clock waveform generator circuitry 815.

In operation, the phase change combiner 1102 adds the desired phase changes 810, 812 and 814 from the sinusoidal phase change generator 804, the arbitrary phase change generator 806 and the fractional frequency offset register 808, respectively. The first two phase change generators have already been described in more detail above. The fractional frequency offset 814 represents a value that can be introduced to create a constantly increasing or decreasing phase of the resulting signal so that it can be offset from the nominal value by a small fraction. If desired, this offset can be applied in parts-per-million or less. The bit width of the values representing fractional phase governs the fineness of this setting. For example, a 32-bit value would provide better than one-part-per-billion, which is sufficient for many needs. Higher precision values could also be used, if desired.

The result of the phase change combiner 1102 is the sum of the three input values, and this sum is output as the combined phase change value 1116. The phase change integrator 1104 accumulates the combined phase change values to compute a total pending phase change value 1118, which is provided to the phase change limiter 1106. The phase change limiter 1106 enforces limits on the allowable phase changes to ensure that they stay within the desired severity.

The maximum phase step value 1112, which is received by the phase change limiter 1106, limits the maximum phase step allowed during a single parallel word. The maximum phase step value 1112 can be implemented as a small integer in the range 1 to 8, if desired. For example, with a setting of 2 for the maximum phase step value 1112, the range of possible phase steps includes −2, −1, 0, +1 and +2. This value corresponds to the maximum number of bits that may be inserted or deleted from a single instance of the high speed clock pattern.

The minimum phase change interval value 1110, which is received by the phase change limiter 1106, limits the rate at which phase changes are allowed. For example, a minimum phase change limit of 100 would require one hundred clock cycles to elapse between nonzero phase step values. As such, this minimum phase change limit can be set, as desired, to determine the number of cycles between phase step changes. A value of zero for the minimum phase change limit value 110 would mean that phase step changes could occur in each clock cycle.

It is further noted that the phase change limiter 1106 can be configured to provide different and/or additional phase change limitations, as desired, depending upon limitations desired by the user and/or required by the particular environment within which the generated phase changes are being used. For example, the phase change limiter 1106 can be configured to implement MTIE (Maximum Time Interval Error) masks desired by a user. Determining the MTIE for a signal is often used to check phase changes of a signal over time to ensure that the signal does not exceed specified limits. MTIE masks often allow small phase variations over short time intervals and larger phase variations over longer time intervals. For example, an MTIE mask might allow a phase change of 100 ns over a 1 minute interval, further relax the requirement to allow a phase change of 1 us (i.e., 10 times larger) over a 1 hour interval, and further relax the requirement to a phase change of 10 us over an entire day. The phase change limiter 1106 can be configured to implement desired MTIE masks (e.g., one that is predefined according to a standard, a custom mask that a user defines, and/or some other desired MITE mask). The phase change limiter 1106 would then ensure that phase step changes would remain within the limits specified by the MTIE mask. The minimum phase change interval value 1110 depicted in FIG. 11 could be used to provide one point on an MTIE mask, and other parameters or values could be provided to the phase change limiter 1106, as desired, to control other MTIE mask parameters desired by the user. In short, the input parameters to the phase change limiter 1106 could be selected and configured to achieve any desired phase change limitations desired for a particular application and/or by a particular user.

The outputs of the phase change limiter 1106 are the phase steps value 1122 and the phase fraction value 1120. The phase steps value 1122 is fed back to the phase change integrator 1104, where it is subtracted from the summation. In operation, the phase change integrator 1104 in effect serves as a list for phase changes that are pending to be done, and when the phase change limiter 1106 allows a phase change, it is subtracted from the list.

It is noted that phase fraction is the fraction of a high speed bit time that has built up in the phase change integrator 1104. The fractional portion of an accumulator within the phase change integrator 1104 keeps track of the fractional bit phase changes so that whole bit phase changes can be introduced at correct times in the high speed serial signal. For example, if during each reference clock cycle there are 2 millionths of a bit of fractional phase added, there is a fractional frequency offset of 2-parts-per-million (ppm). The fractional portion of the accumulator within the phase change integrator 1104 keeps track of the fractional phase as it builds up and once a whole bit time has been accumulated (e.g., 500,000 clock cycles for a 2 ppm fractional offset for a bit time), a whole high speed bit phase change is generated and subtracted from the phase change integrator 1104.

It is noted that the total pending phase change value 1118 also includes both a phase steps value and a phase fraction value, which are limited by the phase change limiter 1106, to produce the phase steps value 1122 and phase fraction value 1120. It is further noted that if the phase change limiter 1106 were removed from the system, the total pending phase change value 1118 can be provided directly to the phase dither generation circuitry 1108. Further, if dithering were not desired, the phase fraction value could be removed, and the total pending phase change value 1118 including a phase steps value, or the phase steps value 1122 if phase change limiter 1106 were used, can be provided as the phase steps 816 that are used as phase control input signals to the waveform generator circuitry 815.

As depicted, the phase dither generation circuitry 1108 receives the phase steps value 1122 and the phase fraction value 1120 and adds dithering. Dithering can be implemented, for example, through the use of a pseudo-random bit sequence added to the phase steps value 1122 and the phase fraction value 1120 according to a dither control word 1114. A variety of techniques (e.g., simple PRBS (pseudo-random bit sequence) or higher order sigma-delta modulation) may be used to shape the frequency of the dither noise so that the fineness of the resulting phase steps from the cleanup PLL 822 is less than a single high speed bit time. The dither control word 1114 adjusts the bit position (e.g., by shifting) of the phase dither generation circuitry 1108 within the factional bits of the addition.

It is noted that at any given time, the instantaneous output phase is a value that is a multiple of the high speed bit clock. In other words, the phase is quantized to a multiple of the high speed bit clock. However, by rapidly alternating between two adjacent phase values, and by varying the proportion of time spent at each value, it is possible to achieve finer phase resolution than a single high speed bit time. The phase dither generation circuitry 1108 allows for this finer phase resolution to be achieved.

Without the phase dither generation circuitry 1108, phase changes would only occur when a whole high speed bit has been added to or subtracted from the phase change accumulator or combiner 1102, and the system would be limited to generating phase steps no smaller than a high speed bit time. However, with the phase dither generation circuitry 1108, a finer resolution can be achieved. For example, if the phase fraction value 1120 represents exactly half of a high speed bit time, this resolution can be achieved by rapidly switching between two adjacent phase values. For this one-half bit time example, the phase dither generation circuitry 1108 can be configured to generate phase steps that alternate rapidly and equally between two phase values representing two adjacent high speed bit times. As long as the bandwidth of the cleanup PLL 822 is lower than the rate of alternation from the phase dither generator 1108, the cleanup PLL is unable to track the phase alternations and produces an output that is the average of the two input phases. As such, the resulting signal has a phase resolution that is finer than the single high speed bit time.

One implementation for the phase dither generation circuitry 1108 is to use a pseudo random number generator (PRNG) (e.g., with a linear feedback shift register) with a relatively large number of bits (e.g., 24 bits) and add a sign extended portion of the bits from the PRNG to a portion of the bits from the phase step value 1122 and phase fraction value 1120. The dither control word 1114 can be used to control how many bits from the PRNG are added to the phase step and phase fraction values to form the dithered phase steps 816. If the dither control word 1114 is zero, no bits from the PRNG are added to the phase steps and phase fraction and no dither is introduced. If the dither control word 1114 is one (1), then one bit from the PRNG is sign extended and represents plus or minus half of a high speed bit time that is added to the phase fraction. For the one-half bit time example described in the previous paragraph, the phase alternates equally between two phase values, but the pattern of alternation is not periodic because it is controlled by a PRNG and therefore the spectral content of the "dither" is spread across a wide range of frequencies making it easy to filter in the cleanup PLL 822.

It is further noted that dithering techniques could also be used that are similar to techniques used for digital to analog conversion in audio and other similar systems. In such systems, digital to analog converters can generate a limited set of output values; however, by rapidly alternating between adjacent values, and by varying the proportion of time spent at each value, much higher resolution can be achieved in the digital to analog conversion. Similar techniques can be employed in the phase dither generation circuitry 1108, if desired, to achieve finer phase resolution.

Figure 12:
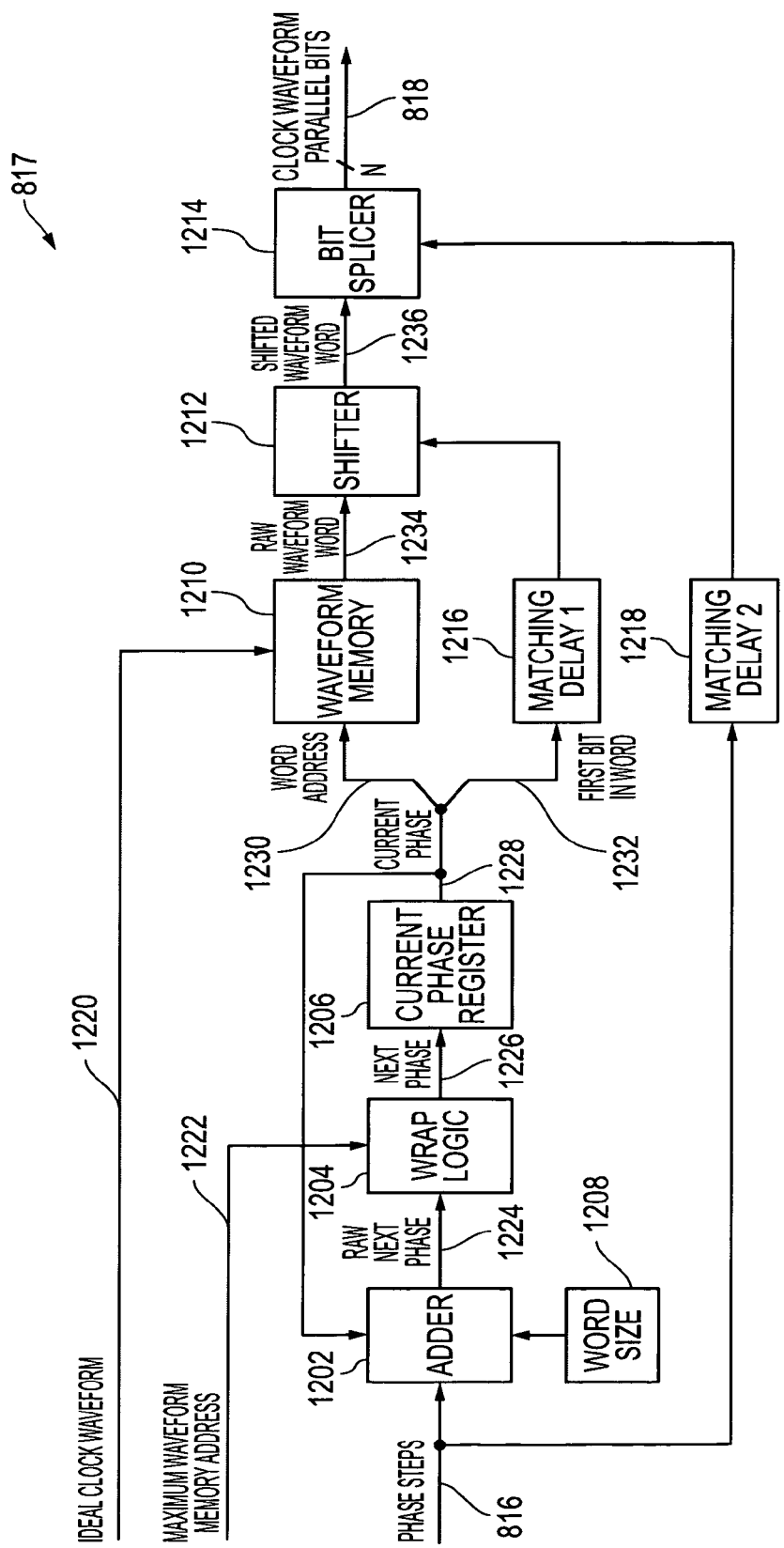
FIG. 12 is a block diagram of an embodiment for waveform generator circuitry.

FIG. 12 is a block diagram of an embodiment for waveform generator circuitry 817. For the embodiment depicted, an adder 1202 receives phase steps 816, which can be dithered as described above, as well as a word size value 1208 and an indication of the current phase 1228. The adder 1202 combines these values and outputs a signal 1224 representing a raw version of the next phase value. Wrap logic 1204 receives the raw next phase value 1224 and a maximum waveform memory address 1222 and outputs the next phase value 1226 to the current phase register 1206. The current phase register 1206 then stores the next phase value 1226 and outputs the previously stored value as the current phase value 1228. A first portion of the current phase value 1228 is then provided to the waveform memory circuitry 1210 as a word address 1230, and a second portion of the current phase value 1228 is provided to a first matching delay circuit (DELAY 1) 1216 as the first bit 1232 in the word to be output. The waveform memory circuitry 1210 also receives an ideal or base clock waveform 1220 and outputs a raw waveform word 1234 to shifter 1212 based upon the stored ideal clock waveform 1220. Shifter 1212 also receives the output of the first matching delay circuit (DELAY 1) 1216, which determines the first bit 1232 within the raw waveform word 1234 to be output within the shifted waveform word 1236, and the shifter 1212 then shifts the raw waveform word 1234 and outputs a shifted waveform word 1236 to bit splicer 1214. Bit splicer 1214 also receives the phase steps value 816 passed through a second matching delay circuit (DELAY 2) 1218, which is configured to match the delay of intervening circuitry between the bit splicer 1214 and the original phase steps value 816 input to the waveform generator circuitry 817. Bit splicer 1214 then outputs the multi-bit (N-bit) parallel data words in the form of the high speed clock waveform parallel bits 818. It is noted that the bit splicer 1214 can be configured to use the reference clock signal 710 to output the waveform parallel bits (N-bit) 818 at the rate of the reference clock signal 710, if desired.

In operation, the phase steps value 816 from the phase change integrator and limiter circuitry 815 are input to a binary adder 1202. The other inputs to the binary adder 1202 are the current phase value 1228 and a constant representing the nominal word size 1208. The result of this addition is the raw next phase value 1224, which is provided to the wrap logic circuitry 1204. The wrap logic circuitry 1204 also receives the maximum waveform memory address 1222 and ensures that the next phase value 1226 remains within the range of addresses that hold the configured ideal or base clock waveform 1220 in the waveform memory 1210. The current phase register 1206 receives the next phase value 1226 and stores it, and the previously stored next phase value then becomes the current phase value 1228. The current phase value 1228 is fed back to the adder 1202, and it is also split into two bit fields with an upper bit field 1230 being provided to waveform memory 1210 and a lower bit field 1232 being provided to matching delay circuitry (DELAY 1) 1216. The upper bit field 1230 identifies a word address and is provided to the read address port on the waveform memory 1210. The lower bit field 1232 determines the first bit to be output within the waveform word identified by the word address and is provided to the shifter 1212 through the first matching delay circuitry (DELAY 1) 1216. It is further noted that the first matching delay circuitry (DELAY 1) 1216 is configured to introduce delay equal to the delay of the waveform memory 1210.

The waveform memory 1210 holds the ideal or base clock waveform pattern and can be configured, as desired. For example, the waveform memory 1210 can be configured by storing waveform information provided as a pattern of ones and zeroes provided as the ideal clock waveform 1220. The size of the waveform memory 1210 can be configured, if desired, using the least common multiple (LCM) of the ideal or base clock waveform pattern (in bits) and the parallel word size for the serializer 704 divided by the parallel word size. For example, if the serializer 704 width is 16 bits and the ideal or base clock pattern has length of 12 bits (e.g., "000000111111") then the number of words provided in the waveform memory 1210 can be set to three, which can be calculated as LCM (12,16)/16=48/16=3.

Furthermore, if desired, the memory 1210 can be organized to facilitate the generation of digital signals with desired phase variation by making the words more than twice as wide as the parallel words provided to the serializer 704. For example, the width of the words can be implemented as twice the parallel word width for the serializer 704 plus one less than the maximum phase step change (in bits) allowed in a single word. As such, if the parallel word width is 16, and the maximum phase step is two bits, then the word width can be set to 33 bits (e.g., (2×16)+(2−1)=33).

The use of waveform word widths for the memory 1210 that are wider than the parallel waveform words (N-bit) 818 provided to the serializer 704 allows for more flexibility in the system. As described herein, to change the phase of the output clock signal, a whole bit is inserted into or removed from the "ideal" or base clock signal that is represented by the high speed bit stream output by the serializer 704. Because of this insertion and removal of bits within an N-bit clock signal, for example, it is useful to generate more than N-bits during one reference clock cycle in the raw waveform word 1234. For the embodiment shown in FIG. 12, when the phase change requires inserting a bit into the "ideal" clock signal, this insertion is accomplished by inserting a duplicated bit and then by adjusting the shifter 1212 position to an earlier position. This adjustment to shifter 1212 is done so that when a bit is repeated, not all of the bits are used. As such, shifter 1212 is adjusted to start the next cycle at the bit in the waveform that was not used during the previous cycle. In other words, during the reference clock cycle where a bit is inserted, only N−1 bits of the raw waveform word 1234 are used, and to achieve continuity, the next word is then started from the Nth bit in the waveform that was not used during the previous cycle. When the phase change requires deleting a bit from the "ideal" clock signal, this removal is accomplished by deleting a bit from the raw waveform word 1234. However, this mean that N+1 bits of the raw waveform word 1234 are used during a reference clock cycle. As such, during the next reference clock cycle, shifter 1212 is adjusted to start the next cycle after the last bit for the ideal clock waveform that was transmitted.

The example above utilizes stored waveform words that are wider than twice the serializer input word, although different word widths could also be used, if desired. Assuming the waveform memory 1210 is at least twice as wide as the serializer input word, the shifter 1212 will essentially have available at its input all of the "ideal" clock waveform bits for two consecutive reference clock cycles. These additional waveform bits allow the shifter 1212 significant freedom in inserting bits into and removing bits from the waveform.

Where it is desired to allow phase changes of more than one bit at a time per clock cycle, more than one bit will be repeated in or deleted from the "ideal" clock waveform in the clock cycle. In this case, for the embodiment depicted in FIG. 12, the shifter 1212 is used to perform the first bit shift, and bit splicer 1214 is used to perform the remaining bit shifts. For example, if phase changes equal to two high speed bit times are allowed within a single reference clock period, then the bit splicer 1214 is used to repeat or delete an additional bit in the center of the shifted waveform word whenever a phase change of +2 or −2 is required (e.g., one bit is accomplished by changing the shifter settings, and another bit is accomplished in the bit splicer).

Further, if larger phase changes are desired at a time per clock cycle, then additional width in the waveform word is desirable. As indicated above, the width of the words can be implemented as twice the parallel word width for the serializer 704 plus one less than the maximum phase step change (in bits) allowed in a single word. As such, if the parallel word width is 16 bits, and the maximum phase step is two bits, then the word width can be set to 33 bits (e.g., (2×16)+(2−1)=33). In another example embodiment, the parallel word width can be 64 bits, and the maximum phase steps can be 17 bits. The raw waveform word then becomes 128 bits plus 16 extra bits for a total of 144 bits (e.g., (2×64)+(17−1)=144) to allow for up to 17 bits to be inserted or deleted. Other configurations and word widths could also be used, as desired, depending upon the signals and phase variations desired to be generated.

Considering further the example above having a base signal pattern length of 12 bits with a parallel word width of 16 bits output by the serializer 704, and with the ability to introduce phase steps of at most two bits, the contents of the waveform memory 1210 can be implemented as follows:

Address 0: 0000.0011.1111.0000-0011.1111.0000.0011.1
Address 1: 0011.1111.0000.0011-1111.0000.0011.1111.0
Address 2: 1111.0000.0011.1111-0000.0011.1111.0000.0

This base pattern would typically be computed ahead of time and written into the waveform memory 1210 as part of system configuration as the ideal clock waveform 1220. It is noted that the above example assumes that the first bits to be transmitted are located on the left of the bit sequence. It is further noted that the additional bit at the right end of the 33 bits stored for each memory address represents an added bit, and is the next bit in the base signal pattern.

The word address 1230 operates to select a word from the available memory addresses (e.g., three addresses in the example above) within the waveform memory 1210 to output as the raw waveform word 1234. The shifter 1212 receives the raw waveform word 1234 and the delayed version of the first bit value 1232, which determines the first bit in the word to be output. The shifter 1212 then left shifts the raw waveform word 1234 by the amount specified by the first bit value 1232 so that the next bit is the first bit to be output. Continuing the above example, therefore, if the current phase value 1228 were 0x13 (i.e., hex 1 for the first portion (0001) and hex 3 for the second portion (0011)), the word address value 1230 would be 1, and the first bit value 1232 would be determined by a 3-bit shift. The shifter 1212, therefore, would receive the word from Address 1 and shift it by three bits to the left (e.g., advancing by 3 bits), leading to the following values including the shifted waveform word 1236:

| | |
|---|---|
| Current phase value 1228: | 0x13 |
| Word address value 1230: | 1 |
| First bit in word value 1232: | 3 |
| Raw waveform word 1234: | 0011.1111.0000.0011-1111.0000.0011.1111.0 |
| Shifted waveform word 1236: | 1111.1000.0001.1111-1000.0001.1111.1000.0 |
| Waveform parallel bits 818: | 1111.1000.0001.1111 |

It is noted that when the raw waveform word is shifted over to the left by three bits, additional "0" values have been added at the right of the shifted waveform word 1236. Further, assuming the output width (N-bit) is 16 bits, only the first 16 bits of the shifted waveform word 1236 are used and output by the bit splicer 1214 as the waveform parallel bits 818.

As described above, the bit splicer 1214 can be used to implement the insertion or deletion of additional bits when there is more than one bit to insert or delete. If the maximum phase step value is one, then the bit splicer 1214 is not used, because the action of the current phase register 1206 and the shifter 1212 accomplishes insertion and deletion of one bit. However, if the maximum phase step value is greater then one, then it can be desirable to spread out the phase change so that it occurs more evenly in time. This spreading operation is the function of the bit splicer 1214. If a phase advance by two bits is required, then the bit splicer 1214 removes a bit from the middle of the shifted waveform word 1236. Conversely, if a phase delay by two bits is required, then the bit splicer 1214 duplicates one of the bits in the middle of the shifted waveform word 1214. It is also noted that the bit splicer circuitry 1214 utilizes the phase steps value 816 received through the matching delay circuitry (DELAY 2) 1218 to determine the magnitude of the phase change desired.

Continuing the example above, therefore, if it is desired to advance the clock phase by two bits during the next clock cycle, then the bit splicer 1214 takes the shifted waveform word 1236 above (including shifted bits) and produces clock waveform parallel bits 818 having a bit removed in the current reference clock cycle, for example, as follows:

| | |
|---|---|
| Current phase value 1228: | 0x13 |
| Word address value 1230: | 1 |
| First bit in word value 1232: | 3 |
| Raw waveform word 1234: | 0011.1111.0000.0011-1111.0000.0011.1111.0 |
| Shifted waveform word 1236: | 1111.1000.0001.1111-1000.0001.1111.1000.0 |
| Phase step changes 816: | +2 |
| Waveform parallel word 818: | 1111.1000.0011.1111 |

It is noted that instead of six consecutive zeroes in the middle of the waveform parallel word 818, in this case there are only five consecutive zeroes in the waveform parallel word 818. It is further noted that for greater values of phase steps, a similar approach can be followed, with the goal of spreading the phase changes as evenly as possible across the shifted waveform word 1236. Again, assuming the output width (N-bit) is 16 bits, only the first 16 bits of the shifted waveform word 1236 are used and output by the bit splicer 1214 as the waveform parallel bits 818.

Still using the above example, the following TABLE 5 provides an example series of waveform parallel words 818 output by the waveform generator circuitry 817 based upon two phase step changes indicated below. For the example shown in TABLE 5, the phase is changed by +1 (i.e., advanced by one high speed bit period) in the third reference clock cycle, and the phase is changed by −2 (i.e., delayed by two high speed bit periods) in the sixth reference clock cycle. It is also noted that for the shifted waveform words 1236 in TABLE 5, "x" values have been included to better show the shifting of bits. The "x" values could actually be inserted to match $33^{rd}$ bit for the word stored at each address, as indicated above, or could be set to a one or a zero as desired.

zeroes. The waveform, therefore, is delayed by an additional one high speed bit period for a total delay of two bit periods. Because the total phase change in the sixth reference clock cycle is negative two bits and the previous first bit value 1232 was one for the fifth reference clock cycle, the value of first bit 1232 in the seventh row of the table is calculated as 1 plus −2 modulo 16 (as 16-bits is the nominal serializer input word width for this example). This calculation gives 15, which in hexadecimal (hex) is represented as F. This calculation also propagates a borrow into the calculation of the word address 1230 for the seventh reference cycle so that it remains the same. Ordinarily the value of the word address 1230 would increment modulo the number of words in the memory based upon the operation of the adder 1202 and word wrap circuitry 1204, so that the word address value 1230 would increment on each clock cycle. However, the borrow causes the word address value 1230 to remain the same for one clock cycle. This combination of adjustments keeps the output bits aligned for this example.

It is noted that the example provided in TABLE 5, as well as the other examples described herein, is intended only an

TABLE 5

Example Waveform Word Management

| Ref Clock Cycle | Phase Step 818 | Word Address 1230 | First Bit 1232 | Raw Waveform Word 1234 | Shifted Waveform Word 1236 | Parallel Word 818 |
|---|---|---|---|---|---|---|
| 1 | 0 | 0 | 0 | 0000.0011.1111.0000-0011.1111.0000.0011.1 | 0000.0011.1111.0000-0011.1111.0000.0011.1 | 0000.0011.1111.0000 |
| 2 | 0 | 1 | 0 | 0011.1111.0000.0011-1111.0000.0011.1111.0 | 0011.1111.0000.0011-1111.0000.0011.1111.0 | 0011.1111.0000.0011 |
| 3 | +1 | 2 | 1 | 1111.0000.0011.1111-0000.0011.1111.0000.0 | 1110.0000.0111.1110-0000.0111.1110.0000.x | 1110.0000.0111.1110 (1-bit advance) |
| 4 | 0 | 0 | 1 | 0000.0011.1111.0000-0011.1111.0000.0011.1 | 0000.0111.1110.0000-0111.1110.0000.0111.x | 0000.0111.1110.0000 |
| 5 | 0 | 1 | 1 | 0011.1111.0000.0011-1111.0000.0011.1111.0 | 0111.1110.0000.0111-1110.0000.0111.1110.x | 0111.1110.0000.0111 |
| 6 | −2 | 2 | 0 | 1111.0000.0011.1111-0000.0011.1111.0000.0 | 1111.0000.0011.1111-0000.0011.1111.0000.0 | 1111.0000.0001.1111 (2-bit delay) |
| 7 | 0 | 2 | F | 1111.0000.0011.1111-0000.0011.1111.0000.0 | 1000.0001.1111.1000-00xx.xxxx.xxxx.xxxx.x | 1000.0001.1111.1000 |

Looking to TABLE 5 for the +1 phase change delay in the third reference clock cycle, the raw waveform word is shifted left by 1-bit so that the first bit output is the second bit in the stored waveform word for Address 2. As seen in the parallel word 818 for the third reference clock cycle, only 3 ones are included at the beginning of the word. When combined with the prior parallel word 818, this leads to only 5 ones being sent before zeroes are again started. As such, the waveform has been advanced by one high speed bit period. The same 1-bit shift is also used for the fourth and fifth reference clock cycles to keep the output bits aligned with alternating 6 zeroes and 6 ones.

Looking to TABLE 5 for the −2 phase change delay in the sixth reference clock cycle, the raw waveform word is shifted by 0-bits so that the first bit output is the first bit in the stored waveform word for Address 2. As seen in the parallel word 818 for the sixth reference clock cycle, 4 ones are included before zeroes start again. When combined with the prior parallel word 818, this leads to 7 ones being sent, thereby delaying the waveform by one high speed bit period. Further, as described above, because the delay change is 2 bits, the bit splicer 1212 will handle the additional phase change and will insert a bit within the middle of the parallel word 818. As such, in addition to an added one at the beginning of the word, the parallel word 818 output in the sixth reference cycle also includes in its middle an added zero to generate a series of 7 example. Many other variations and combinations of base waveform patterns, parallel word sizes, memory word sizes, phase changes, memory management, waveform word management and/or other parameters could be used, as desired, depending upon the operational features and output signal types desired to be generated, while still taking advantage of the insertion and removal of bits within a waveform pattern to achieve desired phase variation in the resulting digital signals.

The precise generation of digital signals with desired phase variations, as described herein with respect to FIGS. 7A-7B and 8-12, can also be based upon timing data generated through the precise detection of timing data associated with event occurrences, as described above with respect to FIGS. 1A-C, 2A-B, 3-4, 5A-C and 6A-C. Further, the signal generation circuitry and the event detection circuitry can be implemented in different devices, if desired, or can be implemented in the same device, if desired. Example embodiments for the combined use of precise signal generation circuitry and precise event detection circuitry, as described herein, are now further described with respect to FIGS. 13-15.

Figure 13:
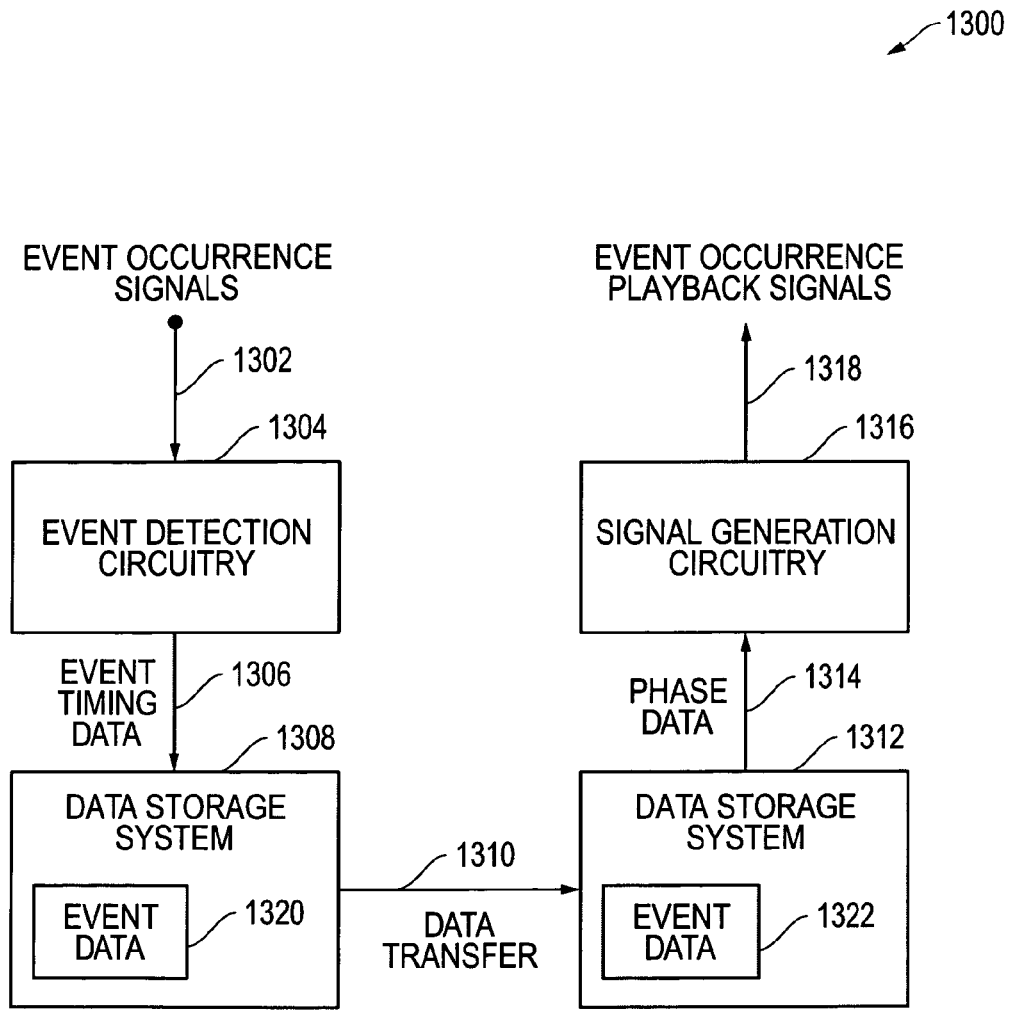
FIG. 13 is a block diagram of an embodiment for playback of signals based upon event timing data detected from event occurrences.

FIG. 13 is a block diagram of an embodiment 1300 for playback of signals based upon event timing data detected from actual event occurrences. For the embodiment depicted, event detection circuitry 1304 (e.g., as described herein with respect to FIGS. 1A-C, 2A-B, 3-4, 5A-C and 6A-C) receives event occurrence signals 1302 and generates event timing data 1306. This event timing data 1306 can be provided to and stored within a data storage system 1308 as event data 1320 in any desired format. The event data can then be transferred to a data storage system 1312 and again stored as event data 1322 in any desired format. This event data 1322 can then be used to provide phase data 1314 to signal generation circuitry 1316 (e.g., as described herein with respect to FIGS. 7A-7B and 8-12) that can then be used provide the phase control inputs that determine the desired phase variation in a resulting digital signal. The signal generation circuitry 1316 can then output digital signals with phase variations, such as jitter and/or wander, that relate to the detected event timing data. As such, these digital signals output by the signal generation circuitry 1316 can represent a playback of detected signal events, thereby providing the event occurrence playback signals 1318.

It is noted that the embodiment 1300 can be used, for example, to precisely detect event timing data associated with signal errors occurring in systems being tested, analyzed or measured. The signal errors can then be represented in the stored event data 1320 and then provided for use by the signal generation circuitry 1316 to replay or playback the error signals. This playback may be useful, for example, when detecting errors in field equipment so that these errors can be recorded and played back in a laboratory or test facility. In this way, field errors and events can be precisely reproduced on test equipment, thereby facilitating the troubleshooting of errors in the installed equipment. Further, the detection of errors or detected events and playback of these errors or detected events could also occur at the same location, for example, where systems are being tested.

It is also noted that the data transfer 1310 can be implemented using any of a wide variety of techniques, including wired and/or wireless communications between one or more computing systems or devices. In one implementation, the event detection circuitry 1304 and the data storage system 1308 could be located within a first device, and the signal generation circuitry 1316 and the data storage system 1312 could be located within another device. These two devices could then be configured to communicate through wired and/or wireless communications, for example, through network connections so as to provide the data transfer 1310. In a further implementation, the event detection circuitry 1304 and the signal generation circuitry 1316 could be located in a single device. In this further implementation, a single data storage system could be used, if desired, thereby combining the data storage system 1308 and the data storage system 1312 into a single data storage system. It is further noted that the data storage systems can be any desired tangible medium configured to store data, such as memory storage devices, FLASH memory, random access memory, read only memory, programmable memory devices, reprogrammable storage devices, hard drives, floppy disks, DVDs, CD-ROMs, and/or any other tangible storage medium.

The embodiment 1300 could also be utilized in a wide variety of environments depending upon the desired signal events to be detected and played back. One such environment is in a network equipment testing environment where network communications, such as network based telephony and/or data communications, are being tested.

Figure 14:
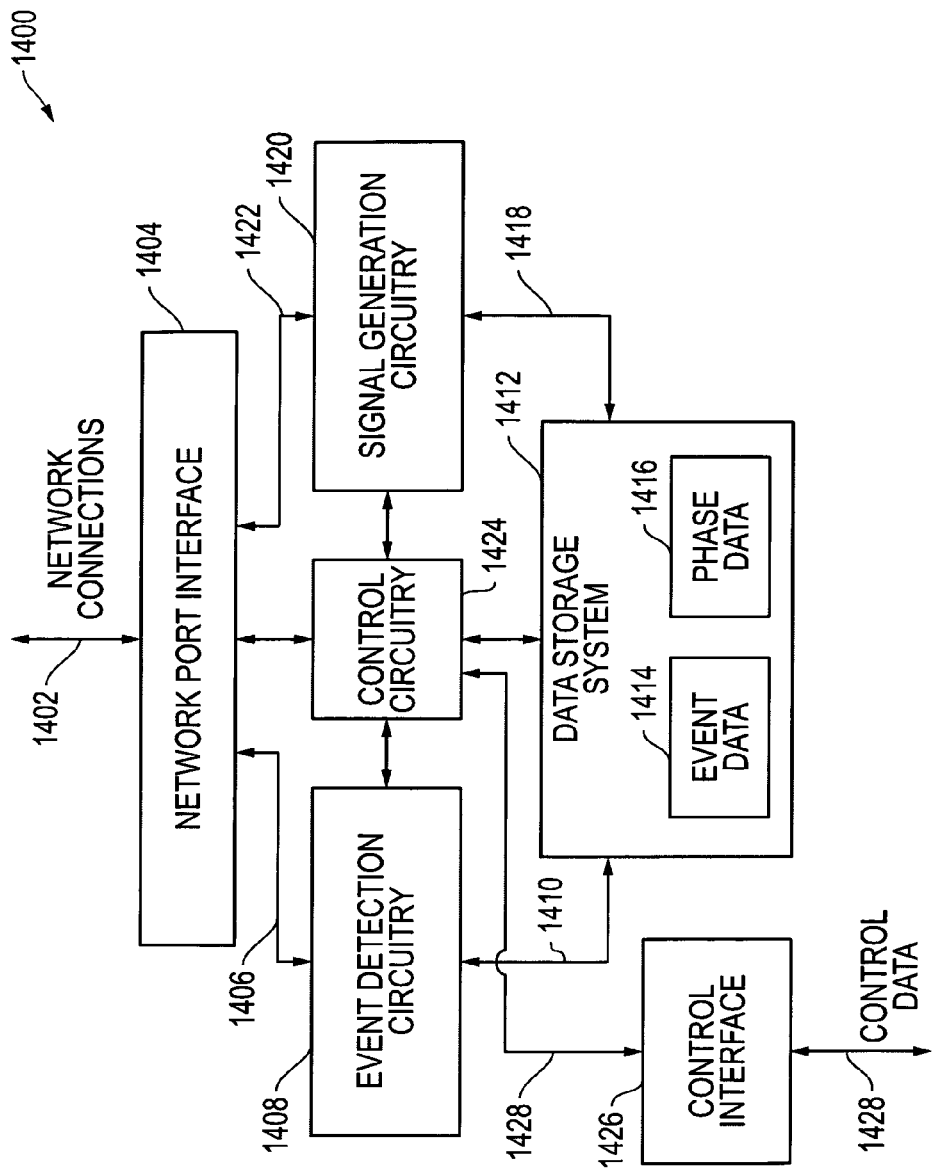
FIG. 14 is a block diagram of an embodiment for detecting event occurrences and generating desired phase variation in digital signals in a network communications environment.

FIG. 14 is a block diagram of an embodiment 1400 for an error playback system that detects event occurrences and generates signals in a network communications environment. For the embodiment depicted, one or more network connections 1402 are made to the network port interface circuitry 1404. These network port connections can provide network related communication signals, such as network packets. One or more of the network communication signals can be provided to the event detection circuitry 1408 through connections 1406. The event detection circuitry 1408 can operate to generate event timing data associated with these network communications. This event timing data can be communicated to data storage system 1412 through connections 1410 and can be stored within a data storage system 1412 as event data 1414 in a desired format. This event data 1414 can then be provided through connections 1418 to signal generation circuitry 1420. And signal generation circuitry 1420 can use this event data to provide playback of detected signal events to network connected devices through connections 1422 to the network port interface 1404. In addition, the signal generation circuitry 1420 can also use other phase change data 1416 that can be used to define other desired phase variations in digital signals that can be provided through connections 1422 to network devices connected to the network port interface 1404.

The event detection circuitry 1408 can be configured, if desired, to detect the arrival of network packets and/or the departure of network packets. The event detection circuitry 1408 can also be configured to detect other network related events, as desired. Timing error information concerning these network related events can be determined and stored as event data 1414. This error information can then be used by the signal generation circuitry 1420 to generate digital signals with desired phase variation such that the timing errors can be recreated and played back by signal generation circuitry 1420. This playback feature provides the advantageous ability to detect and recreate actual signal errors detected within the network communications connected to the error playback system 1400.

Control circuitry 1424 can be provided that communicates with the network port interface 1404, the event detection circuitry 1408, the data storage system 1412 and/or the signal generation circuitry 1420 so as to control the operations of the embodiment 1400. Further, a separate control interface 1426 can be provided, if desired, through which control data 1428 can be communicated to and from the embodiment 1400, such as between external devices or systems and the embodiment 1400 when implemented as a single device. For example, desired phase data 1416 and/or event data 1414 can be communicated as control data 1428 and stored within embodiment 1400. Other desired operational parameters, as described herein, for the event detection circuitry 1408, the signal generation circuitry 1420 and/or other operation blocks described herein can also be communicated as control data 1428. Further, if desired, control data can also be communicated through the network port interface 1404. The control interface 1426 could also be removed if all control data were desired to be communicated through the network port interface 1404. Further, the control interface 1426 could be implemented in part or in whole as a user interface, such as a graphical user interface, through which a user can select, enter and/or define desired configurations to provide control data for the embodiment 1400. A user interface, such as a graphical user interface, could also be provided through the network port interface 1404, if desired. Other variations could also be implemented as desired.

Figure 15:
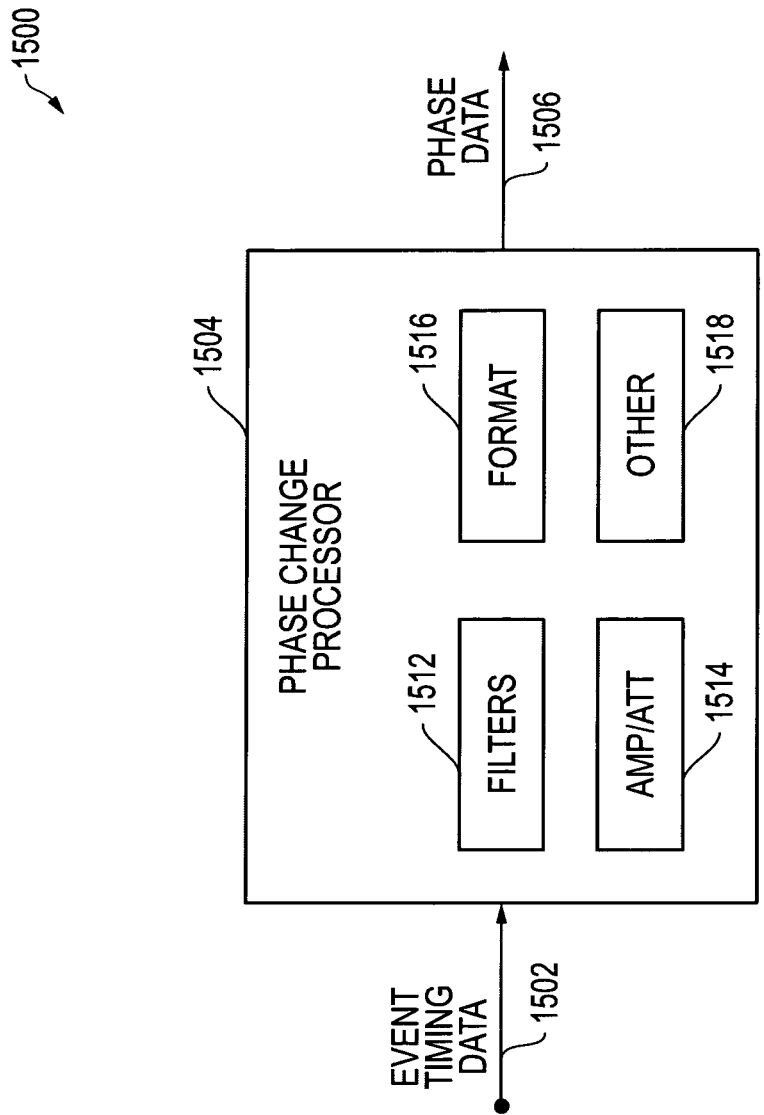
FIG. 15 is a block diagram of an embodiment that uses a phase change processor to adjust the event timing data, as desired, prior to its being used to provide phase data to control the generation of signals with desired phase variation.

FIG. 15 is a block diagram of an embodiment 1500 that includes a phase change processor 1504 to process the event timing data 1502, as desired, prior to its being used to provide phase data 1506 to control the generation of signals with desired phase variation. The embodiment 1500 can be used in combination with the embodiments of FIGS. 13 and 14 to provide desired processing of the event data prior to its being used to control generation of digital signals. Further, as shown in FIG. 14, control circuitry and a control interface can also be used to control and configure parameters for the operation of the phase change processor 1504. In addition to the examples described below, other processing variations could also be provided for the phase change processor 1504, as desired, to process the event timing data 1502 prior to its being passed on as phase data 1506 for generation of digital signals.

As described herein, the timing or phase of a clock or other signal can be detected and measured with high precision, and a signal with arbitrary phase can be generated with high precision, as desired. As shown in FIG. 15, event timing data 1502 generated by event detection circuitry (e.g., event detection circuitry 1304 and 1408) can be provided to signal generation circuitry (e.g., signal generation circuitry 1316 and 1420) through a phase change processor 1504. The phase change processor 1504 can be configured to process the event timing data 1502, as desired, prior to its being used to control phase generation. For the example embodiment depicted, the phase change processor 1504 includes digital signal processing blocks 1512, 1514, 1516 and 1518. The filters block (FILTERS) 1512 can be used to provide one or more filters that are applied to the event timing data 1502. The format block (FORMAT) 1516 can be used to change the format of the event timing data 1502 from one data type or protocol to any other desire data type or protocol, depending upon the application desired. The amplifier/attenuator (AMP/ATT) block 1514 can be used to increase or decrease the phase changes represented by the event timing data 1502, as desired. And the final block (OTHER) 1518 represents that other processing blocks could be included in the phase change processor 1504, as desired, depending upon the digital signal processing desired for the event timing data 1502.

For example, with respect to the amplifier/attenuator (AMP/ATT) block 1514, the phase change processor 1504 can be configured to multiply or divide the measured phase changes represented by the event timing data 1502 by a constant or variable value to amplify or attenuate the phase imperfections on the input. Because this amplification/attenuation technique can be implemented as a feed-forward scheme (e.g., there can be no feedback), stability of the system is not a concern. This feed-forward scheme, therefore, provides an important advantage over using a PLL or other type of implementation that utilizes feedback. Because there is no feedback required for this amplification/attenuation technique, the resulting circuitry is guaranteed to be stable. For this example, it is further noted that if the multiplier and/or divider values were set to unity, the measured phase changes would be passed directly to the signal generation circuitry without modification.

With respect to the filters (FILTERS) block 1512, the phase change processor 1504 can be configured to employ more sophisticated DSP (digital signal processing) filtering techniques (e.g., digital filtering). For example, digital filtering techniques can be applied to amplify or attenuate certain jitter/wander frequencies or ranges of jitter/wander frequencies for applications where such filtering is useful. For example, if the phase change processor 1504 implemented a low pass filter with a 10 Hz cutoff, then only wander components would be passed to the signal generation circuitry. In other words, even if the phase change values from the event detection circuitry contained both high and low frequency components, the phase change processor 1504 would filter out the high frequency (jitter) components greater than 10 Hz and leave just the wander components. This filtering would be useful, for example, in laboratory situations where emulation of controlled wander transfer is desirable, or where it is desired to pre-condition a test signal to eliminate certain frequency bands of jitter and wander but to retain others. Still further, the opposite could also be done, where the jitter components would be passed to the output, and the wander components would blocked. This filtering could use, for example, a high pass filter with a 10 Hz cutoff, thereby filtering out the low frequency (wander) components lower than 10 Hz and leaving just the jitter components. This additional implementation that passes only jitter components could be used to mimic the behavior of an ideal PLL or "golden" PLL for testing purposes. It is further noted that bandpass filtering could be provided to pass error components within certain desired frequency ranges, and notch filtering could also be provided to block error components with certain desired frequency ranges, if desired. Other variations could also be implemented, as desired.

In addition, it should be noted that the output signal from the phase change processor 1504 may be different from the signal detected and represented by the event timing data 1502. For example, the signal type, format and/or frequency, as well as other parameters, for the phase data 1506 output from the phase change processor 1504 can be different from the signal type, format and/or frequency, as well as other parameters, for the signal events detected and represented by the event timing data 1502. Further, the phase data 1506 can include additional and/or different information as compared to the input event timing data 1502. For example, wander measured from a Synchronous Optical Network (SONET) signal and represented by the event timing data 1502 can be transferred to an Ethernet signal so that the phase data 1506 represents desired phase changes in an Ethernet signal. Other variations could also be implemented, as desired.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A system for event timing measurement, comprising:
an event occurrence input signal;
reference clock generator circuitry having a reference clock signal as an output,
deserializer circuitry coupled to the reference clock signal and having the event occurrence signal as an input, the deserializer circuitry being configured to output multi-bit parallel data representative of the event occurrence signal at an output rate based upon a rate of the reference clock signal, the deserializer circuitry being further configured to sample the event occurrence signal at a rate faster than the output rate of the multi-bit parallel data; and
event timing detector circuitry coupled to receive the multi-bit parallel data and configured to determine when an event occurred within the multi-bit parallel data and to output event timing data representative of when the event occurred within the multi-bit parallel data.

2. The system of claim 1, further comprising event detection circuitry having the event occurrence signal as an output, the event occurrence signal representing at least in part a detection of one or more events.

3. The system of claim 2, wherein the event detection circuitry comprises event conditioning circuitry configured to receive a signal associated with the detected event and to output the event occurrence signal in a form usable by the deserializer circuitry.

4. The system of claim 1, wherein the deserializer circuitry is configured to sample the event occurrence signal at a rate equal to the rate of the reference clock signal times a number of bits used for the multi-bit parallel data.

5. The system of claim 1, wherein the event timing data comprises one or more timestamps.

6. The system of claim 1, wherein the event timing data comprises one or more time error values.

7. The system of claim 1, wherein the deserializer circuitry and the event detector circuitry comprise a first measurement path, and further comprising one or more additional measurement paths coupled to receive the event occurrence signal, wherein each additional measurement path also includes deserializer circuitry and event timing detector circuitry.

8. The system of claim 7, wherein the one or more additional measurement paths are configured to provide one or more time measurements that are offset in time from the a time measurement provided by the first measurement path, and wherein the time measurement and the one or more offset time measurements are utilized to provide event timing data having a finer resolution than the sample rate of the deserializer circuitry.

9. The system of claim 8, further comprising delay circuitry coupled to the event occurrence signal to provide the offset time measurements.

10. The system of claim 1, wherein the deserializer circuitry and the event detector circuitry comprise a first measurement path, and further comprising one or more additional measurement paths, wherein each additional measurement path also includes deserializer circuitry and event timing detector circuitry and wherein each additional measurement path is configured to receive a different event occurrence signal.

11. The system of claim 1, wherein the event occurrence signal comprises a digital clock signal.

12. The system of claim 1, wherein the event occurrence signal comprises an analog signal.

13. The system of claim 1, wherein the event occurrence signal is associated with at least one of an arrival of network packets and a departure of network packets.

14. The system of claim 1, wherein the event timing detector circuitry further comprises timestamp circuitry configured to provide an event timestamp.

15. The system of claim 14, wherein the event timestamp includes a counter portion and a bit period portion, the counter portion being based upon a time counter and the bit period portion being based upon the multi-bit parallel data.

16. They system of claim 14, further comprising time error circuitry configured to output time error data representing a difference between an event timestamp and an expected event timestamp.

17. A method for event timing measurement, comprising:
receiving an event occurrence input signal;
generating a reference clock signal;
using deserializer circuitry coupled to the reference clock signal to output multi-bit parallel data representative of the event occurrence signal at an output rate based upon a rate of the reference clock signal, the deserializer circuitry sampling the event occurrence signal at a rate faster than the output rate of the multi-bit parallel data;
determining when an event occurred within the multi-bit parallel data; and
generating event timing data representative of when the event occurred within the multi-bit parallel data.

18. The method of claim 17, further comprising detecting one or more events and generating the event occurrence signal to represent the detected events.

19. The method of claim 17, wherein the using step comprises using the deserializer circuitry to sample the event occurrence signal at a rate equal to the rate of the reference clock signal times a number of bits used for the multi-bit parallel data.

20. The method of claim 17, wherein the event timing data comprises one or more timestamps.

21. The method of claim 17, wherein the event timing data comprises one or more time error values.

22. The method of claim 17, further comprising duplicating the using and generating steps to provide one or more additional time measurements associated with the event occurrence signal.

23. The method of claim 22, further comprising using the one or more additional time measurements to provide two or more offset time measurements that are offset in time from each other.

24. The method of claim 23, further comprising using the offset time measurements to generate event timing data having a finer resolution than a resolution from a single time measurement.

25. The method of claim 17, further comprising duplicating the using and generating steps to provide one or more additional time measurements associated with one or more different event occurrence signals.

26. The method of claim 17, wherein the event occurrence signal comprises a digital clock signal.

27. The method of claim 17, wherein the event occurrence signal comprises an analog signal.

28. The method of claim 17, wherein the event occurrence signal is associated with at least one of an arrival of network packets and a departure of network packets.

29. The method of claim 17, wherein the generating step comprises generating an event timestamp.

30. The system of claim 29, wherein the event-timestamp includes a counter portion and a bit period portion, the counter portion being based upon a time counter and the bit period portion being based upon the multi-bit parallel data.

31. The method of claim 29, wherein the generating step comprises generating time error data representing a difference between an event timestamp and an expected event timestamp.

* * * * *